United States Patent [19]

Kurosaki et al.

[11] Patent Number: 5,773,316
[45] Date of Patent: Jun. 30, 1998

[54] METHOD AND DEVICE FOR MEASURING PHYSICAL QUANTITY, METHOD FOR FABRICATING SEMICONDUCTOR DEVICE, AND METHOD AND DEVICE FOR MEASURING WAVELENGTH

[75] Inventors: Ryo Kurosaki; Jun Kikuchi; Haruhiko Serizawa; Shuzo Fujimura, all of Kawasaki, Japan

[73] Assignee: Fujitsu Limited, Kawasaki, Japan

[21] Appl. No.: 401,689

[22] Filed: Mar. 10, 1995

[30] Foreign Application Priority Data

| Mar. 11, 1994 | [JP] | Japan | 6-040274 |
| May 31, 1994 | [JP] | Japan | 6-118758 |
| Sep. 20, 1994 | [JP] | Japan | 6-225187 |
| Sep. 20, 1994 | [JP] | Japan | 6-252903 |

[51] Int. Cl.$^6$ ............... G01R 31/26; H01L 21/66
[52] U.S. Cl. ............... 438/16; 374/161; 356/349; 156/626.1
[58] Field of Search ............... 437/8; 117/85; 156/626; 374/161; 356/349; 438/16

[56] References Cited

U.S. PATENT DOCUMENTS

| 5,249,865 | 10/1993 | Paranjpe et al. ............... 374/161 |
| 5,263,776 | 11/1993 | Abraham ............... 374/161 |
| 5,322,361 | 6/1994 | Cabib et al. ............... 374/161 |
| 5,467,732 | 11/1995 | Donnelly, Jr. et al. ............... 437/8 |

FOREIGN PATENT DOCUMENTS

| 63-79339 | 4/1988 | Japan . |
| 63-271127 | 11/1988 | Japan . |
| 3-96247 | 4/1991 | Japan . |
| 3-216526 | 9/1991 | Japan . |

OTHER PUBLICATIONS

"Wavelength–Modulated Interferometric Thermometry for Improved Substrate Temperature Measurement", Saenger et al., *Rev. Sci. Instrum.*, vol. 63, No. 8, Aug. 1992, pp. 3862–3868.

*Primary Examiner*—John Niebling
*Assistant Examiner*—Thomas G. Bilodeau
*Attorney, Agent, or Firm*—Nikaido, Marmelstein, Murray & Oram LLP

[57] ABSTRACT

Pulsed laser beams are applied to an object to be measured. A first laser beam of a pulsed laser beam having a first wavelength which is oscillated immediately after the rise of the pulsed laser beam, and a second laser beam having a second wavelength which is oscillated thereafter are used. Based on a difference between an intensity of first interfered light of reflected light of the first laser beam or transmitted light thereof, and an intensity of reflected light of the second laser beam or transmitted light thereof, temperatures of the object to be measured, and whether the temperatures are on increase or on decrease are judged. The method and device can be realized by simple structures and can measure a direction of changes of the physical quantities.

16 Claims, 49 Drawing Sheets

FIG.5A
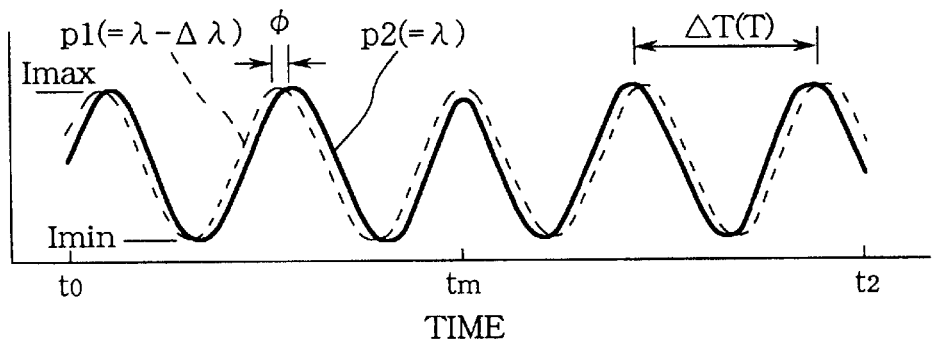
FIG.5B
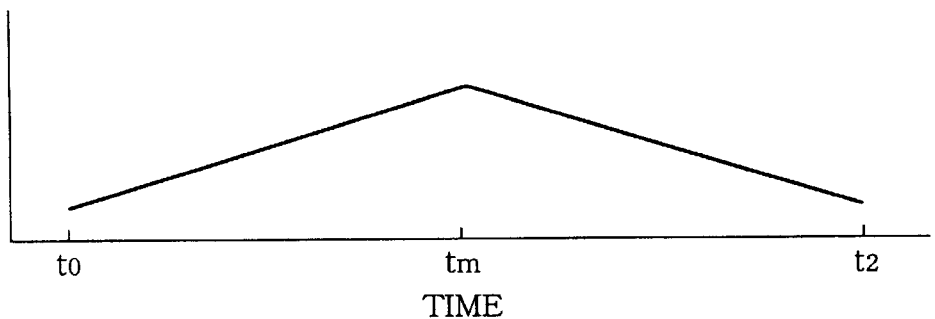
FIG.5C
| | SLOPE OF INTERFERED LIGHT WAVEFORM OF WAVELENGTH $\lambda$ | |
|---|---|---|
| | POSITIVE | NEGATIVE |
| $I_1 > I_2$ | TEMP. RISING | TEMP. FALLING |
| $I_1 < I_2$ | TEMP. FALLING | TEMP. RISING |
$I_1$: INTERFERED LIGHT INTENSITY OF WAVELENGTH $\lambda - \Delta\lambda$
$I_2$: INTERFERED LIGHT INTENSITY OF WAVELENGTH $\lambda$

FIG.10A
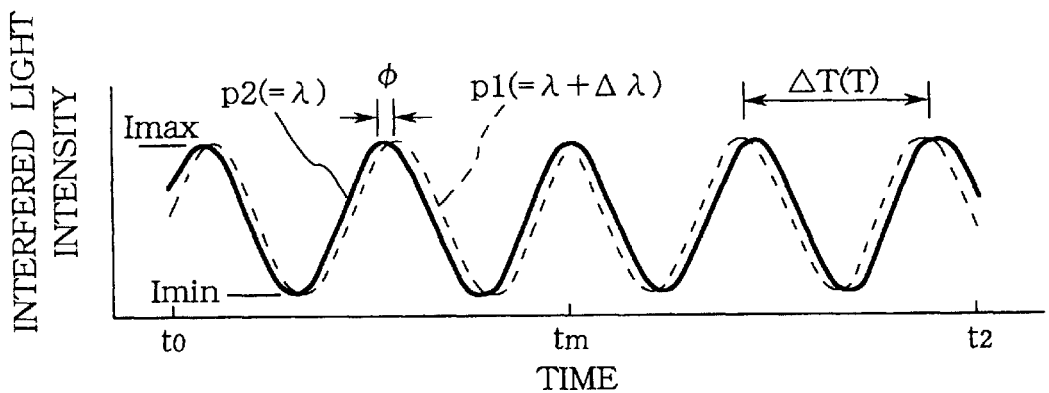
FIG.10B
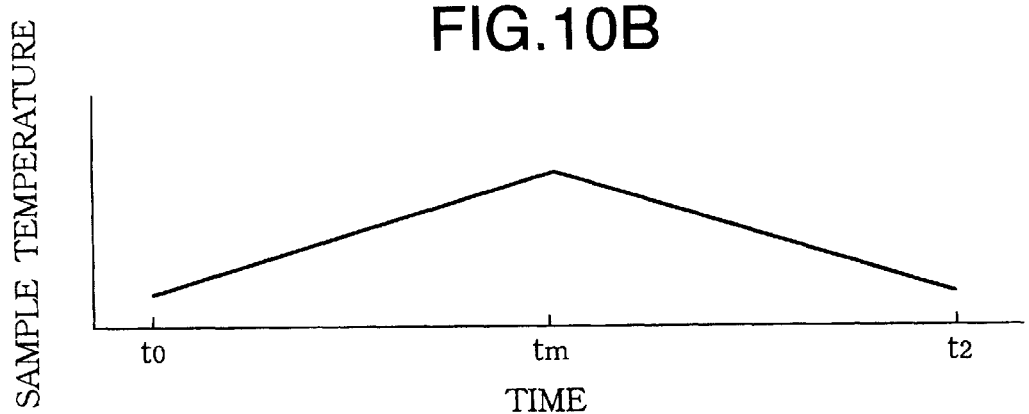
FIG.10C
| | SLOPE OF INTERFERED LIGHT WAVEFORM OF WAVELENGTH $\lambda$ | |
|---|---|---|
| | POSITIVE | NEGATIVE |
| $I_1 > I_2$ | TEMP. FALLING | TEMP. RISING |
| $I_1 < I_2$ | TEMP. RISING | TEMP. FALLING |
$I_1$: INTERFERED LIGHT INTENSITY OF WAVELENGTH $\lambda - \Delta\lambda$
$I_2$: INTERFERED LIGHT INTENSITY OF WAVELENGTH $\lambda$

METHOD AND DEVICE FOR MEASURING PHYSICAL QUANTITY, METHOD FOR FABRICATING SEMICONDUCTOR DEVICE, AND METHOD AND DEVICE FOR MEASURING WAVELENGTH

BACKGROUND OF THE INVENTION

The present invention relates to a method and a device for measuring a physical quantity of an object to be measured by applying laser beams to the object, more specifically to a method and a device for measuring a temperature of a semiconductor substrate without making physical contact on it, by the use of laser beams. Further, the present invention relates to a method and a device for measuring light wavelengths, more specifically to a method and a device for measuring light wavelength shifts occurring in a short period of time.

In recent semiconductor device fabrication processes, design characteristics of semiconductor devices rely heavily on temperature control. Yet, delicate fabrication processes do not allow semiconductor substrates to be contacted by any sort of temperature measuring probe, etc. Hence, it is required to measure the temperature of semiconductor substrates without contact and accurately.

As a temperature measuring device for such noncontact temperature measurement of semiconductor substrates, a device is known which uses the fact that the light transmittance of a semiconductor substrate decreases with increases of its temperature (see Japanese Patent Laid-Open Publication No. 271127/1988, Japanese Patent Laid-Open Publication No. 79339/1988, and Japanese Patent Laid-Open Publication No. 216526/1991, etc.).

Japanese Patent Laid-Open Publication No. 96247/1991 discloses a method for such noncontact temperature measurement of a semiconductor substrate to be measured which uses the fact that the intensity of a interfered light beam reflected from either the top or bottom surfaces of a semiconductor substrate varies depending on the temperature of the substrate. With changes in the temperature of the semiconductor substrate, the dielectric constant of the substrate changes the substrate expands, altering its thickness, whereby variations in the intensity of the interfered light reflected therefrom can be used to measure the change in temperature of the substrate.

But, the temperature measuring method disclosed in Japanese Patent Laid-Open Publication No. 96247/1991 cannot judge whether or not the temperature is rising or falling.

A temperature measuring device which is based on the same principle as the temperature measuring method disclosed in Japanese Patent Laid-Open Publication No. 96247/1991 but which can measure the direction of temperature change has been proposed. See K. L. Saenger, et al., "Wavelength-Modulated Interformetric Thermometry for Improved Substrate Temperature Measurement", Rev. Sci. Instrum., Vol. 63, No. 8, pp. 3862–3868, August 1992.

The temperature measuring device described in the above reference uses an approximately 1.5 $\mu$m-oscillation wavelength semiconductor laser. This laser emits coherent laser beams which have been wavelength-modulated by an alternating current injected into the semiconductor laser, and the laser beams are applied to a semiconductor substrate to be measured. Interfered light of the reflected light from the substrate is detected by a photo-detecting element and converted to detected signals, and the detected signals are wavelength-differentiated by a lock-in amplifier. Based on processing of the differentiated and non-differentiated detected signals, it is judged whether the substrate temperature is rising or falling.

In the recent optical measurement field it is required to accurately measure light wavelength shifts taking place in a short period of time. Such accurate optical measurement is necessary especially to measure accurately stability of oscillation wavelengths of laser beams and wavelength shift amounts, and to measure accurately wavelength shifts of laser beams they undergo upon rising and falling.

In the conventional wavelength measuring methods it has been general that light to be measured is spectrally diffracted by spectroscopes or optical spectrum analyzers for the measurement of wavelengths of the light to be measured. That is, in these methods, light to be measured is spectrally diffracted to measure spectral wavelengths, whereby wavelengths of the light to be measured are measured.

Thus, the conventional temperature measuring devices must include a large number of instruments and devices, such as the laser modulating means, the lock-in amplifier, etc., which makes the structure of such devices complicated and their costs high. This is a disadvantage. For accurate measurement of abrupt temperature changes, e.g. more than 100° C. per minute, instruments and devices which are operative at higher speeds are required, which adds further to the cost. This is also a disadvantage. Finally, conventional temperature measuring devices can measure the direction of temperature changes only when a waveform of interfered light crosses an average value, which makes precise temperature measurement impossible.

The temperature measuring device described in the reference above includes as a light source a semiconductor laser of a III–V compound semiconductor. Its oscillation wavelength is approximately 1.6 $\mu$m at most. In the case where light of such relatively short wavelength ($\lambda$) is used, the measurable temperature ranges for various semiconductor substrates, such as silicon, GaAs, or others with relatively narrow energy band gaps, are small. This is because the energy band gaps of such semiconductors narrows as their temperatures rise. As a result, their absorption of laser beam light becomes larger. For example, a silicon wafer has a 1.12 eV energy band gap and absorbs laser light of approximately 1.6 $\mu$m wavelength when the measurement temperature reaches 750° C.

Furthermore, the temperature measuring device described in the reference above performs temperature measurement based on periodic variations in the intensities of interfered light reflected from the semiconductor substrate. Accordingly, the temperature cannot be substantially measured until the intensities of the interfered light varies through at least one period; maximum and minimum intensity values being given. Thus it is another disadvantage that temperature measurement cannot be conducted without changing temperatures until maximum and minimum intensity values of the interfered light employed are given.

It is also a disadvantage of the temperature measuring device described in the reference above that in the case where an object to be measured is a semiconductor substrate, such as silicon, GaAs or others, laser beams are adversely absorbed by the semiconductor substrate as its temperature rises, and the resulting temperature measurement is not accurate.

But according to the conventional wavelength measuring method using spectral diffraction, it is necessary to scan a required wavelength band for one wavelength measuring operation. Such method has found it difficult to measure wavelength shifts occurring in a period of some msec-scanning time.

In addition, according to the conventional wavelength measuring method using spectral diffraction, to improve accuracy of measuring wavelengths, it is necessary to elongate an optical path of light to be measured along which the light to be measured follow. Disadvantageously the wavelength measuring device for such method is accordingly large-sized.

SUMMARY OF THE INVENTION

One object of the present invention is to provide a device for measuring physical quantities has a simple structure, and a method for measuring physical quantities which can precisely measure the direction of change thereof.

Another object of the present invention is to provide a device for measuring a temperature which has a simple structure, and a method for measuring a temperature which can precisely measure the direction of change thereof.

Still another object of the present invention is to provide a method and a device for measuring a temperature which can measure a wide range of temperatures.

Still another object of the present invention is to provide a method and a device for measuring a temperature which can measure a temperature immediately after the start of measuring the intensities of interfered light.

Still another object of the present invention is to provide a method and a device for measuring a temperature which can measure a temperature of a semiconductor substrate up to high temperatures.

Still another object of the present invention is to provide a method and a device for measuring wavelengths which can measure quickly shifting wavelengths without allocating a scanning time for the spectral diffraction.

The above-described object of the present invention is achieved by a measuring method for irradiating laser beams to an object to be measured to measure a physical quantity of the object to be measured, pulsed laser beams being irradiated to the object to be measured, first laser beams of a first wavelength of the pulsed laser beams and second laser beams of a second wavelength thereof being used to measure the physical quantity of the object, the first wavelength being oscillated after rises of the pulsed laser beams, the second wavelength being oscillated thereafter.

In the above-described measuring method, it is preferable that temperatures of the object are measured, based on changes of intensities of first interfered light of reflected light or transmitted light of one of the first laser beams on or by the object, and changes of intensities of second interfered light of reflected light or transmitted light of one of the second laser beams on or by the object.

In the above-described measuring method, it is preferable that the temperatures of the object are judged to be on increase or decrease, based on a direction of the changes of intensities of the first or the second interfered light and on a difference between the intensity of the first interfered light and that of the second interfered light.

In the above-described measuring method, it is preferable that the measuring method measures the physical quantity, temperatures, or a direction of changes of temperatures of the object to be measured, by using a semiconductor laser having a characteristic that the first wavelength of the first laser beams is shorter than the second wavelength of the second laser beams.

In the above-described measuring method, it is preferable that the temperatures of the object are judged to be on increase when the intensities of the first interfered light are higher than those of the second interfered light at the time that the intensities of the first interfered light or those of the second interfered light are on increase, the temperatures of the objects are judged to be on decrease when the intensities of the first interfered light are lower than those of the second interfered light at the time that the intensities of the first interfered light or those of the second interfered light are on increase, the temperatures of the object are judged to be on decrease when the intensities of the first interfered light are higher than those of the second interfered light at the time that the intensities of the first interfered light or those of the second interfered light are on decrease, the temperatures of the objects are judged to be on increase when the intensities of the first interfered light are lower than those of the second interfered light at the time that the intensities of the first interfered light or those of the second interfered light are on decrease.

In the above-described measuring method, it is preferable that the measuring method measures the physical quantity, temperatures, or a direction of changes of temperatures of the object to be measured by using a semiconductor laser having a characteristic that the first wavelength of the first laser beams is longer than the second wavelength of the second laser beams.

In the above-described measuring method, it is preferable that the temperatures of the object are judged to be on decrease when the intensities of the first interfered light are higher than those of the second interfered light at the time that the intensities of the first interfered light or those of the second interfered light are on increase, the temperatures of the objects are judged to be on increase when the intensities of the first interfered light are lower than those of the second interfered light at the time that the intensities of the first interfered light or those of the second interfered light are on increase, the temperatures of the object are judged to be on increase when the intensities of the first interfered light are higher than those of the second interfered light at the time that the intensities of the first interfered light or those of the second interfered light are on decrease, the temperatures of the objects are judged to be on decrease when the intensities of the first interfered light are lower than those of the second interfered light at the time that the intensities of the first interfered light or those of the second interfered light are on decrease.

In the above-described measuring method, it is preferable that when the second wavelength of the second interfered light is represented by $\lambda$, a thickness of the object to be measured is represented by d, and a refractive index of the object to be measured is represented by n, a difference $\Delta\lambda$ between the first wavelength of the first interfered light and the second wavelength of the second interfered light satisfies $$|\Delta\lambda| < \lambda^2/(2nd+\lambda).$$

In the above-described measuring method, it is preferable that the first laser beams are oscillated within approximately 0.5 msec after rises of the pulsed laser beams.

The above-described object of the present invention is achieved by a measuring method for irradiating laser beam of coherence to an object to be measured to measure change amounts of temperatures of the object to be measured, based on intensities of reflected light or interfered light on or by the object, the method comprising: a predicting step of, before a temperature measuring operation, predicting a maximum value and a minimum value of the intensities of the interfered light; and a measuring step of measuring the change amounts of the temperatures of the object, based on the intensities of the interfered light, and the predicted maximum and minimum values.

In the above-described measuring method, it is preferable that the incident angle in the predicting step is so changed that the maximum and the minimum values of the intensities of the interfered light are given at least in one set.

In the above-described measuring method, it is preferable that when a wavelength of the light of coherence to be irradiated is represented by $\lambda$, an incident angle is represented by $\theta$, a thickness of the object to be measured is represented by d, and a refractive index thereof is represented by n, an angle change $\Delta\theta$ of the incident angle in the predicting step satisfies a formula $$\Delta\theta \geq \sin^{-1}[n^2 - \{(n^2-\sin^2\theta)^{1/2} - \lambda/4d\}^2]^{1/2} - \theta.$$

In the above-described measuring method, it is preferable that oscillating intensities of the laser beams to be irradiated to the object to be measured are changed based on temperatures of the object to be measured.

In the above-described measuring method, it is preferable that oscillating intensities of the laser beams to be irradiated to the object to be measured are changed based on temperatures of the object to be measured.

In the above-described measuring method, it is preferable that intensities of the laser beams to be irradiated to the object to be measured are constant or increased when the temperature of the object is rising, and intensities of the laser beams are constant or decreased when the temperature is falling.

In the above-described measuring method, it is preferable that the intensities of the laser beams to be irradiated to the object to be measured are decreased based on the temperature of the object to be measured.

In the above-described measuring method, it is preferable that one or plural optical windows are provided in a measuring light path, at least one surface of the optical windows are slanted with respect to the optical axis of the laser beams so that no interference of reflected light inside each of the optical windows and between the optical windows takes place.

In the above-described measuring method, it is preferable that one or plural optical windows are provided in a measuring light path, at least one surface of the optical windows are slanted with respect to the optical axis of the laser beams so that no interference of reflected light inside each of the optical windows and between the optical windows takes place.

The above-described object of the present invention is achieved by a measuring device for irradiating laser beams to an object to be measured to measure a physical quantity of the object, the device comprising: irradiating means which oscillates pulsed laser beams to irradiate first laser beams of a first wavelength which is oscillated after rises of the pulsed laser beams, and second laser beams which are oscillated thereafter and differs from the first wavelength; and measuring means which measures the physical quantity of the object to be measured by the use of the first laser beams and the second laser beams irradiated by the irradiating means.

In the above-described measuring device, it is preferable that the measuring means measures temperatures of the object to be measured, based on changes of intensities of first interfered light of reflected light or transmitted light of one of the first laser beams on or by the object, or changes of intensities of second interfered light of reflected light or transmitted light of one of the second laser beams on or by the object.

In the above-described measuring device, it is preferable that the measuring means judges that the temperatures of the object are judged to be on increase or decrease, based on a direction of the changes of intensities of the first or the second interfered light and on a difference between the intensity of the first interfered light and that of the second interfered light.

In the above-described measuring device, it is preferable that the irradiating means includes a semiconductor laser having a characteristic that the first wavelength of the first laser beams is shorter than the second wavelength of the second laser beams, and the measuring device measures the physical quantity, a temperature, or a direction of changes of a temperature of the object to be measured.

In the above-described measuring device, it is preferable that the measuring means judges that the temperatures of the object are on increase when the intensities of the first interfered light are higher than those of the second interfered light at the time that the intensities of the first interfered light or those of the second interfered light are on increase, the temperatures of the object are on decrease when the intensities of the first interfered light are lower than those of the second interfered light at the time that the intensities of the first interfered light or those of the second interfered light are on increase; and the measuring means judges that the temperatures of the object are on decrease when the intensities of the first interfered light are higher than those of the second interfered light at the time that the intensities of the first interfered light or those of the second interfered light are on decrease, the temperatures of the object are on increase when the intensities of the first interfered light are lower than those of the second interfered light at the time that the intensities of the first interfered light or those of the second interfered light are on decrease.

In the above-described measuring device, it is preferable that the irradiating means includes a semiconductor laser having a characteristic that the first wavelength of the first laser beams is longer than the second wavelength of the second laser beams, and the measuring device measures a physical quantity, a temperature, or a direction of changes of a temperature of the object to be measured.

In the above-described measuring device, it is preferable that the measuring means judges that the temperatures of the object are on decrease when the intensities of the first interfered light are higher than those of the second interfered light at the time that the intensities of the first interfered light or those of the second interfered light are on increase, the temperatures of the objects are on increase when the intensities of the first interfered light are lower than those of the second interfered light at the time that the intensities of the first interfered light or those of the second interfered light are on increase; and the measuring means judges that the temperatures of the object are on increase when the intensities of the first interfered light are higher than those of the second interfered light at the time that the intensities of the first interfered light or those of the second interfered light are on decrease, the temperatures of the objects are on decrease when the intensities of the first interfered light are lower than those of the second interfered light at the time that the intensities of the first interfered light or those of the second interfered light are on decrease.

In the above-described measuring device, it is preferable that the irradiating means is so arranged that when the second wavelength of the second interfered light is represented by $\lambda$, a thickness of the object to be measured is represented by d, and a refractive index of the object to be measured is represented by n, a difference $\Delta\lambda$ between the first wavelength of the first interfered light and the second wavelength of the second interfered light satisfies $|\Delta\lambda| < \lambda^2/(2nd+\lambda)$.

The above-described object of the present invention is achieved by a measuring device for irradiating laser beam of coherence to an object to be measured to measure change amounts of temperatures of the object to be measured, based on intensities of reflected light or interfered light on or by the object, the device comprising: irradiating means including angle changing means which changes an incident angle of the light of coherence to be irradiated to the object for irradiating the light of coherence to the object; and measuring means which, before a temperature measuring operation, changes an incident angle of the light of coherence on the object to predict a maximum value and a minimum value of the intensities of the interfered light, and, in the temperature measuring operation, measures temperatures of the object, based on measured intensities of the interfered light and the predicted maximum and minimum value.

In the above-described measuring device, it is preferable that the angle changing means changes the incident angle so that the maximum and the minimum values of the intensities of the interfered light are given at least in one set.

In the above-described measuring device, it is preferable that when a wavelength of the light of coherence to be irradiated is represented by $\lambda$, an incident angle is represented by $\theta$, a thickness of the object to be measured is represented by d, and a refractive index thereof is represented by n, an angle change $\Delta\theta$ of the incident angle in the predicting step satisfies a formula $\Delta\theta \geq \sin^{-1}[n^2 - \{(n^2-\sin^2\theta)^{1/2} - \lambda/4d\}^2]^{1/2} - \theta$.

In the above-described measuring device, it is preferable that the angle changing means changes a location of a light source which emits the light of coherence to change the incident angle of the light of coherence with respect to the object to be measured.

In the above-described measuring device, it is preferable that the angle changing means includes a mirror disposed in an optical path between a light source for generating the light coherence and the object to be measured for reflecting the light irradiated on the object to be measured; and a lens which refracts light reflected from the mirror, the mirror being rotated to change an the incident angle of the light of coherence on the object.

In the above-described measuring device, it is preferable that the irradiating means changes intensities of the laser beams to be irradiated to the object to be measured, based on temperatures of the object to be measured.

In the above-described measuring device, it is preferable that the irradiating means maintains or increases intensities of the laser beams to be irradiated to the object to be measured when the temperature of the object is rising, and maintains or decreases intensities of the laser beams when the temperature is falling.

In the above-described measuring device, it is preferable that the measuring device includes means for decreasing the intensities of the laser beams to be irradiated to the object to be measured, and the intensities of the laser beams to be irradiated to the object to be measured are decreased based on the temperature of the object to be measured.

In the above-described measuring device, it is preferable that the measuring device further comprises a container for the object to be placed in, the container having optical windows on which light to be irradiated to the object to be measured and which exit reflected light or transmitted light of the irradiated light on or by surfaces thereof, and at least one surface of the optical windows being slanted with respect to the optical axis of the laser beams so that no interference of reflected light inside each of the optical windows and between the optical windows takes place.

The above-described object of the present invention is achieved by a measuring device comprising: a first measuring device which measures a physical quantity at a first measured point of an object to be measured being carried; a second measuring device which is disposed at a mount position for the object to be mounted on and measures a physical quantity at a second measured point near said first measured point when the object is mounted on said mount position; and setting and correcting means which set a measured result given by the first measuring device as an initial measurement of the second measuring device, or which corrects a measurement of the second measuring device based on a measured result given by the first measuring device.

The above-described object of the present invention is achieved by a measuring device comprising: a first measuring device which measures a physical quantity at a first measured point of an object to be measured being carried; a second measuring device which is disposed at a mount position for the object to be mounted on and measures a physical quantity at a second measured point near said first measured point when the object is mounted on said mount position; and setting and correcting means which set a measured result given by the second measuring device as an initial measurement of the first measuring device, or which corrects a measurement of the first measuring device based on a measured result given by the second measuring device.

In the above-described measuring device, it is preferable that a laser beam source which is commonly used for the first measuring device and the second measuring device, and split means which splits laser beams emitted by the laser beam source; the first measuring device is arranged so as to incident one of laser beams splitted by the split means; and the second measuring device is arranged so as to incident another of laser beams splitted by the split means.

In the above-described measuring device, it is preferable that the physical quantity is a temperature.

The above-described object of the present invention is achieved by a measuring method using the above-described measuring device, the first measuring device measures temperatures at the first measured point when the object to be measured being carried; the second measuring device measures temperatures at the second measured point when the object to be measured being mounted at said mount position; the setting and correcting means correcting a measured result given by the second measuring device so as to agree with a measured result given by the first measuring device when the object being carried is stopped at the mount position; and the setting and correcting means corrects a result given by the first measuring device so as to agree with a measured result given by the second measuring device when the object start to be carried from the mount position.

The above-described object of the present invention is achieved by a method for fabricating a semiconductor device, in which required treatments are conducted on a semiconductor substrate while a physical quantity of the semiconductor substrate is measured by a measuring method, the measuring method irradiating laser beams to the semiconductor substrate to measure a physical quantity of the semiconductor substrate, pulsed laser beams being irradiated to the semiconductor substrate, first laser beams of a first wavelength of the pulsed laser beams and second laser beams of a second wavelength thereof being used to measure the physical quantity of the semiconductor substrate, the first wavelength being oscillated after rises of the pulsed laser beams, the second wavelength being oscillated thereafter.

In the above-described fabricating method, it is preferable that the required treatments is at least one of heat treatments, ion implantation, etching, diffusion, pretreatments and deposition.

The above-described object of the present invention is achieved by a method for measuring a wavelength comprising passing light to be measured having coherence through a reference substance having a pre-known refractive index and a pre-known thickness to apply the light to be measured in parallel rays, and measuring a wavelength change of the light to be measured, based on an intensity change of transmitted light or reflected light of the light to be measured.

In the above-described method, it is preferable that the light to be measured is pulsed laser beams.

In the above-described method, it is preferable that interfering conditions of the light are changed before a wavelength measuring operation to detect in advance a direction of the wavelength change according to the intensity change of the transmitted light or reflected light.

In the above-described method, it is preferable that a refractive index of the reference substance or a thickness thereof is changed to change the interfering conditions of the light.

In the above-described method, it is preferable that a temperature of the reference substance is changed to change the refractive index or the thickness.

In the above-described method, it is preferable that an incident angle of the light to be measured with respect to the reference substance is changed to change the interfering conditions of the light.

In the above-described method, it is preferable that an intensity of the transmitted light or the reflected light of the light to be measured at the start of a wavelength measuring operation is a set value between a maximum value of its changed intensities and minimum value thereof.

In the above-described method, it is preferable that the light to be measured is applied to the reference substance via optical windows, at least one surfaces of the optical windows are slanted with respect to the optical axis of the light to be measured so that no interference is caused by reflected light of the light to be measured on said one surfaces.

The above-described object of the present invention is achieved by a device for measuring a wavelength comprising: a reference substance having a pre-known refractive index; irradiating means for applying to the reference substance the light to be measured in parallel rays which pass the reference substance and has coherence; and measuring means for measuring a wavelength change of the light to be measured, based on an intensity change of transmitted light of the light to be measured or reflected light thereof.

In the above-described device, it is preferable that the light to be measured is pulsed laser beams.

In the above-described device, it is preferable that interfering conditions of the light are changed before a wavelength measuring operation to detect in advance a direction of the wavelength change according to the intensity change of the transmitted light or reflected light.

In the above-described device, it is preferable that a refractive index of the reference substance or a thickness thereof is changed to change the interfering conditions of the light.

In the above-described device, it is preferable that a temperature of the reference substance is changed to change the refractive index or the thickness.

In the above-described device, it is preferable that an incident angle of the light to be measured with respect to the reference substance is changed to change the interfering conditions of the light, In the above-described device, it is preferable that an intensity of the transmitted light or the reflected light of the light to be measured at the start of a wavelength measuring operation is a set value between a maximum value of its changed intensities and a minimum value thereof.

In the above-described device, it is preferable that the light to be measured is applied to the reference substance via optical windows, at least one surfaces of the optical windows are slanted with respect to the optical axis of the light to be measured so that no interference is caused by reflected light of the light to be measured on said one surfaces.

According to the present invention, pulsed laser beams is irradiated to the object to be measured, first laser beams of a first wavelength of the pulsed laser beams and second laser beams of a second wavelength thereof is used to measure the physical quantity of the object, the first wavelength being oscillated after rises of the pulsed laser beams, the second wavelength being oscillated thereafter, whereby physical quantities and the direction of change thereof can be precisely measured.

In the above-described measuring method, temperatures of the object are measured, based on changes of intensities of first interfered light of reflected light or transmitted light of one of the first laser beams on or by the object, and changes of intensities of second interfered light of reflected light or transmitted light of one of the second laser beams on or by the object, whereby temperature of the object to be measured and the direction of change thereof can be precisely measured.

In the above-described measuring method, the temperatures of the object are judged to be on increase or decrease, based on a direction of the changes of intensities of the first or the second interfered light and on a difference between the intensity of the first interfered light and that of the second interfered light, whereby temperature of the object to be measured and the direction of change thereof can be precisely measured.

In the above-described measuring method, the measuring method measures the physical quantity, temperatures, or a direction of changes of temperatures of the object to be measured, by using a semiconductor laser having a characteristic that the first wavelength of the first laser beams is shorter than the second wavelength of the second laser beams, whereby temperature of the object can be precisely measured.

In the above-described measuring method, the temperatures of the object are judged to be on increase when the intensities of the first interfered light are higher than those of the second interfered light at the time that the intensities of the first interfered light or those of the second interfered light are on increase, the temperatures of the objects are judged to be on decrease when the intensities of the first interfered light are lower than those of the second interfered light at the time that the intensities of the first interfered light or those of the second interfered light are on increase, the temperatures of the object are judged to be on decrease when the intensities of the first interfered light are higher than those of the second interfered light at the time that the intensities of the first interfered light or those of the second interfered light are on decrease, the temperatures of the objects are judged to be on increase when the intensities of the first interfered light are lower than those of the second interfered light at the time that the intensities of the first interfered light or those of the second interfered light are on decrease, whereby temperature of the object to be measured and the direction of change thereof can be reliably measured.

In the above-described measuring method, the measuring method measures the physical quantity, temperatures, or a direction of changes of temperatures of the object to be measured by using a semiconductor laser having a characteristic that the first wavelength of the first laser beams is longer than the second wavelength of the second laser beams, whereby temperature of the object can be precisely measured.

In the above-described measuring method, the temperatures of the object are judged to be on decrease when the intensities of the first interfered light are higher than those of the second interfered light at the time that the intensities of the first interfered light or those of the second interfered light are on increase, the temperatures of the objects are judged to be on increase when the intensities of the first interfered light are lower than those of the second interfered light at the time that the intensities of the first interfered light or those of the second interfered light are on increase, the temperatures of the object are judged to be on increase when the intensities of the first interfered light are higher than those of the second interfered light at the time that the intensities of the first interfered light or those of the second interfered light are on decrease, the temperatures of the objects are judged to be on decrease when the intensities of the first interfered light are lower than those of the second interfered light at the time that the intensities of the first interfered light or those of the second interfered light are on decrease, whereby temperature of the object to be measured and the direction of change thereof can be reliably measured.

In the above-described measuring method, when the second wavelength of the second interfered light is represented by $\lambda$, a thickness of the object to be measured is represented by d, and a refractive index of the object to be measured is represented by n, a difference $\Delta\lambda$ between the first wavelength of the first interfered light and the second wavelength of the second interfered light satisfies $$|\Delta\lambda| < \lambda^2/(2nd+\lambda),$$

whereby interference suitable for judging the direction of change of the temperature can be obtained.

According to the present invention, the method comprises: a predicting step of, before a temperature measuring operation, predicting a maximum value and a minimum value of the intensities of the interfered light; and a measuring step of measuring the change amounts of the temperatures of the object, based on the intensities of the interfered light, and the predicted maximum and minimum values, whereby the temperature measurement can be started immediately after the start of measuring the intensities of interfered light.

In the above-described measuring method, the incident angle in the predicting step is so changed that the maximum and the minimum values of the intensities of the interfered light are given at least in one set, whereby the maximum and the minimum values of the intensities of the interfered light can be predicted within the shortest time.

In the above-described measuring method, when a wavelength of the light of coherence to be irradiated is represented by $\lambda$, an incident angle is represented by $\theta$, a thickness of the object to be measured is represented by d, and a refractive index thereof is represented by n, an angle change $\Delta\theta$ of the incident angle in the predicting step satisfies a formula $$\Delta\theta \geq \sin^{-1}[n^2-\{(n^2-\sin^2\theta)^{1/2}-\lambda/4d\}^2]^{1/2}-\theta,$$

whereby the maximum and the minimum values of the intensities of the interfered light can be reliably predicted.

In the above-described measuring method, oscillating intensities of the laser beams to be irradiated to the object to be measured are changed based on temperatures of the object to be measured, whereby the method can measure a wide range of temperatures.

In the above-described measuring method, intensities of the laser beams to be irradiated to the object to be measured are constant or increased when the temperature of the object is rising, and intensities of the laser beams are constant or decreased when the temperature is falling, whereby the method can measure a wide range of temperatures.

In the above-described measuring method, the intensities of the laser beams to be irradiated to the object to be measured are decreased based on the temperature of the object to be measured, whereby the temperature of the object can be precisely measured by using the stable laser beams.

In the above-described measuring method, one or plural optical windows are provided in a measuring light path, at least one surface of the optical windows are slanted with respect to the optical axis of the laser beams, whereby no interference of reflected light inside each of the optical windows and between the optical windows takes place.

According to the present invention, the measuring device comprises: irradiating means which oscillates pulsed laser beams to irradiate first laser beams of a first wavelength which is oscillated after rises of the pulsed laser beams, and second laser beams which are oscillated thereafter and differs from the first wavelength; and measuring means which measures the physical quantity of the object to be measured by the use of the first laser beams and the second laser beams irradiated by the irradiating means, whereby the direction of change of the physical quantities can be precisely measured with a simple structure.

In the above-described measuring device, the measuring means measures temperatures of the object to be measured, based on changes of intensities of first interfered light of reflected light or transmitted light of one of the first laser beams on or by the object, or changes of intensities of second interfered light of reflected light or transmitted light of one of the second laser beams on or by the object, whereby the temperature and the direction of change thereof can be precisely measured with a simple structure.

In the above-described measuring device, the measuring means judges that the temperatures of the object are judged to be on increase or decrease, based on a direction of the changes of intensities of the first or the second interfered light and on a difference between the intensity of the first interfered light and that of the second interfered light, whereby the temperature and the direction of change thereof can be precisely measured with a simple structure.

In the above-described measuring device, the irradiating means includes a semiconductor laser having a characteristic that the first wavelength of the first laser beams is shorter than the second wavelength of the second laser beams, and the measuring device measures the physical quantity, a temperature, or a direction of changes of a temperature of the object to be measured, whereby they can be precisely measured.

In the above-described measuring device, the measuring means judges that the temperatures of the object are on increase when the intensities of the first interfered light are higher than those of the second interfered light at the time that the intensities of the first interfered light or those of the second interfered light are on increase, the temperatures of the object are on decrease when the intensities of the first interfered light are lower than those of the second interfered light at the time that the intensities of the first interfered light or those of the second interfered light are on increase; and the measuring means judges that the temperatures of the object are on decrease when the intensities of the first interfered light are higher than those of the second interfered light at the time that the intensities of the first interfered light or those of the second interfered light are on decrease, the temperatures of the object are on increase when the intensities of the first interfered light are lower than those of the second interfered light at the time that the intensities of the first interfered light or those of the second interfered light are on decrease, whereby the temperature and the direction of change thereof can be precisely measured with a simple structure.

In the above-described measuring device, the irradiating means includes a semiconductor laser having a characteristic that the first wavelength of the first laser beams is longer than the second wavelength of the second laser beams, and the measuring device measures a physical quantity, a temperature, or a direction of changes of a temperature of the object to be measured, whereby the device can measure a wide range of them.

In the above-described measuring device, the measuring means judges that the temperatures of the object are on decrease when the intensities of the first interfered light are higher than those of the second interfered light at the time that the intensities of the first interfered light or those of the second interfered light are on increase, the temperatures of the objects are on increase when the intensities of the first interfered light are lower than those of the second interfered light at the time that the intensities of the first interfered light or those of the second interfered light are on increase; and the measuring means judges that the temperatures of the object are on increase when the intensities of the first interfered light are higher than those of the second interfered light at the time that the intensities of the first interfered light or those of the second interfered light are on decrease, the temperatures of the objects are on decrease when the intensities of the first interfered light are lower than those of the second interfered light at the time that the intensities of the first interfered light or those of the second interfered light are on decrease, whereby the temperature and the direction of change thereof can be precisely measured with a simple structure.

In the above-described measuring device, the irradiating means is so arranged that when the second wavelength of the second interfered light is represented by $\lambda$, a thickness of the object to be measured is represented by d, and a refractive index of the object to be measured is represented by n, a difference $\Delta\lambda$ between the first wavelength of the first interfered light and the second wavelength of the second interfered light satisfies $$|\Delta\lambda| < \lambda^2/(2nd+\lambda),$$

whereby interference suitable for judging the direction of change of the temperature can be obtained.

According to the present invention, the device comprises: irradiating means including angle changing means which changes an incident angle of the light of coherence to be irradiated to the object for irradiating the light of coherence to the object; and measuring means which, before a temperature measuring operation, changes an incident angle of the light of coherence on the object to predict a maximum value and a minimum value of the intensities of the interfered light, and, in the temperature measuring operation, measures temperatures of the object, based on measured intensities of the interfered light and the predicted maximum and minimum value, whereby the temperature measurement can be started immediately after the start of measuring the intensities of interfered light.

In the above-described measuring device, the angle changing means changes the incident angle so that the maximum and the minimum values of the intensities of the interfered light are given at least in one set, whereby the maximum and the minimum values of the intensities of the interfered light can be predicted within the shortest time.

In the above-described measuring device, when a wavelength of the light of coherence to be irradiated is represented by $\lambda$, an incident angle is represented by $\theta$, a thickness of the object to be measured is represented by d, and a refractive index thereof is represented by n, an angle change $\Delta\theta$ of the incident angle in the predicting step satisfies a formula $$\Delta\theta \geq \sin^{-1}[n^2 - \{(n^2 - \sin^2\theta)^{1/2} - \lambda/4d\}^2]^{1/2} - \theta,$$

whereby the maximum and the minimum values of the intensities of the interfered light can be reliably predicted.

In the above-described measuring device, the angle changing means changes a location of a light source which emits the light of coherence to change the incident angle of the light of coherence with respect to the object to be measured, whereby the interfering conditions of the light can be easily changed so that the maximum and the minimum values of the intensities of the interfered light can be predicted.

In the above-described measuring device, the angle changing means includes a mirror disposed in an optical path between a light source for generating the light coherence and the object to be measured for reflecting the light irradiated on the object to be measured; and a lens which refracts light reflected from the mirror, the mirror being rotated to change an the incident angle of the light of coherence on the object, whereby the interfering conditions of the light can be easily changed so that the maximum and the minimum values of the intensities of the interfered light can be predicted.

In the above-described measuring device, the irradiating means changes intensities of the laser beams to be irradiated to the object to be measured, based on temperatures of the object to be measured, whereby the temperature of the object can be measured up to higher temperature.

In the above-described measuring device, the irradiating means maintains or increases intensities of the laser beams to be irradiated to the object to be measured when the temperature of the object is rising, and maintains or decreases intensities of the laser beams when the temperature is falling, whereby the temperature of the object can be measured up to higher temperature.

In the above-described measuring device, the measuring device includes means for decreasing the intensities of the laser beams to be irradiated to the object to be measured, and the intensities of the laser beams to be irradiated to the object to be measured are decreased based on the temperature of the object to be measured, whereby the temperature of the object can be precisely measured by using the stable laser beams.

In the above-described measuring device, the measuring device further comprises a container for the object to be placed in, the container having optical windows on which light to be irradiated to the object to be measured and which exit reflected light or transmitted light of the irradiated light on or by surfaces thereof, and at least one surface of the optical windows being slanted with respect to the optical axis of the laser beams, whereby no interference of reflected light inside each of the optical windows and between the optical windows takes place.

According to the present invention, the measuring device comprises: a first measuring device which measures a physical quantity at a first measured point of an object to be measured being carried; a second measuring device which is disposed at a mount position for the object to be mounted on and measures a physical quantity at a second measured point near said first measured point when the object is mounted on said mount position; and setting and correcting means which set a measured result given by the first measuring device as an initial measurement of the second measuring device, or which corrects a measurement of the second measuring device based on a measured result given by the first measuring device, whereby physical quantities of the object on move can be continuously measured.

According to the present invention, the measuring device comprises: a first measuring device which measures a physical quantity at a first measured point of an object to be measured being carried; a second measuring device is disposed at a mount position for the object to be mounted on and measures a physical quantity at a second measured point near said first measured point when the object is mounted on said mount position; and setting and correcting means which set a measured result given by the second measuring device as an initial measurement of the first measuring device, or which corrects a measurement of the first measuring device based on a measured result given by the second measuring device, whereby physical quantities of the object on move can be continuously measured.

In the above-described measuring device, a laser beam source which is commonly used for the first measuring device and the second measuring device, and split means which splits laser beams emitted by the laser beam source; the first measuring device is arranged so as to incident one of laser beams splitted by the split means; and the second measuring device is arranged so as to incident another of laser beams splitted by the split means, whereby physical quantities of the object on move can be continuously measured with a simple structure.

According to the present invention, the measuring method uses the above-described measuring device, the first measuring device measures temperatures at the first measured point when the object to be measured being carried; the second measuring device measures temperatures at the second measured point when the object to be measured being mounted at said mount position; the setting and correcting means correcting a measured result given by the second measuring device so as to agree with a measured result given by the first measuring device when the object being carried is stopped at the mount position; and the setting and correcting means corrects a result given by the first measuring device so as to agree with a measured result given by the second measuring device when the object start to be carried from the mount position, whereby physical quantities of the object on move can be continuously measured.

According to the present invention, in the method for fabricating a semiconductor device, required treatments are conducted on a semiconductor substrate while a physical quantity of the semiconductor substrate is measured by a measuring method, the measuring method irradiating laser beams to the semiconductor substrate to measure a physical quantity of the semiconductor substrate, pulsed laser beams being irradiated to the semiconductor substrate, first laser beams of a first wavelength of the pulsed laser beams and second laser beams of a second wavelength thereof being used to measure the physical quantity of the semiconductor substrate, the first wavelength being oscillated after rises of the pulsed laser beams, the second wavelength being oscillated thereafter, whereby physical quantities of the semiconductor substrate on move can be continuously measured. The required treatments may be heat treatments, ion implantation, etching, diffusion, pretreatments or deposition.

According to the present invention, the wavelength measuring method comprises the steps of passing light to be measured having coherence through a reference substance having a pre-known refractive index and a pre-known thickness to apply the light to be measured in parallel rays, and measuring a wavelength change of the light to be measured, based on an intensity change of transmitted light or reflected light of the light to be measured, whereby quickly shifting wavelengths can be measured without allocating a scanning time for spectral diffraction.

In the above-described method, the light to be measured may be laser beams or pulsed laser beams.

In the above-described method, interfering conditions of the light are changed before a wavelength measuring operation to detect in advance a direction of the wavelength change according to the intensity change of the transmitted light or reflected light, whereby the direction of change of the wavelength can be measured.

In the above-described method, a refractive index of the reference substance or a thickness thereof is changed, whereby the interfering condition of the light can be easily changed.

In the above-described method, a temperature of the reference substance is changed, whereby the interfering condition of the light can be easily changed.

In the above-described method, an incident angle of the light to be measured with respect to the reference substance is changed, whereby the interfering condition of the light can be easily changed.

In the above-described method, an intensity of the transmitted light or the reflected light of the light to be measured at the start of a wavelength measuring operation is a set value between a maximum value of its changed intensities and minimum value thereof, whereby change of the wavelength can be precisely measured.

In the above-described method, the light to be measured is applied to the reference substance via optical windows, at least one surfaces of the optical windows are slanted with respect to the optical axis of the light to be measured, whereby no interference is caused by reflected light of the light to be measured on said one surfaces.

According to the present invention, the wavelength measuring device comprises: a reference substance having a pre-known refractive index; irradiating means for applying to the reference substance the light to be measured in parallel rays which pass the reference substance and has coherence; and measuring means for measuring a wavelength change of the light to be measured, based on an intensity change of transmitted light of the light to be measured or reflected light thereof, whereby quickly shifting wavelengths can be measured without allocating a scanning time for spectral diffraction. In addition, the wavelength measuring device can be small-sized.

In the above-described device, the light to be measured may be laser beams or pulsed laser beams.

In the above-described device, interfering conditions of the light are changed before a wavelength measuring operation to detect in advance a direction of the wavelength change according to the intensity change of the transmitted light or reflected light, whereby the direction of change of the wavelength can be measured.

In the above-described device, a refractive index of the reference substance or a thickness thereof is changed, whereby the interfering conditions of the light can be easily changed.

In the above-described device, a temperature of the reference substance is changed to change the refractive index or the thickness, whereby the interfering conditions of the light can be easily changed.

In the above-described device, an incident angle of the light to be measured with respect to the reference substance is changed, whereby the interfering conditions of the light can be easily changed.

In the above-described device, an intensity of the transmitted light or the reflected light of the light to be measured at the start of a wavelength measuring operation is a set value between a maximum value of its changed intensities and a minimum value thereof, whereby the change of the wavelength can be precisely measured.

In the above-described device, the light to be measured is applied to the reference substance via optical windows, at least one surfaces of the optical windows are slanted with respect to the optical axis of the light to be measured, whereby no interference is caused by reflected light of the light to be measured on said one surfaces.

BRIEF DESCRIPTION OF THE DRAWINGS

FIGS. 5A to C are views explaining the measuring principle of the device for measuring temperatures according to the first embodiment of the present invention.

FIGS. 10A to C are views explaining a measuring principle of the device for measuring temperatures according to the second embodiment of the present invention.

FIG. 42 is a block diagram of a cluster device the device for measuring temperatures according to the eleventh embodiment of the present invention is applied to.

DETAILED DESCRIPTION OF THE INVENTION

[First Embodiment]

The device for measuring a temperature according to a first embodiment of the present invention will be explained with reference to FIGS. 1 to 5.

Figure 1:
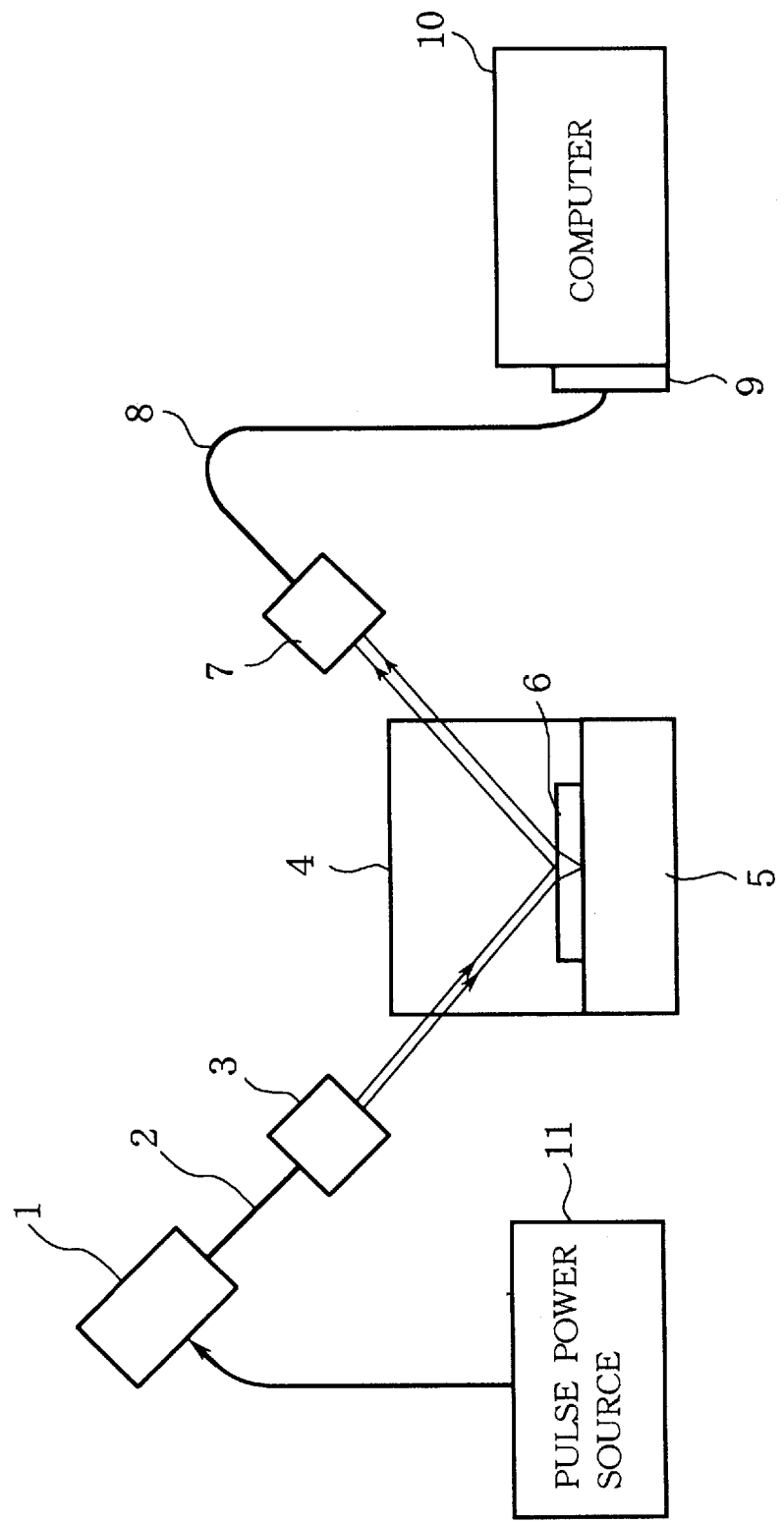
FIG. 1 is a block diagram of the device for measuring temperatures according to a first embodiment of the present invention.

FIG. 1 is a block diagram of the device for measuring a temperature according to the first embodiment.

In the device for measuring a temperature according to the present embodiment, coherent laser beams are applied to a measurable part of an object to be measured, e.g., a semiconductor substrate 6. The semiconductor substrate 6 has opposed surfaces which are polished to reflect the applied coherent laser beams, and variations in the observed mutually interfering intensities of the reflected light from the polished surfaces so as to give the temperature of the object.

The semiconductor substrate 6 whose temperature is desired to be measured is placed in a chamber 4 on a heater 5 for heating the semiconductor substrate 6.

The semiconductor substrate 6 whose temperature to be measured is an approximately 0.5 mm-thick silicon substrate. The semiconductor substrate 6 may be another semiconductor substrate, such as a GaAs substrate, an InP substrate or others, in addition to being a silicon substrate.

The semiconductor laser 1 is connected to a pulse power source 11. The pulse power source 11 supplies pulsed current of, e.g., 50 Hz, so that the semiconductor laser 1 emits pulsed laser beams modulated with this frequency. A suitable semiconductor laser is a NDL5600 by NEC (an InGaAsP phase shift-type DFT-DC-PBH laser diode for use in 1310 nm-optical fiber communication; output: approximately 0.5 mW). Preferably, the semiconductor laser 1 is a semiconductor laser with an APC which can emit pulses at a pulse frequency above 10 Hz.

The chamber 4 has optical windows (not shown) through which pulsed laser beams are applied to and reflected from the semiconductor substrate 6 in the chamber 4. The chamber 4 itself may be made of transparent material without the optical windows.

Pulsed laser beams emitted by the semiconductor laser 1 are led to a collimating optical unit 3 through an optical fiber 2. The pulsed laser beams are made into parallel ray bundles by the collimating optical unit 3 to be applied to the semiconductor substrate 6 in the chamber 4.

An interfered light reflected from the semiconductor substrate 6 is detected by a photo detector 7. A suitable photo detector is a B4246 by Hamamatsu Photonics (a Ge photovoltaic device).

Received signals derived from the light detected by the photo detector 7, which are analog signals, are supplied to an A/D converting unit 9 through a data signal line 8. The A/D converting unit 9 converts the detected signals to digital signals and outputs them to a computer 10. Based on these digital detected signals, the computer 10 calculates intensity variations due to mutual interference in the reflected light and, based on computation results, gives temperature changes, the direction of the change, and an accurate measured temperature.

Figure 2:
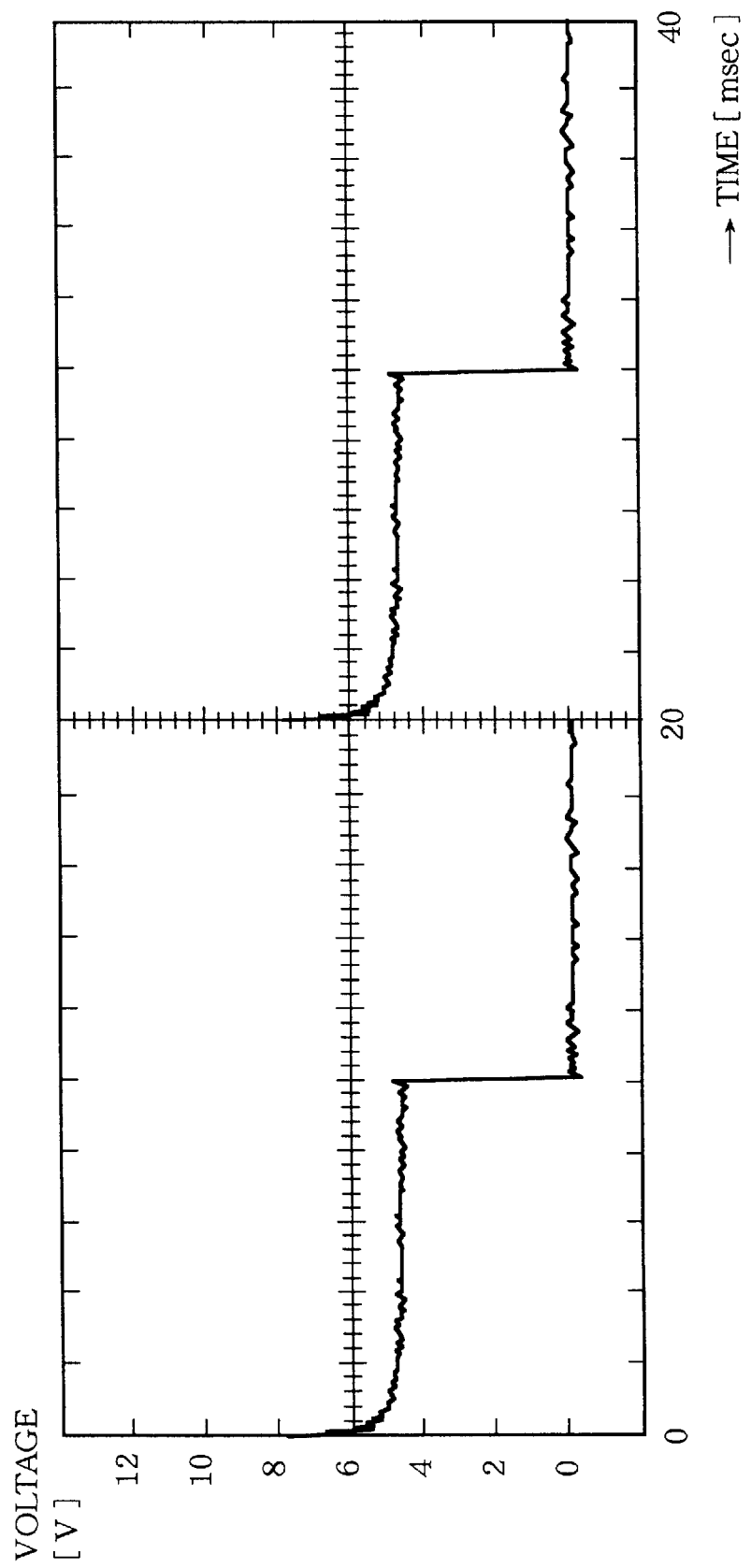
FIG. 2 is a view of waveforms of pulsed laser beams irradiated to a substrate to be measured showing transient changes of interfered light intensities.

The present embodiment uses the fact that when a pulsed laser beam is emitted by the semiconductor laser 1, the laser beam initially has a shorter wavelength (a first wavelength p1) by some Angstroms, when it rises, and thereafter has a longer wavelength (a second wavelength p2). As evidence of this fact, FIG. 2 shows an observed waveform of intensities of interfered light produced when a pulsed laser beam is applied to the semiconductor substrate 6 whose temperature is rising. FIG. 2 shows the case where pulsed laser beams with a 10 msec-pulse width are applied to the substrate 6. Voltages are taken on the vertical axis, and one division corresponds to 2 V. Time is taken on the horizontal axis, and one division corresponds to 1 ms.

As shown in FIG. 2, immediately after a laser beam pulse rises, the interfered light intensity is highest and thereafter gradually decreases to a stable, approximately constant value after approximately 2 msec. This transient changes do not occur in the case where a pulsed laser beam is generated by choppering a continuous laser beam. The temperature of the substrate 6 is constant while measuring in FIG. 2.

In the case where the temperature of the substrate 6 is constant, the intensity of interfered light depends on the wavelength of the source laser beam. Thus it is found in the graph of FIG. 2 that the wavelength of the pulsed laser beam changes transiently. In this embodiment, the pulsed laser beam has a short wavelength immediately after rising.

In the present embodiment, laser beams with an approximately 10 msec-pulse width are used. The laser beams may be sampled at their initial wavelength p1, 0.12 msec after the pulse begins to rise, and again at their second wavelength p2, 8 msec after the pulse rises. It is preferred that the laser beams of the first wavelength p1 begin to oscillate within approximately 0.5 msec after the pulse begins to rise.

In the present invention, the pulses may equally well be sampled 0.12 msec after the rise of any one pulse, and again 8 msec after the rise of any other pulse.

Next, the measuring principles of the device for measuring a temperature according to the present embodiment will be explained with reference to FIGS. 3 to 5.

Figure 3:
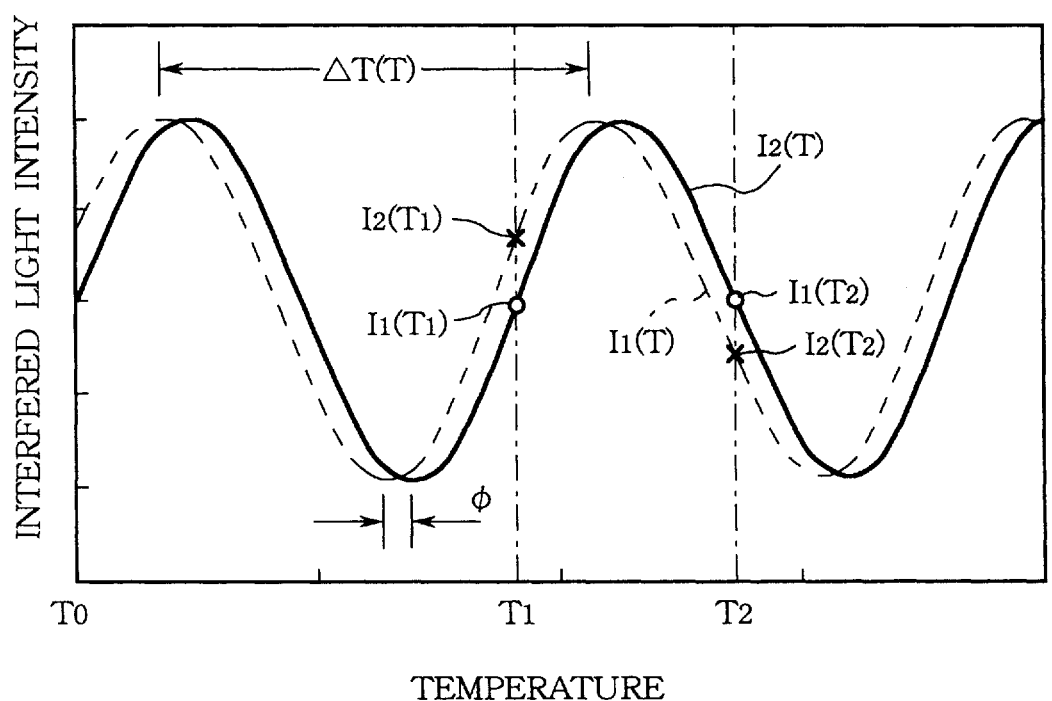
FIG. 3 is a graph of relationships between measured temperatures and interfered light intensities of the device for measuring temperatures according to the first embodiment of the present invention.
Figure 4A:
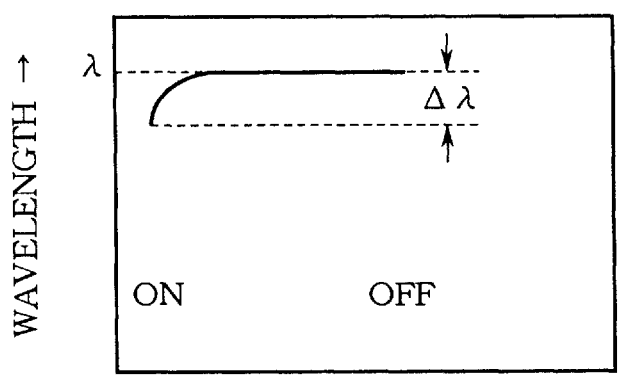
FIGS. 4A to C are graphs of wavelength changes and interfered light intensity changes of pulsed laser beams of the device for measuring temperatures according to the first embodiment of the present invention.
Figure 4B:
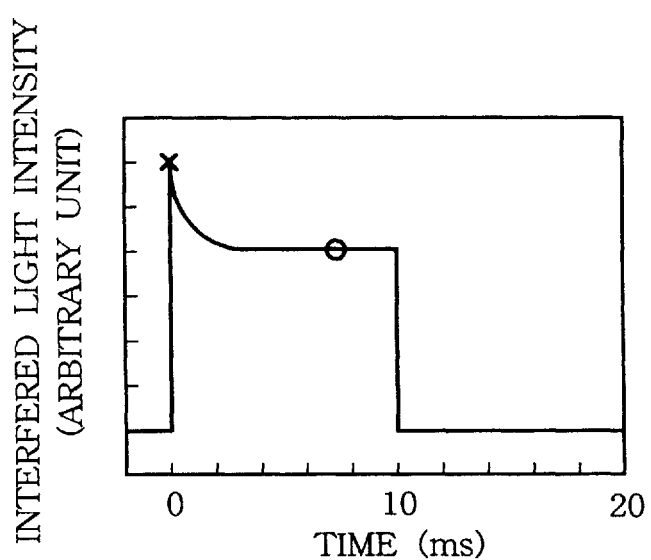
Figure 4C:
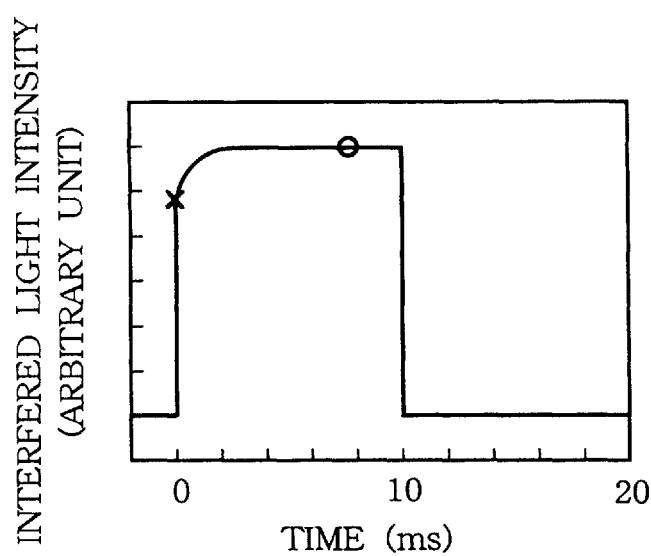

FIG. 3 is a graph of the relationships between the measured temperature (T) and the interfered light intensities (I1, I2). FIGS. 4A to C are graphs showing wavelength changes of pulsed laser beams and interfered light intensity changes. FIG. 5A is a graph showing the intensities of interfered light of the first and second wavelengths p1, p2. FIG. 5B is a graph showing transient temperature changes of the semiconductor substrate 6. FIG. 5C is a table showing the relationship between the interfered light and temperature changes in semiconductor substrate 6.

In the device for measuring a temperature according to the present embodiment, a silicon substrate, for example, as the semiconductor substrate 6, is mounted on the heater 5. When a laser beam emitted by the semiconductor laser 1 is applied to the semiconductor substrate 6, as shown in FIG. 1, portions of the laser beam reflected from the top and bottom surfaces of the semiconductor substrate 6 mutually interfere.

While the heater 5 is heating the semiconductor substrate 6, so that the temperature thereof is rising, the laser beams from the semiconductor laser 1 are applied to the semiconductor substrate 6 via the collimating optical unit 3. An interfered light reflected from the polished reflecting surfaces of semiconductor substrate 6 is detected by the photodetector 7, and the intensity of the interfered light is analyzed by the computer 10.

As a result, the temperature vs. the interfered light intensity characteristic indicated by the solid line in FIG. 3 is given. As the temperature of the semiconductor substrate 6 is rising, the intensity variation of the interfered light can be represented by periodically rising and falling into a kind of periodical waves similar to sine waves, i.e. sine-like waves.

This principle is as follows.

Because the dielectric constant (refractive index) of the semiconductor substrate 6 and a thickness thereof increase with rising temperature thereof, the effective optical distance inside the semiconductor substrate 6 changes. The phase of that portion of the laser beam which has traversed through the semiconductor substrate 6 and which has been reflected from the bottom surface prior to exiting from the top surface shifts according to the temperature change. Thus the resultant phase relationship between the reflected lights from the top surface and the bottom surface changes.

Accordingly an intensity of interfered light of reflected light on the semiconductor substrate 6 is changed in a sine-like wave by temperature changes. A temperature change $\Delta T(T)$ [°C.] for one period is calculated by the following formula when a thickness of the semiconductor substrate 6 is represented by L, and a refractive index thereof is represented by n $$\Delta T = \lambda \{2nL(\alpha+\beta)\}$$

where $\alpha = (1/L) \times (dL/dT)$ $\beta = (1/n) \times (dn/dT)$.

It is difficult to give $\alpha$ and $\beta$ here. $(\alpha+\beta)$ is experimentally given.

That is, a temperature change $\Delta T(T)$ for one period is given by the following formula, based on a frequency f of an intensity of the interfered light calculated based on a difference from an experimental initial value and a corrected curve of measured temperatures is calculated by the following fifth order approximation expression.

$$\Delta T(f) = 12.278 + 11.012xf - 0.13222xf^2 + 0.0018399xf^3 - 1.5803x10^{-5}xf^4 + 5.5364x10^{-8}xf^5$$

Thus, a temperature of the semiconductor substrate 6 is decided by a temperature To [°C.] at the start of heating and a number of periods of temperature changes.

On the other hand, the semiconductor substrate 6 is heated or cooled by the heater 5, and its temperature rises or lowers. To determine a temperature of the semiconductor substrate 6 it is necessary to know a direction of temperature changes. The principle for this judgement will be explained.

Pulsed current of approximately 50 Hz is injected into the semiconductor laser 1 from the pulse power source 11 to apply pulsed laser beams of 50 Hz from the semiconductor laser 1 to the semiconductor substrate 6. The wavelength of the pulsed laser beams emitted from the semiconductor laser 1 has a characteristic, as shown in FIG. 4A, that the wavelength is short when rises and becomes long by time when the wavelength has its normal state.

The first wavelength p1 ($=\lambda-\Delta\lambda$) of a pulsed laser beam from the semiconductor laser 1 at the time of rise is shorter by $\Delta\lambda$ than the second wavelength p2 ($=\lambda$) at its following normal state. The temperature-interfered light intensity characteristic showing relationships between intensities of reflected light of a laser beam of the first wavelength p1 ($=\lambda-\Delta\lambda$) on the semiconductor substrate 6, and temperatures has, as shown in FIG. 3, the phase advanced by $\phi$ with respect to that of the laser beam of the second wavelength p2 ($=\lambda$).

Suitable interference can be obtained by a maximum difference $\Delta\lambda$ between the first wavelength p1 of a pulsed laser beam oscillated within 0.5 ms after rise of the pulsed laser beam, and the second wavelength p2 ($=\lambda$) thereof satisfying the relationship of $|\Delta\lambda| < \lambda^2(2nd+\lambda)$ with respect to a refractive index n of the semiconductor substrate 6 and a thickness d thereof.

Based on the above, it is seen that while a temperature of the semiconductor substrate 6 is increasing, with the interfered light intensity being increased, a interfered light intensity I2 of the second wavelength p2 is lower than a interfered light intensity I1 of the first shorter wavelength p1, and with a interfered light intensity being decreased, oppositely a interfered light intensity I2 of the second wavelength p2 is higher than that I1 of the shorter first wavelength p1.

It is also seen that while a temperature of the semiconductor substrate 6 is decreasing, with the interfered light intensity being increased, a interfered light intensity I2 of the second wavelength p2 is higher than a interfered light intensity I1 of the first shorter wavelength p1, and with a interfered light intensity being decreased, oppositely a interfered light intensity I2 of the second wavelength p2 is lower than that I1 of the shorter first wavelength p1.

With respect to reflected light of a pulsed laser beam shown in FIG. 4A, there are two cases that, as shown in FIG.

4B, the interfered light intensity is low when the pulsed laser beam rises, and, as shown in FIG. 4C, the interfered light intensity is high when the pulsed laser beam rises.

FIG. 4B corresponds to the temperatures T1 with respect to the interfered light intensity changes of FIG. 3. FIG. 4C corresponds to the temperatures T2 with respect to the interfered light intensity changes of FIG. 3. FIG. 3 corresponds to the circles and the crosses in FIGS. 4B and C.

Accordingly, it is judged whether a temperature is increasing or decreasing: by measuring intensities of the interfered light of the reflected light of a pulsed laser beam on the semiconductor substrate immediately (X) after the rise of the pulsed laser beam, and a certain time (O) after the rise of the pulsed laser beam so as to judge whether the interfered light intensity at the rise of the pulsed laser beam is low as in FIG. 4B or is high as in FIG. 4C; and by measuring slop of the intensity I1 of interfered light of the first wavelength p1 or the intensity I2 of interfered light of the second wavelength p2intensity I1.

That is, the following is judged with the vicinity of the crest of the waveform of the coherent light intensity and the vicinity of the trough thereof out of consideration.

At the time when the intensity I1 of interfered light of the first wavelength p1 or the intensity I2 of interfered light of the second wavelength p2 are increasing, it is judged that when an intensity I1 of the interfered light of the first wavelength p1 is higher than that I2 of the interfered light of the second wavelength (I1>I2) a temperature of the semiconductor substrate 6 is rising, and when an intensity I1 of the interfered light of the first wavelength p1 is lower than that I2 of the interfered light of the second wavelength (I1<I2), a temperature of the semiconductor substrate 6 is falling. At the time when the intensity I1 of interfered light of the first wavelength p1 or the intensity I2 of interfered light of the second wavelength p2 are decreasing, it is judged that when an intensity I1 of the interfered light of the first wavelength p1 is higher than that I2 of the interfered light of the second wavelength (I1>I2) a temperature of the semiconductor substrate 6 is falling, and when an intensity I1 of the interfered light of the first wavelength p1 is higher than that I2 of the interfered light of the second wavelength (I1<I2), a temperature of the semiconductor substrate 6 is rising.

The method for this judgement used in the present embodiment will be specifically explained. First, pulsed laser beams of a 50 Hz frequency are applied to the semiconductor substrate 6. Reflected light of the applied laser beams are received by the photo receptor 7, and intensities of interfered light are stored for the respective pulses. At this time, interfered light intensities I1 of the first wavelength p1 oscillated within 0.5 msec after the rises of the pulsed laser beams, and interfered light intensities I2 of the second wavelength p2 oscillated after 0.5 msec from the rises of the pulsed laser beams as shown in FIGS. 4B and C are extracted and stored, and relationships between changes of the coherent intensities I1, I2 and time are graphed.

Based on the graph, for example, a temperature of the semiconductor substrate 6 is, by the heater 5, increased in a time (t0–tm) and then decreased in a time (tm–t2), and relationships between intensities of the reflected light on the semiconductor substrate 6 and time are measured. The measurement result is as shown in FIG. 5A. In FIG. 5A, the sine-like wave in the solid line indicates interfered light intensities of the second wavelength p2 (=λ), and the sine-like wave in the broken line indicates interfered light intensities of the first wavelength p1 (=λ–Δλ).

Based on the thus-given interfered light intensities shown in FIG. 5A, temperature changes are given as shown in FIG. B.

The above-described physical relationships are opposite near the crests and troughs of the intensity waveforms of the interfered light. Because intensity differences between interfered light of the first wavelength p1 and that of the second wavelength p2 are small there, a threshold value is set for the intensity difference between the interfered light of the first wavelength p1 and that of the second wavelength p2 so as to determine a direction of temperature changes only when an intensity difference of above the threshold value between the interfered light of both wavelengths p1, p2.

For example, when a maximum value of the intensities I1 of the interfered light of the first wavelength p1 is represented by I1max, and the intensities of the interfered light of the second wavelength I2' at a time when an intensity I1 of the former has the maximum value I1max is represented by I2', a threshold value Ith=(Imax–I2') is set for the differences between the intensities of both interfered light. Algorithms different from each other are used for |I1–I2|≦Ith and |I1–I2|>Ith so as to correctly judge a direction of temperature changes.

In another method, a direction of temperature changes can be correctly judged by not determining a direction of temperature changes between a point of I1–I2=0 near the crest and trough of a interfered light waveform, and the crest and trough of the interfered light waveform, or by reversing the relationship therebetween of FIG. 5C.

Figure 6:
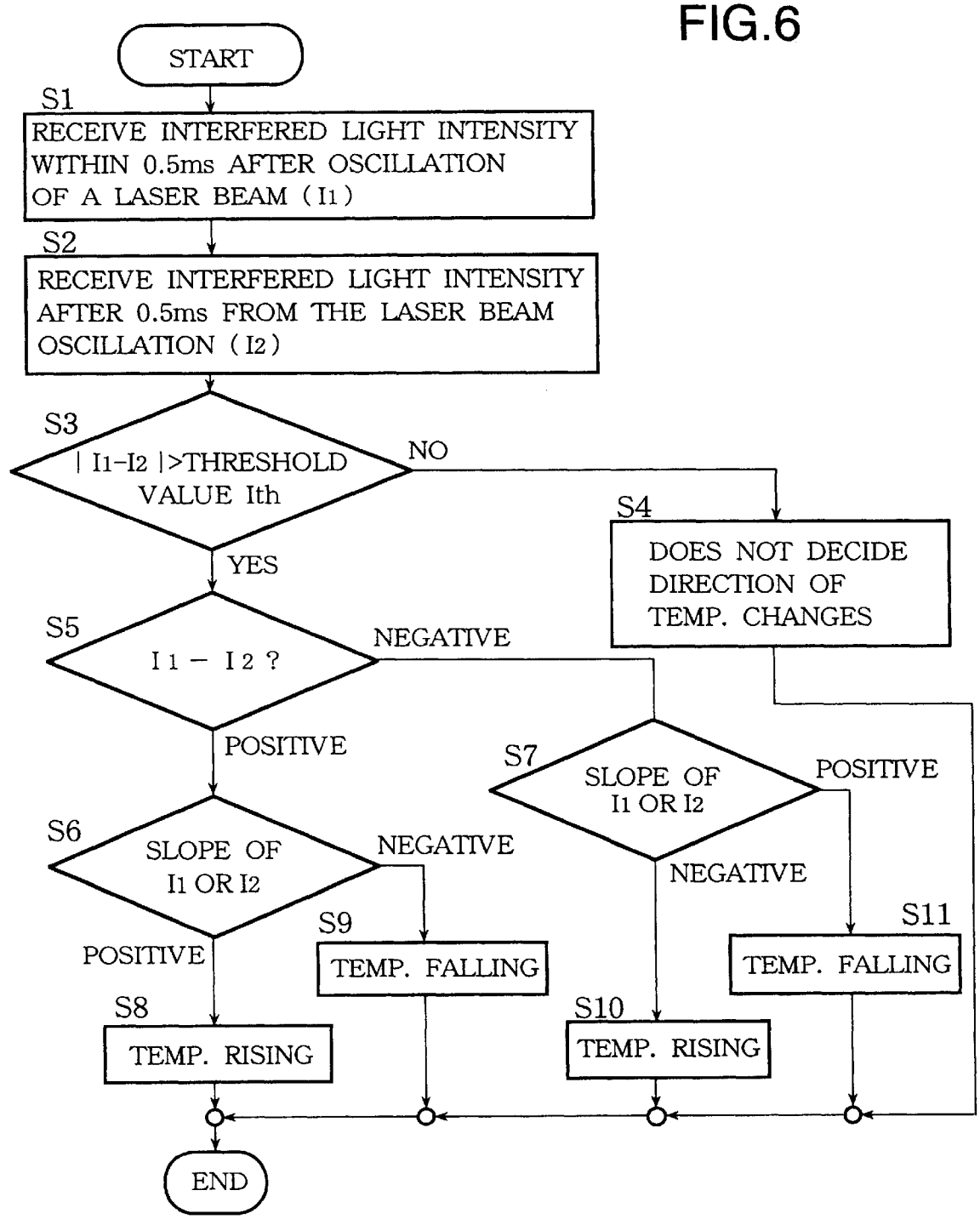
FIG. 6 is a flow chart of an algorithm of the device for measuring temperatures according to the first embodiment of the present invention.

Next, algorithms used in the present embodiment will be explained with reference to the flow chart shown in FIG. 6.

In the present embodiment, as described above, a set threshold value is set for the intensity differences between the interfered light of the first wavelength p1 and that of the second wavelength p2, and different algorithms are used before and after the threshold value so as to decide a measured temperature.

First, interfered light intensity I1 associated with the first wavelength p1 of a pulsed laser beam oscillated within 0.5 ms after the rise of the pulsed laser beam is stored (Step S1), Then a interfered light intensity I2 associated with the second wavelength of the pulsed laser beam oscillated after 0.5 ms from the rise of the pulsed laser beam is stored (Step S2).

Then, when a maximum value of the intensities I1 of the interfered light of the first wavelength p1 is represented by I1max, and the intensities of the interfered light of the second wavelength I2' at a time when an intensity I1 of the former has the maximum value I1max is represented by I2', a threshold value Ith=(Imax–I2') is set for the differences between the intensities of both interfered light. It is judged whether an absolute value |I1–I2| of a difference between the stored interfered light intensities I1 and I2 in Steps S1 and S2 is larger than the threshold value Ith (Step S3).

When |I1–I2|≦Ith, the point is near crest and trough of the interfered light waveform, and a direction of a temperature changes is not decided. The measurement is completed (Step S4).

When |I1–I2|>Ith, the point is other than a point near the crest and trough of the interfered light waveform and a direction of temperature changes is given based on the relationships of FIG. 5C (Step S5 to S11).

That is, when I1–I2>0, and an inclination of a interfered light waveform of the second wavelength p2 is positive, a temperature is judged to be "Temperature Rising", and when I1–I2<0, and an inclination of a interfered light waveform of the second wavelength p2 is negative, a temperature is judged to be "Temperature Falling". When I1–I2<0, and an inclination of a interfered light waveform of the second wavelength p2 is negative, a temperature is judged to be "Temperature Rising", and when I1−I2<0, and an inclination of a interfered light waveform of the second wavelength p2 is positive, a temperature is judged to be "Temperature Falling".

Figure 7:
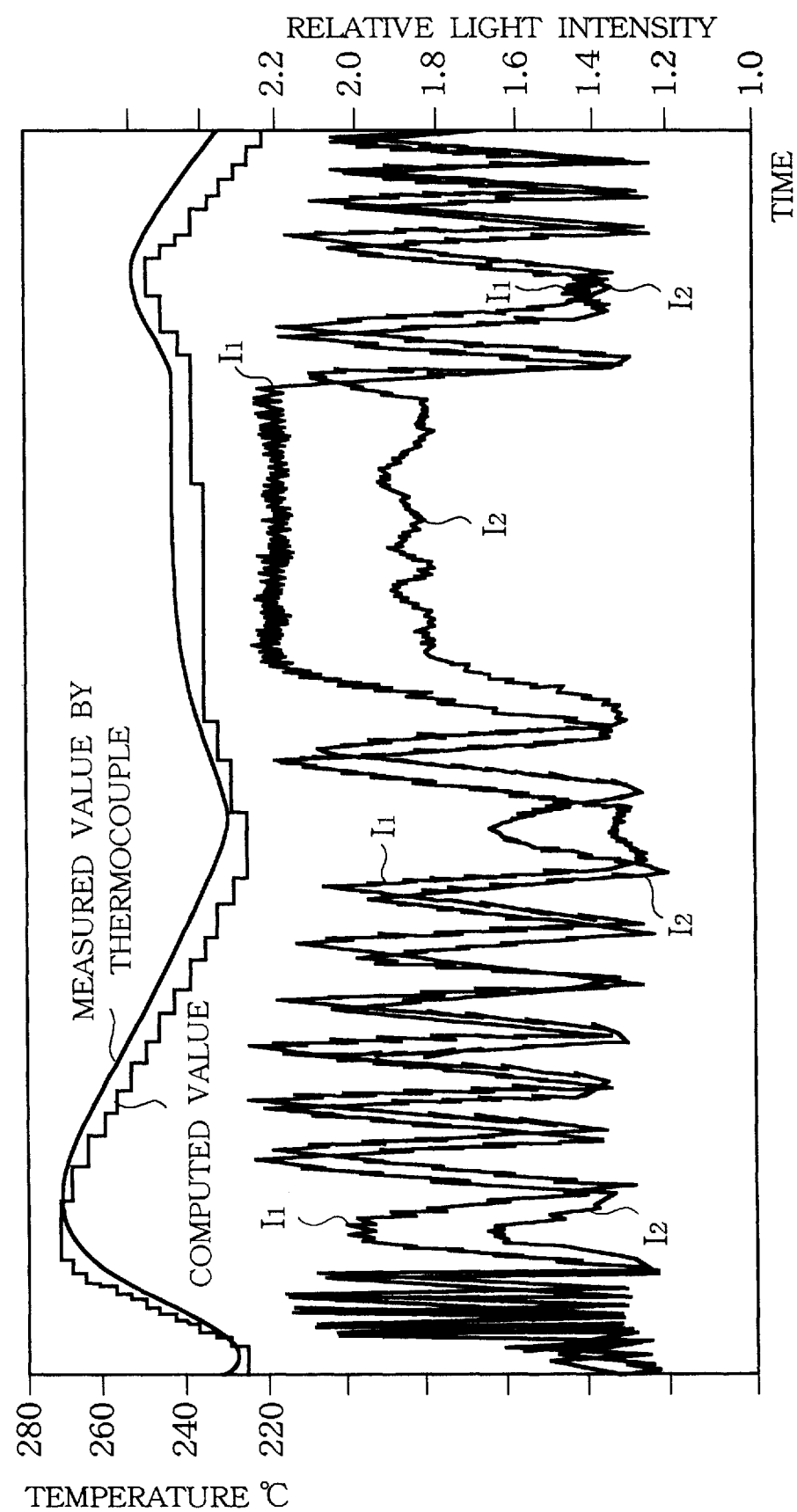
FIG. 7 is a graph of measured results of the device for measuring temperatures of the first embodiment of the present invention.

The result of the measurement according to the present embodiment is shown in FIG. 7. At the lower part of FIG. 7, intensities I1 of interfered light of the first wavelength of the laser beam, and intensities I2 of interfered light of the second wavelength of the laser beam are show. At the upper part of FIG. 7, computed temperatures values of the semiconductor substrate 6 by the computer 10, and measured temperatures read by a thermocouple are shown.

The temperature calculation gives a temperature change amount ΔT(T) and a direction of temperature changes when an intensity I2 of interfered light of the laser beam of the second wavelength p2 is changed by ¼ period. When a temperature is increasing, ΔT is added to a concurrent temperature, and when a temperature is decreasing, ΔT is subtracted from a concurrent temperature.

As apparent in FIG. 7, it is found that the intensities I1 of the interfered light of the first wavelength p1 of the laser beam, and the intensities I2 of the interfered light of the second wavelength p2 of the laser beam repeat increases and decreases in accordance with temperature rises and falls, and the computed temperature values and measured temperatures read by the thermocouple well agree with each other.

Thus according to the present embodiment, a semiconductor laser having a characteristic that an oscillation wavelength of a laser beam emitted by the semiconductor laser shifts upon rising is used, whereby laser beams of different wavelengths are easily obtained. Because wavelength differentiation is not necessary for the measurement, no lock-in amplifier is necessary, which makes the device for measuring temperatures structurally simple and makes the device inexpensive.

Furthermore, a direction of temperature changes can be decided by each of emitted pulsed laser beams, whereby temperature change directions can be given in good details. The device for measuring temperatures can be of high precision.

[Second Embodiment]

The device for measuring temperatures according to the second embodiment will be explained with reference to FIGS. 8 to 11.

The first embodiment uses a semiconductor laser of a III–V compound semiconductor, and can realize temperature measurement of high precision. But, as described above, semiconductor lasers of III–V compound semiconductors have an approximately 1.6 μm oscillation wavelength at longest, and have upper limits to temperatures-to-be-measured of semiconductor wafers, as of silicon, GaAs, etc., having relatively small energy band gaps. Their temperature measuring range is adversely narrow.

To solve this disadvantage, the present embodiment uses a semiconductor laser of a IV–VI compound semiconductor with a wide wavelength range. That is, IV–VI compound semiconductors, such as, PbSnTe, PbTeS, PbSSe, PbSnSe, etc. having NaCl-type crystal structure have 0.04–0.3 eV energy band gaps. A semiconductor laser 1 of such a semiconductor can oscillate in a 4–30 μm wavelength range, depending on compositions. To receive with high sensitivity laser beams in this wavelength range, a photo receptor 7 is formed of a IV–VI compound semiconductor of the above-described structure.

The semiconductor laser of a III–V compound semiconductor used in the first embodiment has a characteristic that a wavelength of a pulsed laser beam shortens by some Angstroms when the pulse rises and thereafter elongates. But the semiconductor laser of a IV–VI compound semiconductor used in the present embodiment has the reverse characteristic that a wavelength or a pulsed laser beam elongates over some Angstroms when the pulse rises and thereafter shortens.

Figure 8:
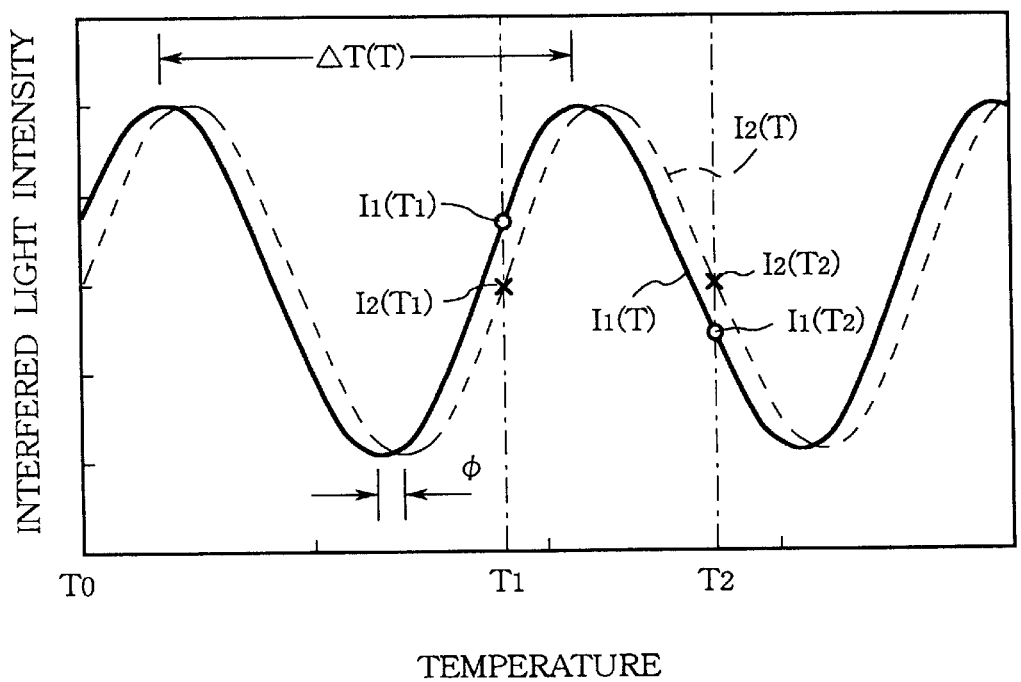
FIG. 8 is a graph of relationships between measured temperatures and interfered light intensities of the device for measuring temperatures according to a second embodiment of the present invention.
Figure 9A:
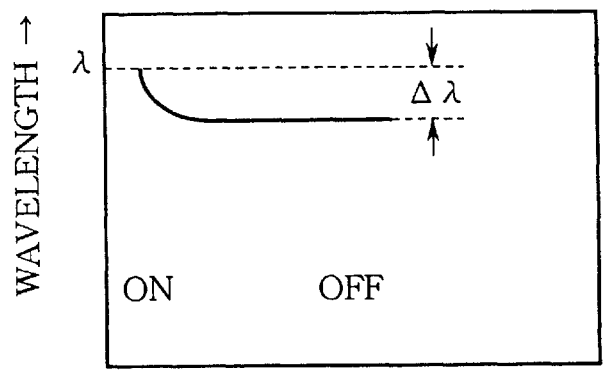
FIGS. 9A to C are graphs of wavelength changes and interfered light intensity changes of pulsed laser beams of the device for measuring temperatures according to the second embodiment of the present invention.
Figure 9B:
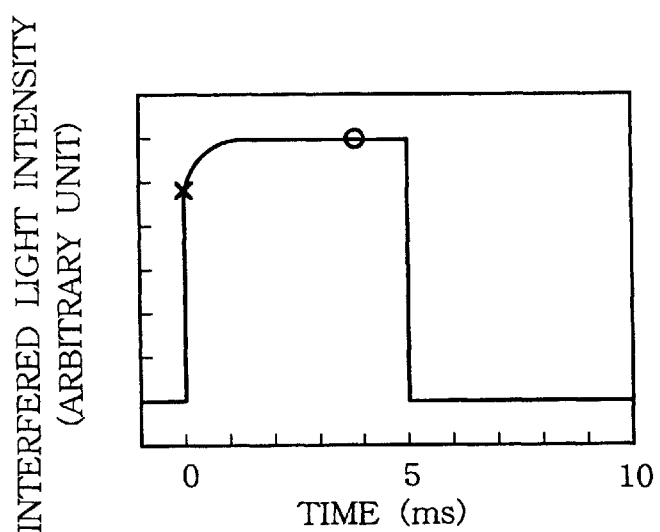
Figure 9C:
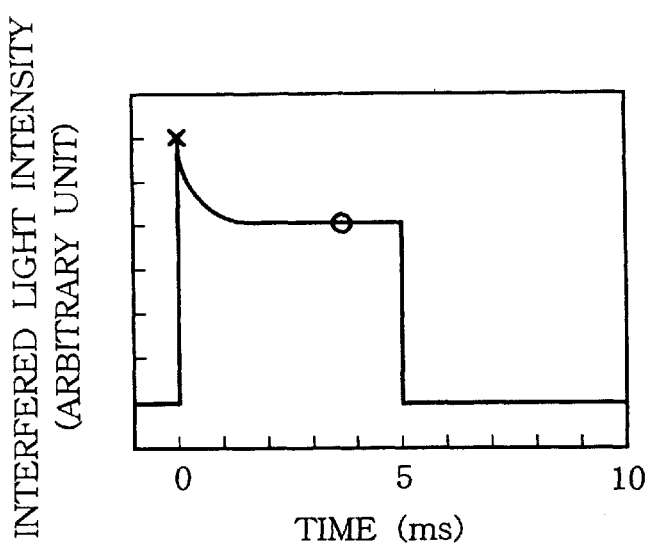

Accordingly the device for measuring temperatures according to the present embodiment has basically the same structure as the device of FIG. 1, but its judging condition is different from that of the first embodiment. The judging condition of the device for measuring temperatures according to the present embodiment will be explained with reference to FIGS. 8 to 11. FIG. 8 is a graph of relationships between measured temperatures and interfered light intensities. FIGS. 9A to C are graphs of wavelength changes of pulsed laser beams and changes of intensities of interfered light associated therewith. FIG. 10A is a graph of intensities of interfered light of laser beams of a first wavelength p1 and a second wavelength p2. FIG. 10B is a graph of transient temperatures of the semiconductor substrate 6. FIG. 10C is a graph of relationships between the interfered light and changes of temperatures of the semiconductor substrate 6.

In the device for measuring temperatures according to the present embodiment, a silicon substrate as a semiconductor substrate 6 is mounted on a heater 5. When laser beams from the semiconductor laser 1 are applied to the semiconductor substrate 6, as shown in FIG. 1, laser beams reflected from the top and the bottom surfaces of the semiconductor substrate 6 interfere with each other, and the interfered light is the reflected light on the semiconductor substrate 6.

While the semiconductor substrate 6 is being heated by the heater 5, laser beams from the semiconductor laser 1 are applied to the semiconductor substrate 6 via a collimating optical unit 3. Reflected light on the semiconductor substrate 6 is received by a photo receptor 7, and intensities of the interfered light is analyzed by a computer 10.

As a result, a temperature-interfered light intensity characteristic indicated by the solid line in FIG. 8 is obtained. As a temperature of the semiconductor substrate 6 is gradually increased, intensities of the interfered light change into a sine-like curve.

This principle is as follows.

Because the dielectric constant (refractive index) of the semiconductor substrate 6 and a thickness thereof increase with rising temperature thereof, the effective optical distance inside the semiconductor substrate 6 changes. The phase of that portion of the laser beam which has traversed through the semiconductor substrate 6 and which has been reflected from the bottom surface prior to exiting from the top surface shifts according to the temperature change. Thus the resultant phase relationship between the reflected lights from the top surface and the bottom surface changes.

Accordingly an intensity of interfered light of reflected light on the semiconductor substrate 6 is changed in a sine-like wave by temperature changes. A temperature change $\Delta T(T)$ [°C.] for one period is calculated by the following formula when a thickness of the semiconductor substrate 6 is represented by L, and a refractive index thereof is represented by n $$\Delta T = \lambda / \{2nL(\alpha+\beta)\}$$

where $\alpha = (1/L) \times (dL/dT)$ $\beta = (1/n) \times (dn/dT)$.

It is difficult to give $\alpha$ and $\beta$ here. $(\alpha+\beta)$ is experimentally given.

That is, a temperature change ΔT(T) for one period is given by the following formula, based on a frequency f of an intensity of the interfered light calculated based on a difference from an experimental initial value and a corrected curve of measured temperatures is calculated by the following fifth order approximation expression.

$$\Delta T(f)=12.278+11.012xf-0.13222xf^2+0.0018399xf^3-1.5803x10^{-5}xf^4+5.5364x10^{-8}xf^5$$

Thus, a temperature of the semiconductor substrate 6 is decided by a temperature To [°C.] at the start of heating and a number of periods of temperature changes.

On the other hand, the semiconductor substrate 6 is heated or cooled by the heater 5, and its temperature rises and falls. To decide a temperature of the semiconductor substrate 6 it is necessary to know a direction of temperature changes thereof. The principle of judging a direction of temperature changes of the semiconductor substrate will be explained.

Pulsed current of approximately 50 Hz is injected into the semiconductor laser 1 from a pulse power source I1, and pulsed laser beams of 50 Hz are applied to the semiconductor substrate 6 from the semiconductor laser 1. The wavelength of the pulsed laser beams from the semiconductor laser 1 has a characteristic as show in FIG. 9A that the wavelength is long when the pulses rise and shorten by the time when the pulses have their normal state.

This characteristic is considered to be due to the fact that because the energy band gap of the compound semiconductor of the semiconductor laser 1 widens as temperature rises due to oscillation, the wavelength of the oscillation light shifts to be shorter.

A first wavelength p1 $(=\lambda-\Delta\lambda)$ of a pulsed laser beam from the semiconductor laser 1 at the time of rise is longer by $\Delta\lambda$ than a second wavelength p2 the pulsed laser beam in its normal state. As indicated by the broken line in FIG. 8, the temperature-interfered light intensity characteristic showing relationships between intensities of the interfered light of reflected light of the pulsed laser beam of the first wavelength p1 $(=\lambda-\Delta\lambda)$ on the semiconductor substrate 6, and temperatures has a φ-phase delay.

Suitable interference can be obtained by a maximum difference $\Delta\lambda$ between the first wavelength p1 of a pulsed laser beam oscillated within 0.5 ms after rise of the pulsed laser beam, and the second wavelength p2 $(=\lambda)$ thereof satisfying the relationship of $|\Delta\lambda|<\lambda^2/(2nd+\lambda)$ with respect to a refractive index n of the semiconductor substrate 6 and a thickness d thereof.

Based on the above, it is seen that while a temperature of the semiconductor substrate 6 is increasing, with the interfered light intensity being increased, a interfered light intensity I2 of the second wavelength p2 is higher than a interfered light intensity I1 of the first shorter wavelength p1, and with a interfered light intensity being decreased, oppositely a interfered light intensity I2 of the second wavelength p2 is lower than that I1 of the shorter first wavelength p1.

It is also seen that while a temperature of the semiconductor substrate 6 is decreasing, with the interfered light intensity being increased, a interfered light intensity I2 of the second wavelength p2 is lower than a interfered light intensity I1 of the first longer wavelength p1, and with a interfered light intensity being decreased, oppositely a interfered light intensity I2 of the second wavelength p2 is higher than that I1 of the longer first wavelength p1.

With respect to reflected light of a pulsed laser beam shown in FIG. 9A, there are two cases that, as shown in FIG. 9B, the interfered light intensity is low when the pulsed laser beam rises, and, as shown in FIG. 9C, the interfered light intensity is high when the pulsed laser beam rises.

FIG. 9B corresponds to the temperatures T1 with respect to the interfered light intensity changes of FIG. 8. FIG. 9C corresponds to the temperatures T2 with respect to the interfered light intensity changes of FIG. 8. FIG. 8 corresponds to the circles and the crosses in FIGS. 9B and C.

Accordingly, it is judged whether a temperature is increasing or decreasing: by measuring intensities of the interfered light of the reflected light of a pulsed laser beam on the semiconductor substrate immediately (crosses) after the rise of the pulsed laser beam, and a certain time (circles) after the rise of the pulsed laser beam so as to judge whether the interfered light intensity at the rise of the pulsed laser beam is low as in FIG. 9B or is high as in FIG. 9C; and by measuring slop of the intensity I1 of interfered light of the first wavelength p1 or the intensity I2 of interfered light of the second wavelength p2intensity I1.

That is, the following is judged with the vicinity of the crest of the waveform of the coherent light intensity and the vicinity of the trough thereof out of consideration.

At the time when the intensity I1 of interfered light of the first wavelength p1 or the intensity I2 of interfered light of the second wavelength p2 are increasing, it is judged that when an intensity I1 of the interfered light of the first wavelength p1 is higher than that I2 of the interfered light of the second wavelength (I1>I2) a temperature of the semiconductor substrate 6 is falling, and when an intensity I1 of the interfered light of the first wavelength p1 is lower than that I2 of the interfered light of the second wavelength (I1<I2), a temperature of the semiconductor substrate 6 is rising. At the time when the intensity I1 of interfered light of the first wavelength p1 or the intensity I2 of interfered light of the second wavelength p2 are decreasing, it is judged that when an intensity I1 of the interfered light of the first wavelength p1 is higher than that I2 of the interfered light of the second wavelength (I1>I2) a temperature of the semiconductor substrate 6 is rising, and when an intensity I1 of the interfered light of the first wavelength p1 is higher than that I2 of the interfered light of the second wavelength (I1<I2), a temperature of the semiconductor substrate 6 is falling.

The method for this judgement used in the present embodiment will be specifically explained. First, pulsed laser beams of a 50 Hz frequency are applied to the semiconductor substrate 6. Reflected light of the applied laser beams are received by the photo receptor 7, and intensities of interfered light are stored for the respective pulses. At this time, interfered light intensities I1 of the first wavelength p1 oscillated within 0.5 msec after the rises of the pulsed laser beams, and interfered light intensities I2 of the second wavelength p2 oscillated after 0.5 msec from the rises of the pulsed laser beams as shown in FIGS. 9B and C are extracted and stored, and relationships between changes of the coherent intensities I1, I2 and time are recorded.

Based on the graph, for example, a temperature of the semiconductor substrate 6 is, by the heater 5, increased in a time (t0-tm) and then decreased in a time (tm-t2), and relationships between intensities of the reflected light on the semiconductor substrate 6 and time are measured. The measurement result is as shown in FIG. 10A. In FIG. 10A, the sine-like wave in the solid line indicates interfered light intensities of the second wavelength p2(λ), and the sine-like wave in the broken line indicates interfered light intensities of the first wavelength p1 $(=\lambda-\Delta\lambda)$.

Based on the thus-given interfered light intensities shown in FIG. 10A, temperature changes are given as shown in FIG. 10B.

The above-described physical relationships are opposite near the crests and troughs of the intensity waveforms of the interfered light. Because intensity differences between interfered light of the first wavelength p1 and that of the second wavelength p2 are small there, a threshold value is set for the intensity difference between the interfered light of the first wavelength p1 and that of the second wavelength p2 so as to determine a direction of temperature changes only when an intensity difference of above the threshold value between the interfered light of both wavelengths p1, p2.

For example, when a maximum value of the intensities I1 of the interfered light of the first wavelength p1 is represented by I1max, and the intensities of the interfered light of the second wavelength I2' at a time when an intensity I1 of the former has the maximum value I1max is represented by I2', a threshold value Ith=(Imax−I2') is set for the differences between the intensities of both interfered light. Algorithms different from each other are used for $|I1-I2| \leq Ith$ and $|I1-I2| > Ith$ so as to correctly judge a direction of temperature changes.

In another method, a direction of temperature changes can be correctly judged by not determining a direction of temperature changes between a point of I1−I2=0 near the crest and trough of a interfered light waveform, and the crest and trough of the interfered light waveform, or by using another algorithm therebetween.

Figure 11:
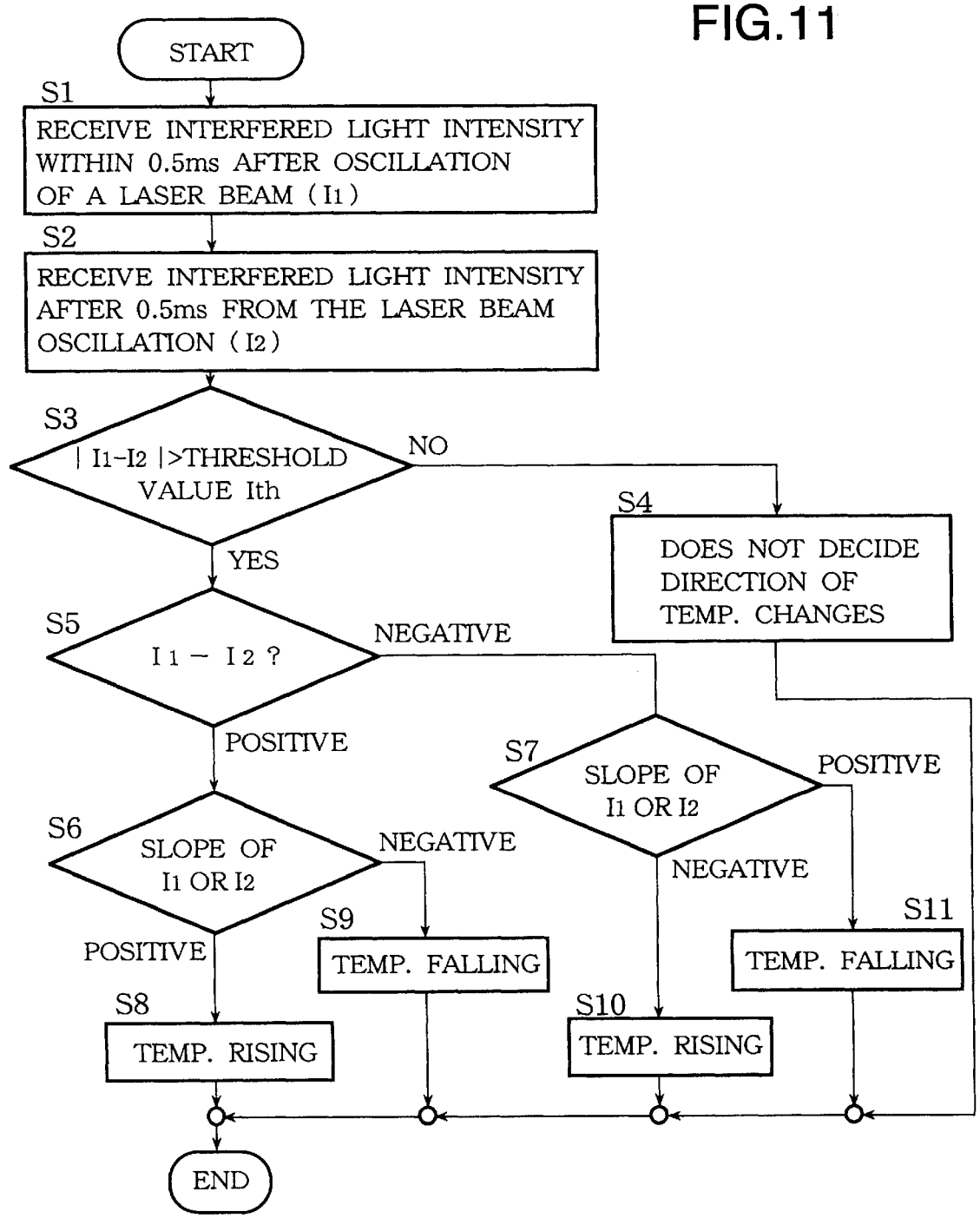
FIG. 11 is a flow chart of an algorithm of the device for measuring temperatures according to the second embodiment of the present invention.

Next, algorithms used in the present embodiment will be explained with reference to the flow chart shown in FIG. 11.

In the present embodiment, as described above, a set threshold value is set for the intensity differences between the interfered light of the first wavelength p1 and that of the second wavelength p2, and different algorithms are used before and after the threshold value so as to decide a measured temperature.

First, Interfered light intensity I1 associated with the first wavelength p1 of a pulsed laser beam oscillated within 0.5 ms after the rise of the pulsed laser beam is stored (Step S1). Then a interfered light intensity I2 associated with the second wavelength of the pulsed laser beam oscillated after 0.5 ms from the rise of the pulsed laser beam is stored (Step S2).

Then, when a maximum value of the intensities I1 of the interfered light of the first wavelength p1 is represented by I1max, and the intensities of the interfered light of the second wavelength I2' at a time when an intensity I1 of the former has the maximum value I1max is represented by I2', a threshold value Ith=(Imax−I2') is set for the differences between the intensities of both interfered light. It is judged whether an absolute value $|I1-I2|$ of a difference between the stored interfered light intensities I1 and I2 in steps S1 and S2 is larger than the threshold value Ith (Step S3).

When $|I1-I2| \leq Ith$, the point is near crest and trough of the interfered light waveform, and a direction of a temperature changes is not decided. The measurement is (Step S4).

When $|1-I2| > Ith$, the point is other than a point near the crest and trough of the interfered light waveform and a direction of temperature changes is given based on the relationships of FIG. 10C (Step S5 to S11).

That is, when I1−I2<0, and an inclination of a interfered light waveform of the second wavelength p2 is positive, a temperature is judged to be "Temperature Rising", and when I1−I2>0, and an inclination of a interfered light waveform of the second wavelength p2 is negative, a temperature is judged to be "Temperature Falling". When I1−I2>0, and an inclination of a interfered light waveform of the second wavelength p2 is negative, a temperature is judged to be "Temperature Rising", and when I1−I2>0, and an inclination of a interfered light waveform of the second wavelength p2 is positive, a temperature is judged to be "Temperature Falling".

Thus according to the present embodiment, a semiconductor laser having a characteristic that an oscillation wavelength of a laser beam emitted by the semiconductor laser shifts upon rising is used, whereby laser beams of different wavelengths are obtained. As a result, no modulation system is necessary for shifting an oscillation wavelength of the semiconductor laser. Because wavelength differentiation is not necessary for the measurement, no lock-in amplifier is necessary, which makes the device for measuring temperatures structurally simple and makes the device inexpensive.

Furthermore, a direction of temperature changes can be decided by each of emitted pulsed laser beams, whereby temperature change directions can be given in good details. The device for measuring temperatures can be of high precision.

Furthermore, because the laser beams of the semiconductor laser used in the present embodiment have long wavelengths, even when energy band gaps of semiconductors, such as silicon, GaAs, etc. narrow due to temperature rises, laser beam absorption amounts do not increase, and temperature measurement of sufficient precision is possible.

[Third Embodiment]

Figure 12:
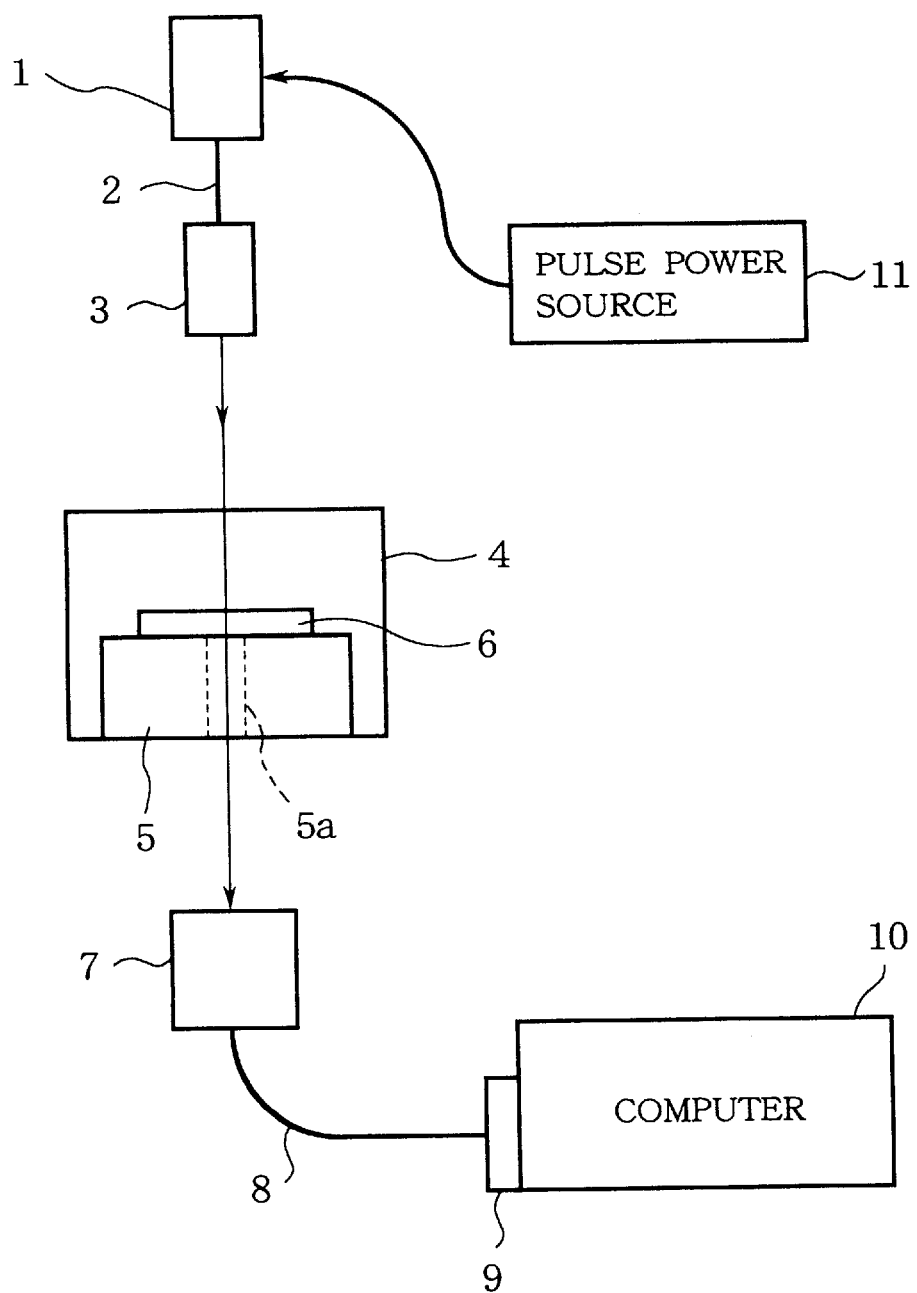
FIG. 12 is a block diagram of the device for measuring temperatures according to a third embodiment of the present invention.

Then a device for measuring temperatures according to a third embodiment of the present invention will be explained with reference to FIG. 12. FIG. 12 shows a block diagram of the device for measuring temperatures according to the present embodiment. Common members of the present embodiment with the first embodiment of FIG. 1 are represented by common reference numerals to simplify their explanation or not to repeat their explanation.

In the first embodiment, temperature are measured by the use of reflection light on the semiconductor substrate 6, but in the device for measuring temperatures according to the present embodiment laser beams applied to a measurable part of a semiconductor substrate 6. The semiconductor substrate 6 has opposed surfaces which are polished to reflect the applied coherent laser beams, and variations in the observed mutually interfering intensities of the reflected light from the polished surfaces so as to give the temperature of the object.

A pulse power source 11, a semiconductor laser 1, an optical fiber 2 and a collimating optical unit 3 for applying laser beams to the semiconductor substrate 6 placed in a chamber 4 are arranged upper as viewed in FIG. 12, and a photo receptor 7, data signal line 8, an A/D converting unit 9, and a computer 10 are arranged lower as viewed in FIG. 12.

The chamber 4 has optical windows (not shown) through which pulsed laser beams are applied to and reflected from the semiconductor substrate 6 in the chamber 4. The chamber 4 itself may be made of transparent material without the optical windows.

A heater 5 for a semiconductor substrate 6 to be mounted on has a light passage hole 5a formed therethrough. Transmitted light by the semiconductor substrate 6 is received by the photo receptor 7 through the light passage hole 5a.

Pulsed laser beams emitted by the semiconductor laser 1 are incident on the semiconductor substrate 6 in the chamber through the optical fiber 1 and the collimation optical unit 3. Transmitted light by the semiconductor substrate 6 is received by the photo receptor 7, and light received signals are supplied to the computer 10 through the data signal line 8.

The principle and operation of the present embodiment are the same as those of the first embodiment, and their explanation is omitted.

Thus according to the present embodiment, by the use of transmitted light by a semiconductor substrate to be measured, the device for measuring temperatures can have a simple structure and can be inexpensive as does the device according to the first embodiment.

[Pulsed Laser Beam]

in the description so far made above, the term "pulsed laser beam" has been used without definition. The definition of this term will be explained with reference to FIGS. 13 and 14.

Generally "a pulsed laser beam" means a laser beam whose intensity rises in a very short time and falls in a very short time, and is called rectangular pulse for its waveform. To be strict with "pulsed laser beam", parameters for determining a waveform of the pulsed laser beam are (1) an intensity of the base of a laser beam, (2) a rise time of a pulse, (3) a height of a pulse, (4) a duration of the peak of a pulse and (5) a fall time of the pulse are considered. The waveform of a pulsed laser beam varies in accordance with values of the parameters.

"A pulse laser beam" which can be used in the present invention is, in short, a laser beam whose wavelength, when emitted by the semiconductor laser, shortens by some Angstroms (the first wavelength p1) when the pulse rises, and thereafter elongates (the second wavelength p2).

Conversely, "A pulse laser beam" which can be used in the present invention is, in short, a laser beam whose wavelength, when emitted by the semiconductor laser, elongates by some Angstroms (the first wavelength p1) when the pulse rises, and thereafter shortens (the second wavelength p2).

Figure 13:
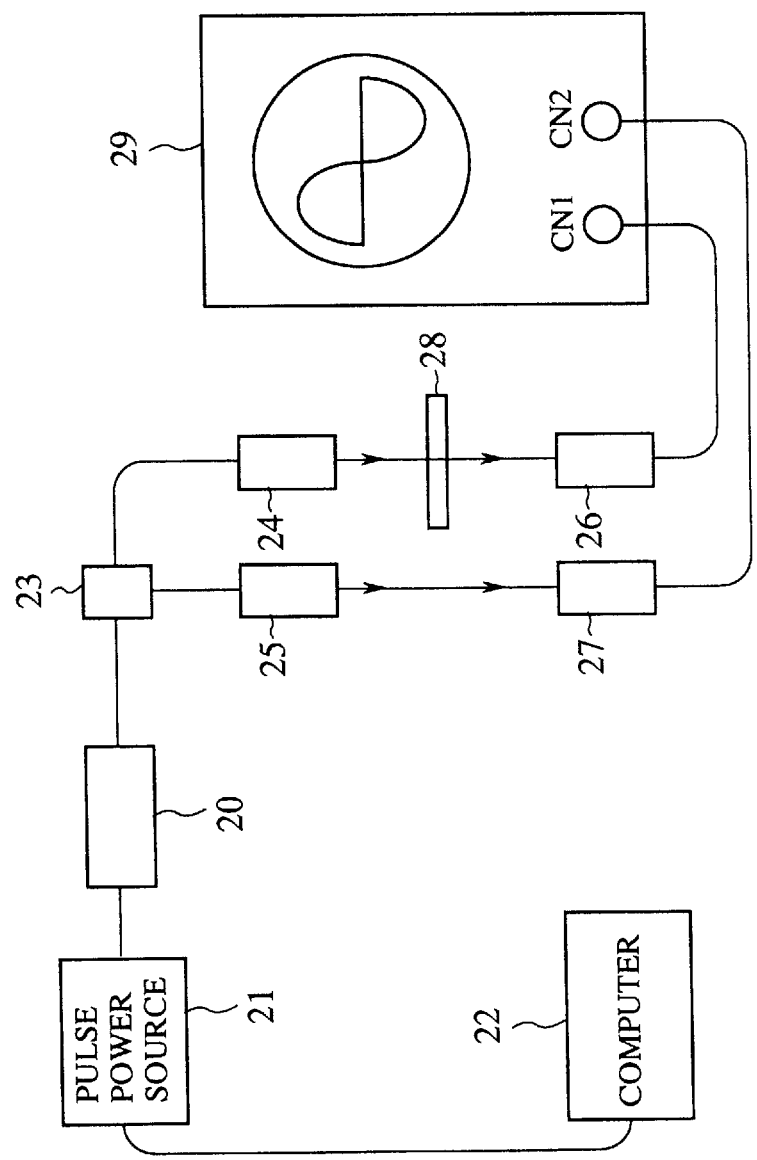
FIG. 13 is a block diagram of an experimental device for measuring limits of pulsed laser beams according to the present invention.

A limit of the pulsed laser beam which can be used in the present invention was measured by the experimental device of FIG. 13. A pulse power source 21 is connected to the semiconductor laser 20. A computer 22 is connected to the pulse power source 21. The waveform of pulsed current supplied by the pulse power source 21 is controlled by the computer 22. Thus laser beams of a required waveform are emitted by the semiconductor laser 20. As the semiconductor laser 20 NDL5600 (III–V semiconductor laser) by NEC was used.

A pulsed laser beam emitted by the semiconductor laser 20 is split into two laser beam,s by a light splitting coupler 23. The split laser beams are respectively made into parallel ray bundles by their associated collimating optical units 24, 25.

Photo receptors 26, 27 respectively receive laser beams emitted by their associated collimating optical units 26, 27. The photo receptors were B4246 by Hamamatsu Photonics. A silicon substrate 28 is placed between the collimating optical unit 24 and the photo receptor 26. Laser beams which have passed through the silicon substrate 28 are received by the photo receptor 26. The silicon substrate 28 is retained at a certain temperature. Nothing is provided between the other collimating optical unit 25 and the photo receptor 27, and the laser beam from the collimating optical unit 25 is received by the photo receptor 27 as it is.

Light received signals received by the photo receptors 26, 27 were compared and observed by an oscilloscope 29. Light received signals from the photo receptor 26 were inputted to an input terminal CN1, and light received signals from a photo receptor 27 were inputted to an input terminal CN2.

Figure 14A:
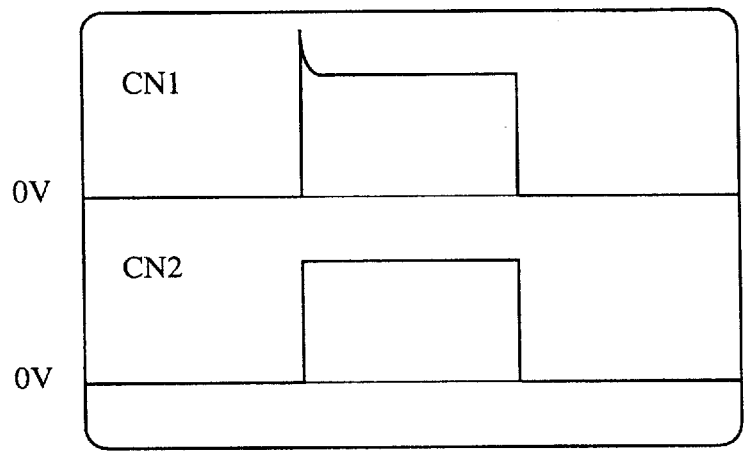
FIGS. 14A to C are graphs of measured results of the experimental device of FIG. 13.
Figure 14B:
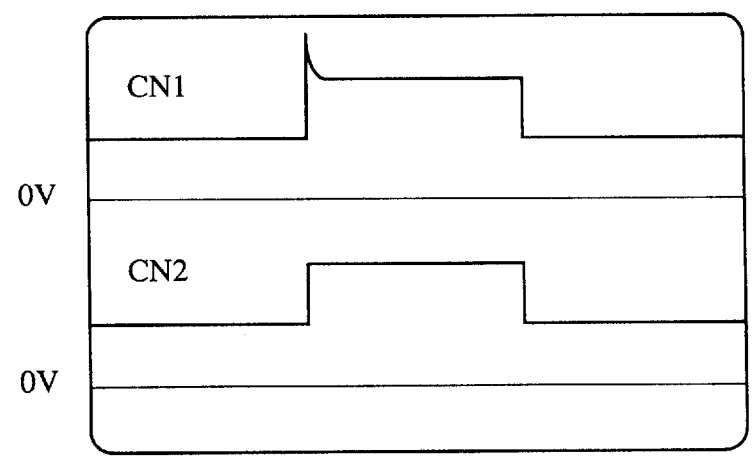
Figure 14C:
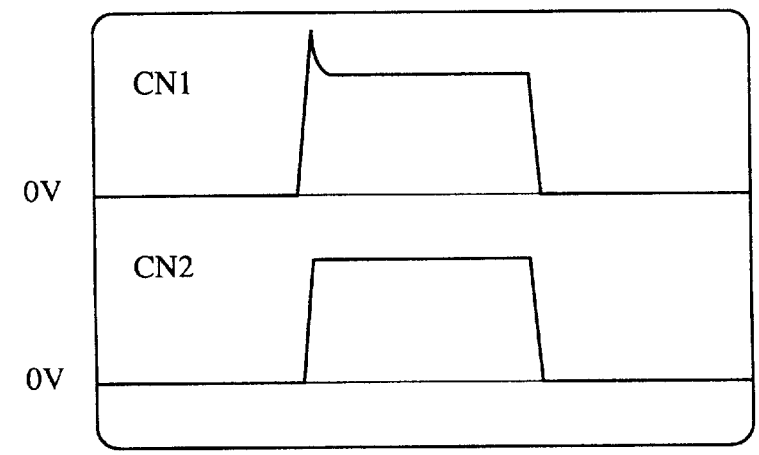

The result of the observation is shown in FIG. 14. In FIGS. 14A to C, a light received signal CN1 from the photo receptor 26 is shown upper, and a light received signal CN2 from the photo receptor 27 is shown lower. When a wavelength of a laser beam changes, an intensity of a light received signal (CN1) of the laser beam which has passed through the silicon substrate 28 and generated by the light receptor 26 changes, but an intensity of a light received signal (CN2) generated by the light receptor 27 does not change. By comparing the light received signals CN1, CN2 of the light receptors 26, 27 with each other, it can be judged whether or not the wavelength of the laser beam had a change.

FIG. 14A shows the pulsed laser beam used in the above-described embodiments. An intensity of the base of this pulsed laser beam is 0 V; a rising time of the pulse is $\mu$sec; a height of the pulse is 4 V; a duration of the peak of the pulse is 5 msec; and a falling time of the pulse is 80 $\mu$sec. In FIG. 14A it is found that a wavelength change occurs when the laser beam rises.

FIG. 14B shows a pulsed laser beam with the intensity of the base increased. The intensity of this laser beam is 2 V which is a half a height of the peak. AS seen in FIG. 14B, in this case as well, a wavelength change occurs when the laser beam rises. Accordingly it is found that even with the intensity of the base of the laser beam raised to some extent, wavelength changes occur.

FIG. 14C shows pulsed laser beams of a trapezoidal waveform having a longer rising time of the pulse and a longer falling time thereof. The rising time of the pulse of the laser beams is 2 msec and the failing time thereof is 2 msec. As shown in FIG. 14C, in this case as well, wavelength changes take place when the laser beams rise. Thus it is found that even when a rising time of a pulse of the laser beams is made some longer, wavelength changes occur.

As evident from the above experiment, the "pulsed laser beam" which can be used in the present invention includes, in addition to the generally defined "a laser beam whose intensity rises in a very short time and falls in a very short time", a "pulsed laser beam" whose base intensity is higher than 0 V, and a "trapezoidal laser beam" whose pulse rising time and falling time are longer.

The "pulsed laser beam" which can be used in the present invention is significant because of sharpness of the pulse rise, and waveforms of the pulse fall are not involved in the wavelength change. Accordingly waveforms of the laser beam may be rectangular and triangular. The laser beam may have, in addition, sine-like waveforms and sawtooth waveforms.

[Fourth Embodiment]

Figure 15:
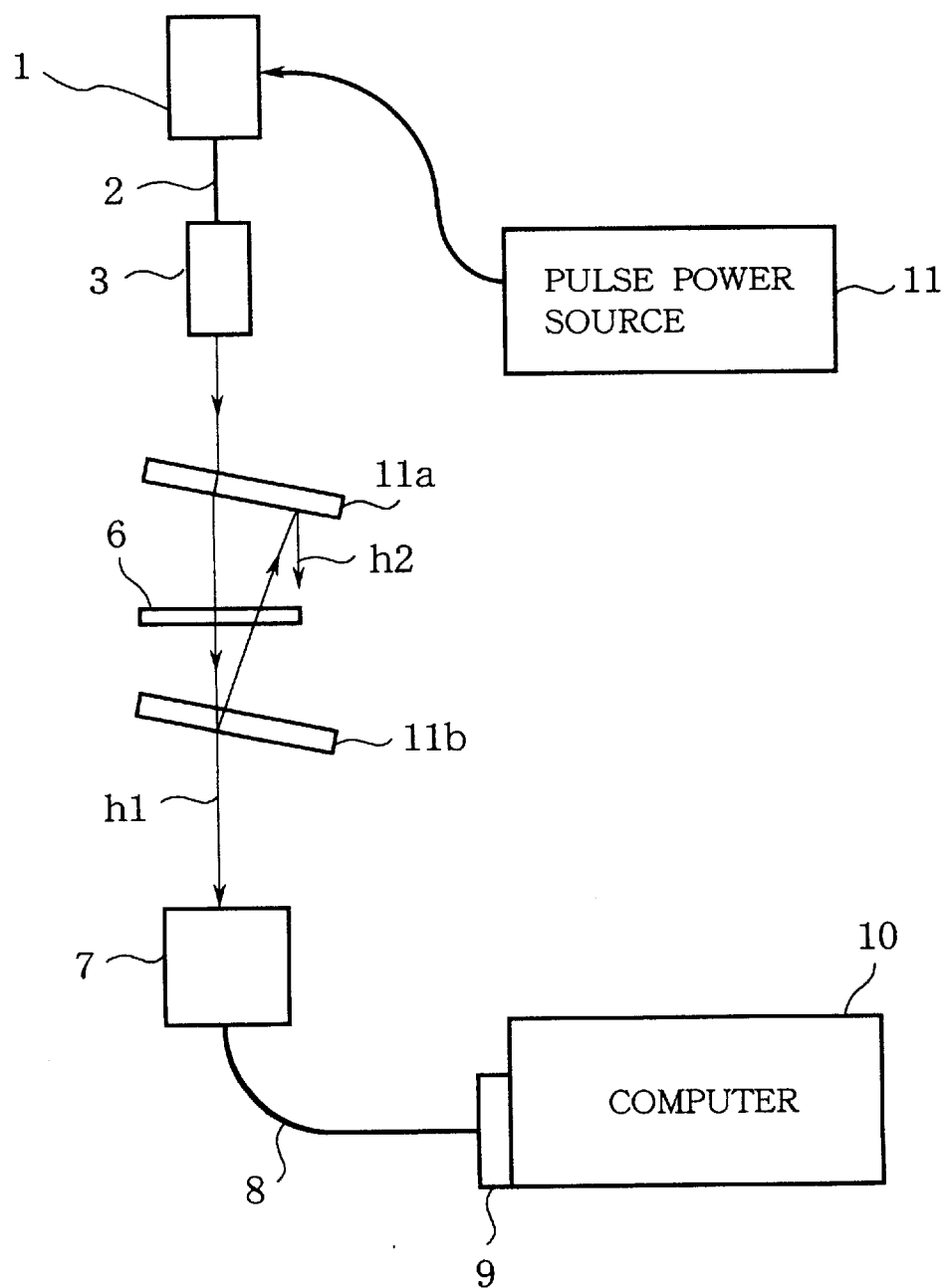
FIG. 15 is a block diagram of the device for measuring temperatures according to a fourth embodiment of the present invention.

The device for measuring temperatures according to a fourth embodiment of the present invention will be explained with reference to FIGS. 15 and 16. FIG. 15 shows a block diagram of the device for measuring temperatures according to the present embodiment. Common members of the present embodiment with the third embodiment of FIG. 12 are represented by common reference numerals not to repeat their explanation or to simplify their explanation.

The device for measuring temperatures according to the present invention, which can incontiguously measure by the use of laser beams temperatures of a substrate to be measured, has a advantage that, in a semiconductor device fabrication process, a required treatment, such as heat treatments, ion implantation, etching, diffusion, deposition, etc. while monitoring temperatures.

To make a required treatment on a substrate to be measured, it is necessary that the substrate to be measured is placed in an atmosphere different from that in which the device for measuring temperatures of the present invention is placed. Accordingly as shown in FIG. 15, laser beams emitted by a semiconductor laser 1 are applied to a semiconductor substrate 6 through an optical window 11a, and transmitted light by the semiconductor substrate 6 is incident on a photo receptor 7 through an optical window 11b.

The present embodiment solves disadvantages involved in causing laser beams to pass the semiconductor substrate 4 through the optical window 11a and to exit through the optical window 11b.

The device for measuring temperatures according to the present embodiment applies laser beams to the semiconductor substrate 6 and utilizes the fact that intensities of the interfered light of the transmitted light by the semiconductor substrate 6 change with changes of a temperature of the semiconductor substrate 6 so as to measure temperatures of the semiconductor substrate. But hen laser beams enter and exit through the optical windows 11a, 11b, there is a risk that interference may occur due to light reflected inside each of the optical windows 11a, 11b and due to light reflected between the optical windows 11a, 11b in addition to light interference of the semiconductor substrate 6 itself.

There is a risk that light interference of the semiconductor substrate 6 itself may be affected by light interference of reflected light inside each of the optical windows 11a, 11b and between the optical windows 11a, 11b due to thermal expansion of the optical windows themselves 11a, 11b and thermal expansion of members, e.g., a chamber supporting the optical windows 11a, 11b, which may cause noises of the temperature measurement.

In view of this, in the device for measuring temperatures according to the present embodiment, both surfaces of the optical windows 11a, 11b are slanted to the optical axis of the laser beams so that no light interference of reflected light of the laser beams on both surfaces takes place. Accordingly reflected light of the laser beams on the inner surface of the optical window 11b is deflected, and even when the laser beams are reflected between the optical windows 11a, 11b, the reflected light follows an optical path h2 without causing no light interference thereof.

Even with the optical windows 11a, 11b tilted, transmitted light by the semiconductor substrate 6 follows an optical path h1 and is incident on the photo receptor 7 without failure.

Figure 16A:
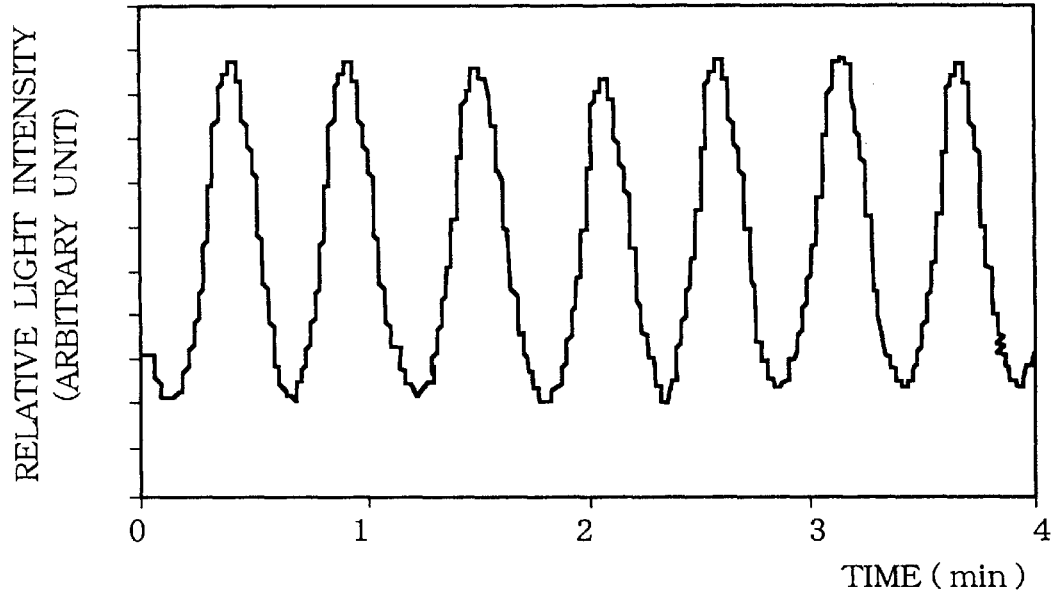
FIGS. 16A and B are graphs of relationships between interfered light intensities and time of the device for measuring temperatures according to a fifth embodiment of the present invention.

FIG. 16A shows a graph of relationships between time and interfered light intensities obtained by the device for measuring temperatures according to the present embodiment when a temperature is constantly raised.

Figure 16B:
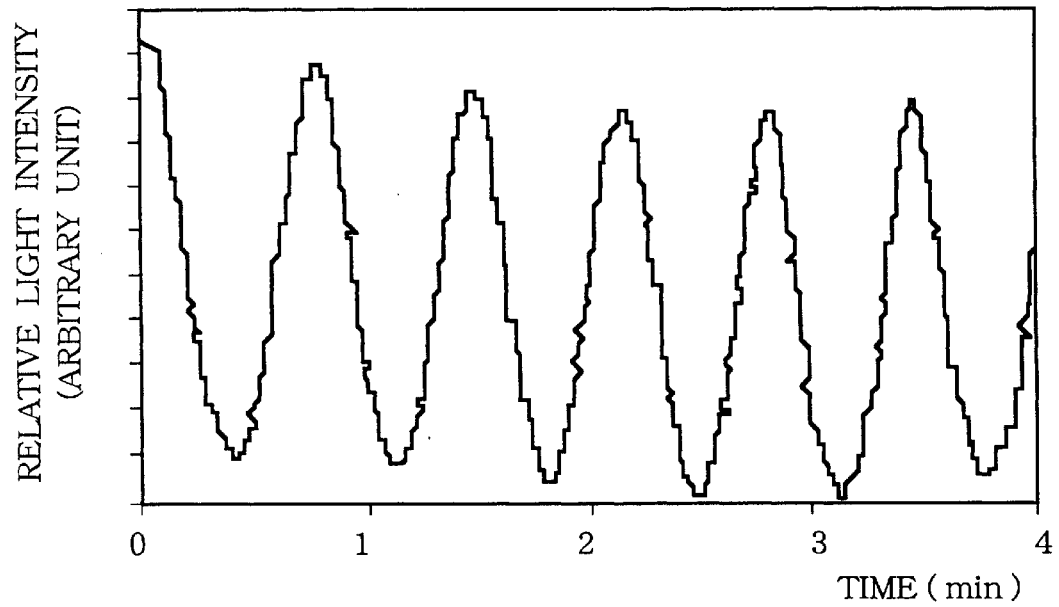

As shown in FIG. 16B, with light interference of reflected light between the optical windows 11a, 11b being present, troughs and crests of interfered light intensities vary. But as shown in FIG. 16A, it is found that in the device for measuring temperatures according to the present embodiment, troughs and crests of interfered light intensities do not vary but maintained at a constant value.

Thus according to the present embodiment, because no light interference of reflected light inside each of the optical windows and between the optical windows takes place, a level of interfered light intensity does not vary due to temperatures. The device for measuring temperatures can be of higher precision.

The optical windows may be coated by antireflection coating, thereby no light interference of reflected light inside each of the optical windows and between the optical windows takes place.

[Fifth Embodiment]

Figure 17:
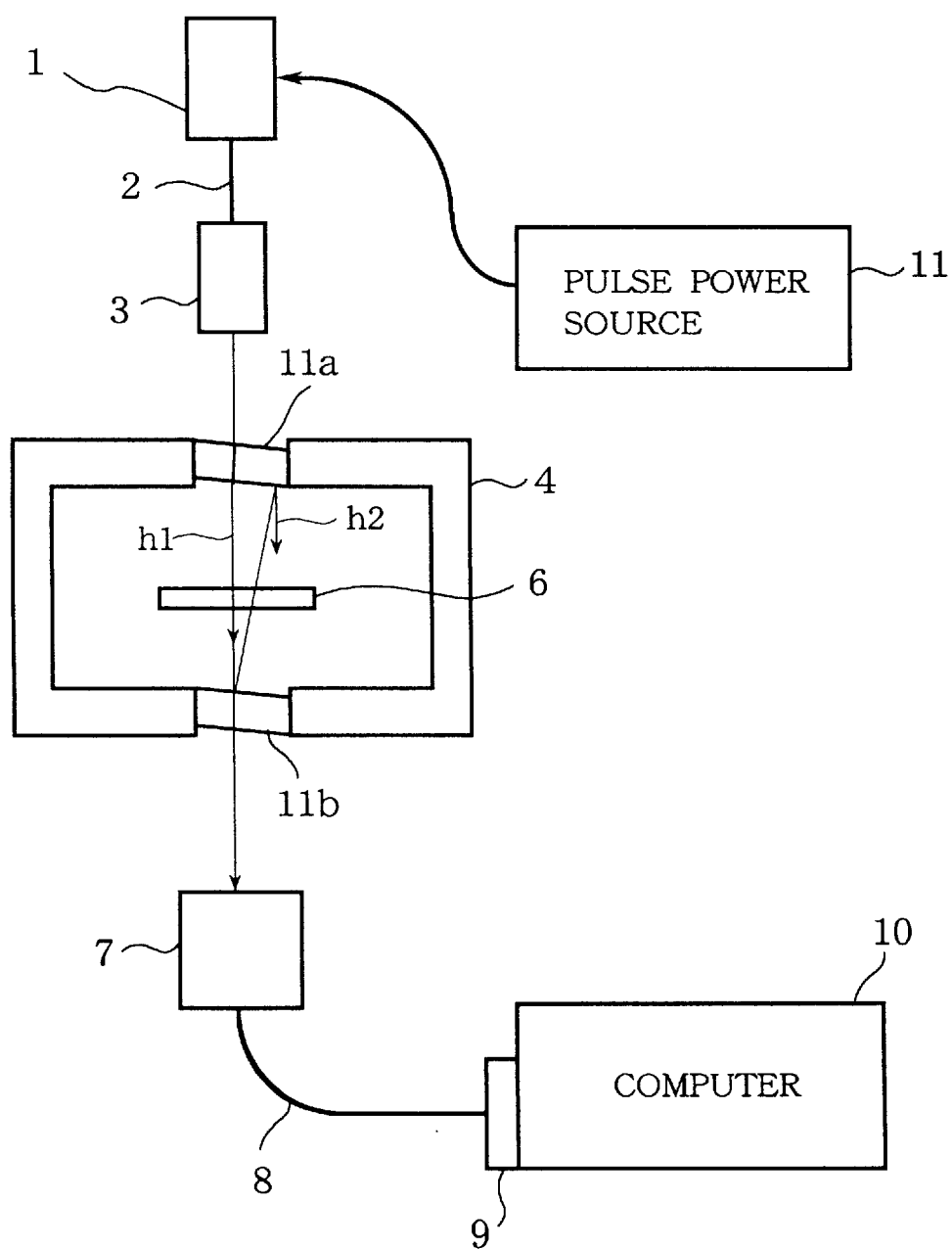
FIG. 17 is a block diagram of the device for measuring temperatures according to a fifth embodiment of the present invention.

The device for measuring temperatures according to a fifth embodiment of the present invention will be explained with reference to FIG. 17. Common member of the present embodiment with the device for measuring temperatures according to the fourth embodiment of FIG. 15 are represented by common reference numerals not to repeat their explanation or to simplify their explanation.

In the present embodiment, a semiconductor substrate 6 is placed in a chamber 4, and laser beams enter the chamber through an optical window 11a and exit through the optical window 11b. The optical windows 11a, 11b each have opposed surfaces parallel with each other and are mounted slanted in openings in the chamber 4, so that the surfaces are slanted to the optical axis of the laser beams.

Laser beams reflected from the inside surface of the optical window 11b is deflected, and even when reflected between the optical windows 11a, 11b, the reflected light follows an optical path h2 without causing no light interference.

Thus according to the present embodiment, because no light interference of reflected light between the optical windows takes place, a level of interfered light intensity does not vary due to temperatures. The device for measuring temperatures can be of higher precision.

[Sixth Embodiment]

Figure 18:
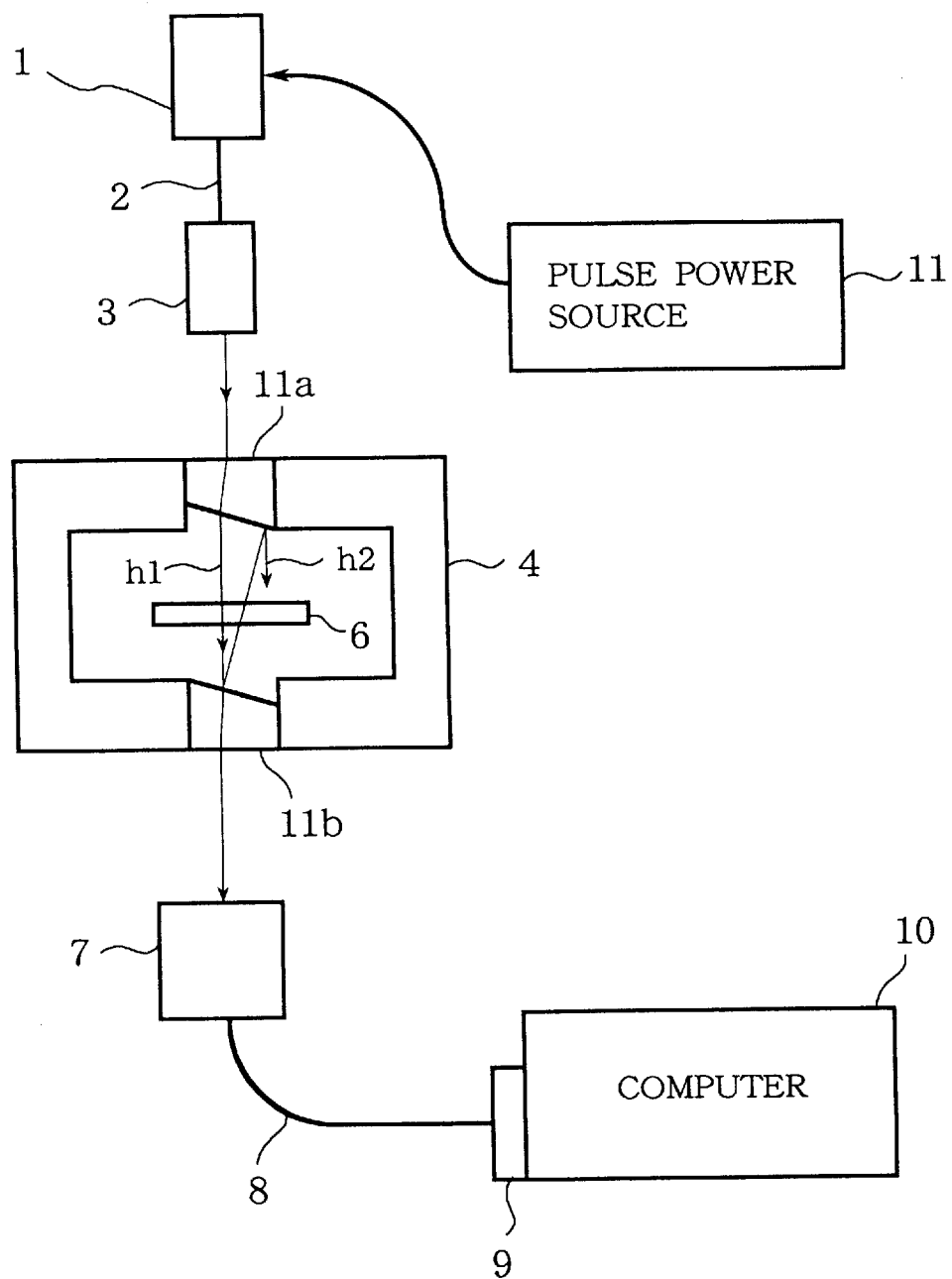
FIG. 18 is a block diagram of the device for measuring temperatures according to a sixth embodiment of the present invention.

The device for measuring temperatures according to a sixth embodiment will be explained with reference to FIG. 18. Common members of the present embodiment with the device for measuring temperatures according to the fifth embodiment of FIG. 17 are represented by common reference numerals not to repeat their explanation or simplify their explanation.

In the present embodiment, optical windows 11a, 11b the inside surfaces of which are slanted are used. Such optical windows 11a, 11b are disposed in openings in the chamber 4 with the inside surfaces slanted to the optical axis of laser beams and the outside surfaces being flush with the outer circumferential surface of the chamber 4.

Accordingly laser beams reflected from the inside surface of the optical window 11b is deflected. Laser beams reflected from the inside surface of the optical window 11b is deflected, and even when reflected between the optical windows 11a, 11b, the reflected light follows an optical path h2 without causing no light interference. In addition, because the outside surfaces of the optical windows 11a, 11b are flush with the outer circumferential surface of the chamber 4, the optical windows 11a, 11b can be mounted with high precision.

Thus according to the present embodiment, because no light interference of reflected light between the optical windows takes place, a level of interfered light intensity does not vary due to temperatures. The device for measuring temperatures can be of higher precision.

[Seventh Embodiment]

Figure 19:
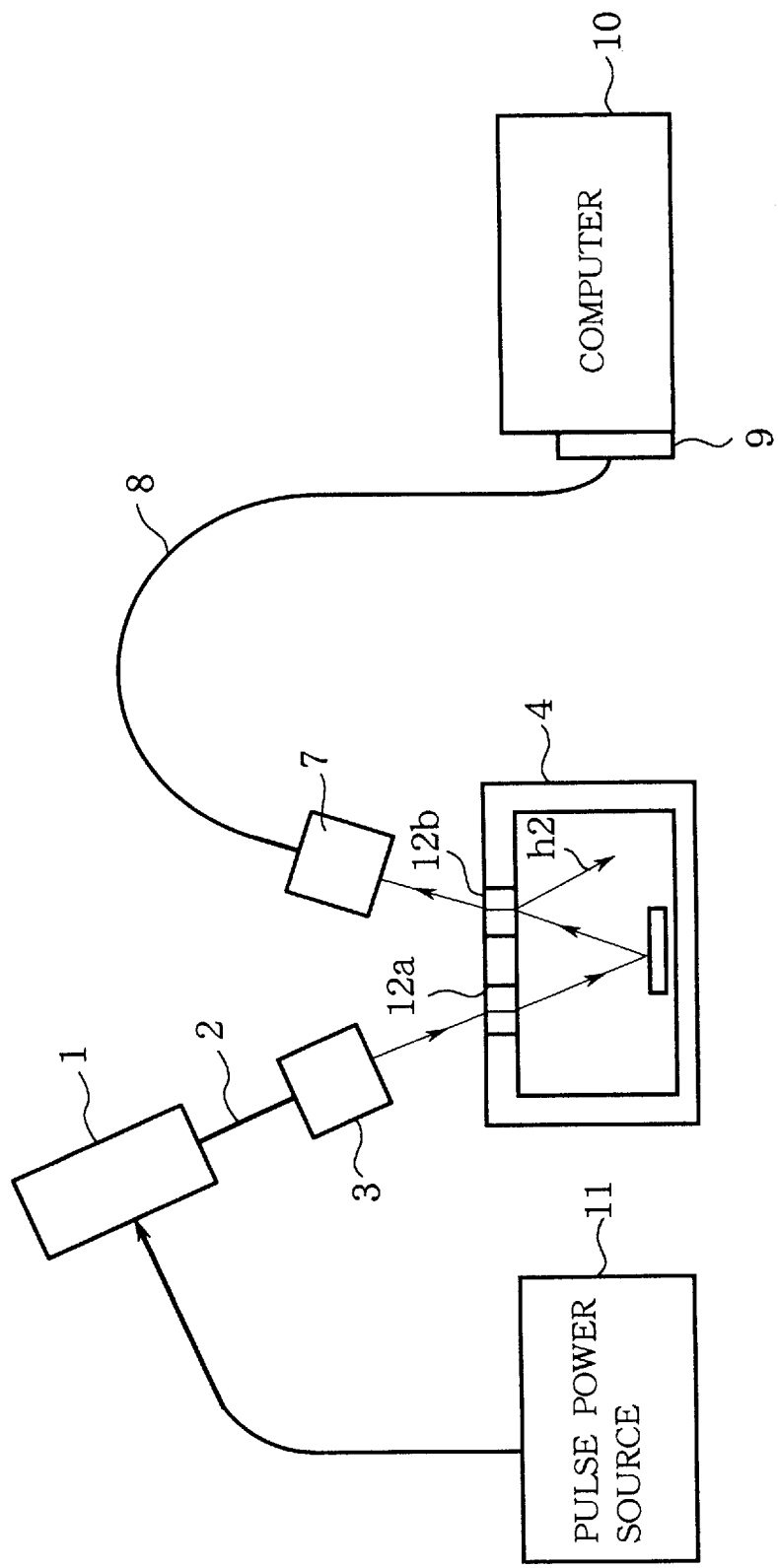
FIG. 19 is a block diagram of the device for measuring temperatures according to a seventh embodiment of the present invention.

Then the device for measuring temperatures according to a seventh embodiment of the present invention will be explained with reference to FIG. 19. Common reference numeral of the present embodiment with the device for measuring temperatures according to the fifth embodiment of FIG. 17 are represented by common reference numerals not to repeat their explanation or to simplify their explanation.

The device for measuring temperatures according to the third to the sixth embodiments uses transmitted light for the temperature measurement. But the device for measuring temperatures according to the present embodiment uses intensity changes of interfered light of reflected light on a semiconductor substrate 6 for the temperature measurement.

In the present embodiment, a semiconductor substrate 5 is placed in a chamber 4, and laser beams enter the chamber through an optical window 12a and exit through an optical window 12b. The optical windows 12a, 12b are disposed in openings formed in the upper surface of the chamber 4. The optical windows 12a, 12b are mounted so that one surfaces of thereof are flush with the outside circumferential surface of the chamber 4 with the other surfaces thereof slanted to the optical axis of laser beams.

Owing to this arrangement, laser beams reflected from the inside surface of the optical window 12b deflect, so that light interference of reflected light between the optical windows 12a, 12b via the semiconductor substrate 6 does not occur.

Thus according to the present embodiment, because no light interference of reflected light between the optical windows takes place, a level of interfered light intensity does not vary due to temperatures. The device for measuring temperatures can be of higher precision.

[Eighth Embodiment]

Figure 20:
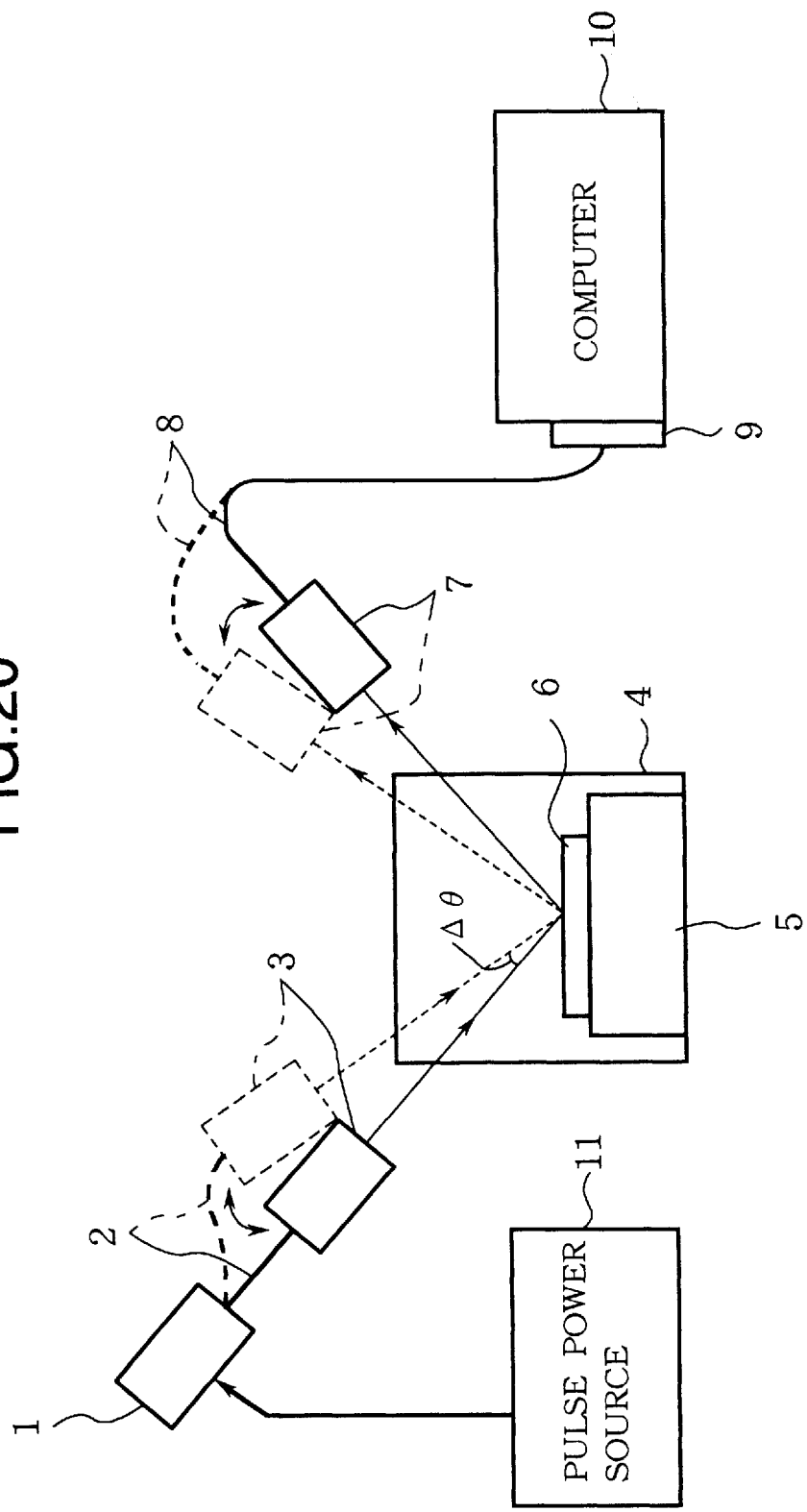
FIG. 20 is a block diagram of the device for measuring temperatures according to an eighth embodiment of the present invention.
Figure 21:
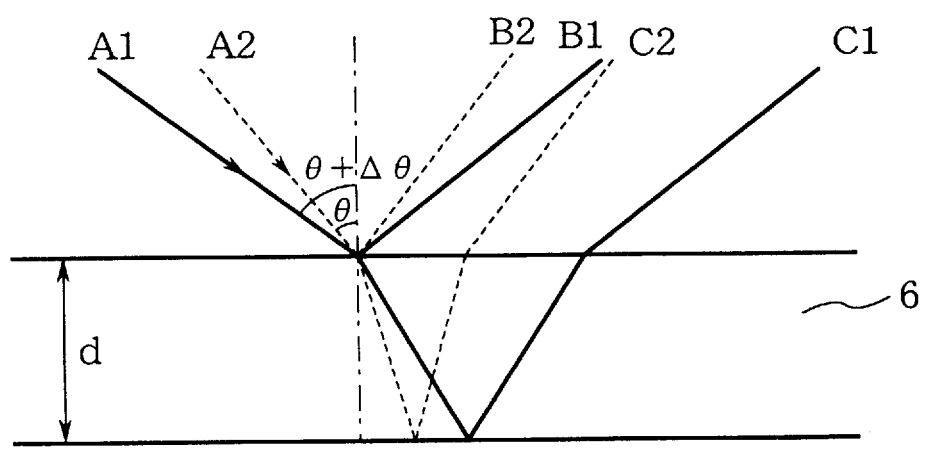
FIG. 21 is a view explaining a measuring principle of the device for measuring temperatures according to the eighth embodiment of the present invention.
Figure 22:
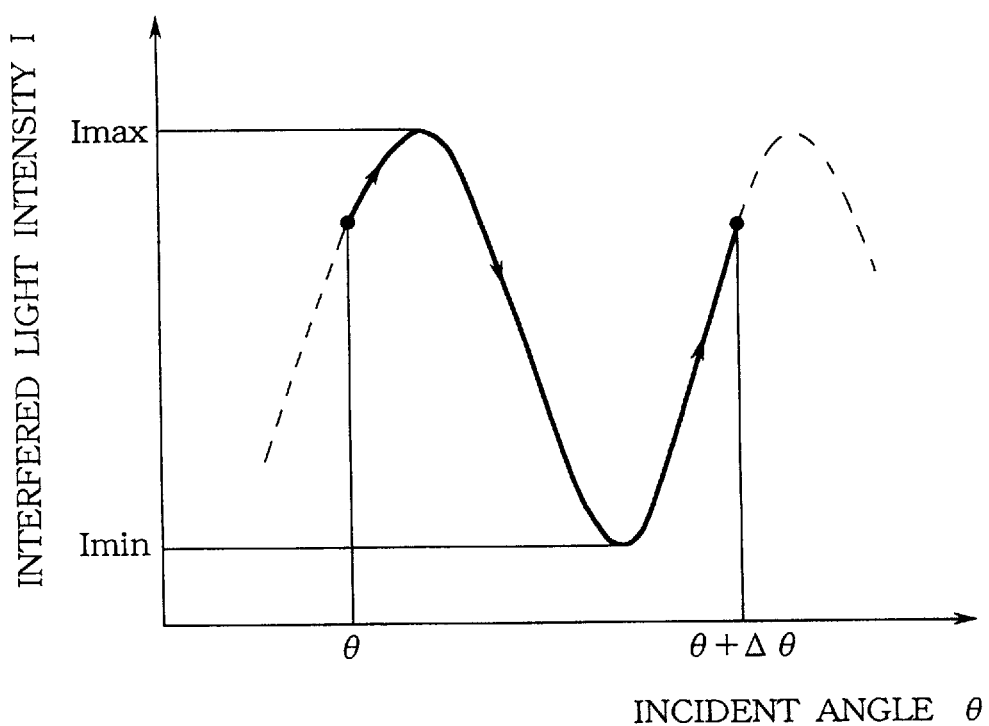
FIG. 22 is a graph of relationships between interfered light intensities and incident angles of the device for measuring temperatures according to the eighth embodiment of the present invention.

The device for measuring temperatures according to an eight embodiment of the present invention will be explained with reference to FIGS. 20 to 23. FIG. 20 shows a block diagram of the device for measuring temperatures according to the present embodiment. FIGS. 21 and 22 show the operational principle of the device for measuring temperatures according to the present embodiment. Common members of the present embodiment with the device for measuring temperatures of FIG. 1 according to the first embodiment are represented by common reference numerals not to repeat their explanation or to simplify their explanation.

As described above, in the conventional device for measuring temperatures, the temperature measurement cannot be substantially made until interfered light intensities change by at least one period and their maximum and minimum values are given. However, if maximum and minimum values of the interfered light intensities are given beforehand, the temperature measurement can be made immediately after staring of the measurement.

To solve such disadvantage, in the present embodiment, a maximum and a minimum value of interfered light intensities are predicted before a temperature measuring operation by incident angles of laser beams on the semiconductor substrate 6 are changed so that intensities of the interfered light shift by at least one period.

In FIG. 21, A1 and A2 represent incident light from a light source. B1 and B2 indicate reflected light on the surface of a semiconductor substrate 6. C1 and C2 denote reflected light on the back side of the semiconductor substrate 6. The reflected light B1, B2 on the surface of the semiconductor substrate, and the reflected light C1, C2 on the back side of the semiconductor substrate 6 interfere with each other corresponding to an optical path difference L.

An optical path difference L is expressed by the following formula when a thickness of the semiconductor substrate 6 is represented by d, a refractive index thereof is represented by n, and an incident angle is represented by θ, $$L=2d(n^2-\sin^2\theta)^{1/2}$$

Here when an incident angle of the incident light A1 is θ'(=θ+Δθ), and an incident angle of the incident light A2 is θ, an optical path difference L1, L2 of laser beams at the respective incident angles are $$L1=2d(n^2-\sin^2\theta')^{1/2}$$

$$L2=2d(n^2-\sin^2\theta)^{1/2}.$$

A difference ΔL between the two optical path differences L1, L2 is $$\Delta L = L2 - L1$$
$$= 2d\{(n^2-\sin^2\theta)^{1/2} - (n^2-\sin^2\theta')^{1/2}\}.$$

At least when this difference ΔL is shifted by ½ wavelength (λ/2) of measurement light, interference state is shifter by one period. Accordingly when the difference ΔL is shifted by λ/2 at maximum, a maximum and a minimum coherent intensity can be obtained, and a maximum and a minimum values of interfered light intensities with temperatures changed.

In the above formulas, ΔL is substituted by λ, and θ' is substituted by θ+Δθ, and the following formula is given.

$$\lambda/2 \leq 2d\{(n^2-\sin^2\theta)^{1/2}-(n^2-\sin^2(\theta+\Delta\theta))^{1/2}\}$$

This formula is rewritten in terms of Δθ, and $$\Delta\theta \geq \sin^{-1}[n^2-\{(n^2-\sin^2\theta)^{1/2}-\lambda/4d\}^2]^{1/2}-\theta$$

is obtained.

Thus by shifting the incident angle θ of laser beams by Δθ, a maximum and a minimum values of interfered light intensities can be known in advance.

The device for measuring temperatures according to the present embodiment can change incident angles of laser beams, based on the above-described principle. As shown in FIG. 20, a collimating optical unit 3 is turnable on a position of incidence of laser beams on the semiconductor substrate 6, so that incident angles f laser beams with respect to the semiconductor substrate can be changed.

A photo receptor 7 is also turnable on the position of incidence of laser beams on the semiconductor substrate 6 in synchronization with rotation of the collimating optical unit 3.

The method for measuring temperatures by the device for measuring temperatures according to the present embodiment will be explained.

First, before the start of a temperature measuring operation, laser beams emitted by the semiconductor laser 1 are applied to the semiconductor substrate 6 mounted on a heater 5. The laser beams are applied with the collimating optical unit 3 first located at the position indicated by the solid line. Then the collimating optical unit 3 is gradually turned without changing an incident position of the laser beams on the semiconductor substrate 6 to gradually increase an incident angle θ of the laser beams. The collimating optical unit 3 is turned until the incident angle of the laser beams has an increase Δθ. At this time, the photo receptor 7 is turned on the incident position of the laser beams so as to receive reflected light on the semiconductor substrate 6.

The collimating optical unit 3 is turned on the incident position of the laser beams to increase the incident angle θ of the laser beams. Then intensities I of interfered light received by the photo receptor 7 periodically increase and decrease as shown in FIG. 22. When the incident angle θ is increased by Δθ as described above, intensities of the interfered light increase and decrease over at least one period. A maximum value Imax and a minimum value Imin of the interfered light intensities can be known. The maximum and the minimum values Imax, Imin are stored. The processing up to here has been made before the start of the temperature measuring operation.

When temperatures of the semiconductor substrate 6 are measured, a position of the collimating optical unit 3 is fixed so that laser beams are incident at a required incident angle, and the photo receptor 7 is also fixed at a position where the photo receptor 7 can receive reflected light on the semiconductor substrate 6. Interfered light intensities are measured with the collimating optical unit 3 and the photo receptor 7 thus fixed. Because a maximum and a minimum values Imax, Imin of the interfered light have been already known, it can be predicted at which position on sine-like waves of a interfered light intensity curve a measured value will be located. That is, when the temperature measurement is started, a phase of a current measured value on a interfered light intensity curve can be seen.

On the other hand, because a temperature change amount $\Delta T(T)$ [°C.] corresponding to one-period change of the interfered light intensity curve is known, when a temperature of the semiconductor substrate 6 changes, and a measured value of the interfered light intensity changes, a phase shift amount of the interfered light intensity curve is obtained, with a result that a temperature change amount can be obtained. Thus, a temperature of the semiconductor substrate 6 can be measured immediately at the start of an operation of the interfered light intensity measurement, based on a temperature at the start of heating the semiconductor substrate and a temperature change amount.

Figure 23:
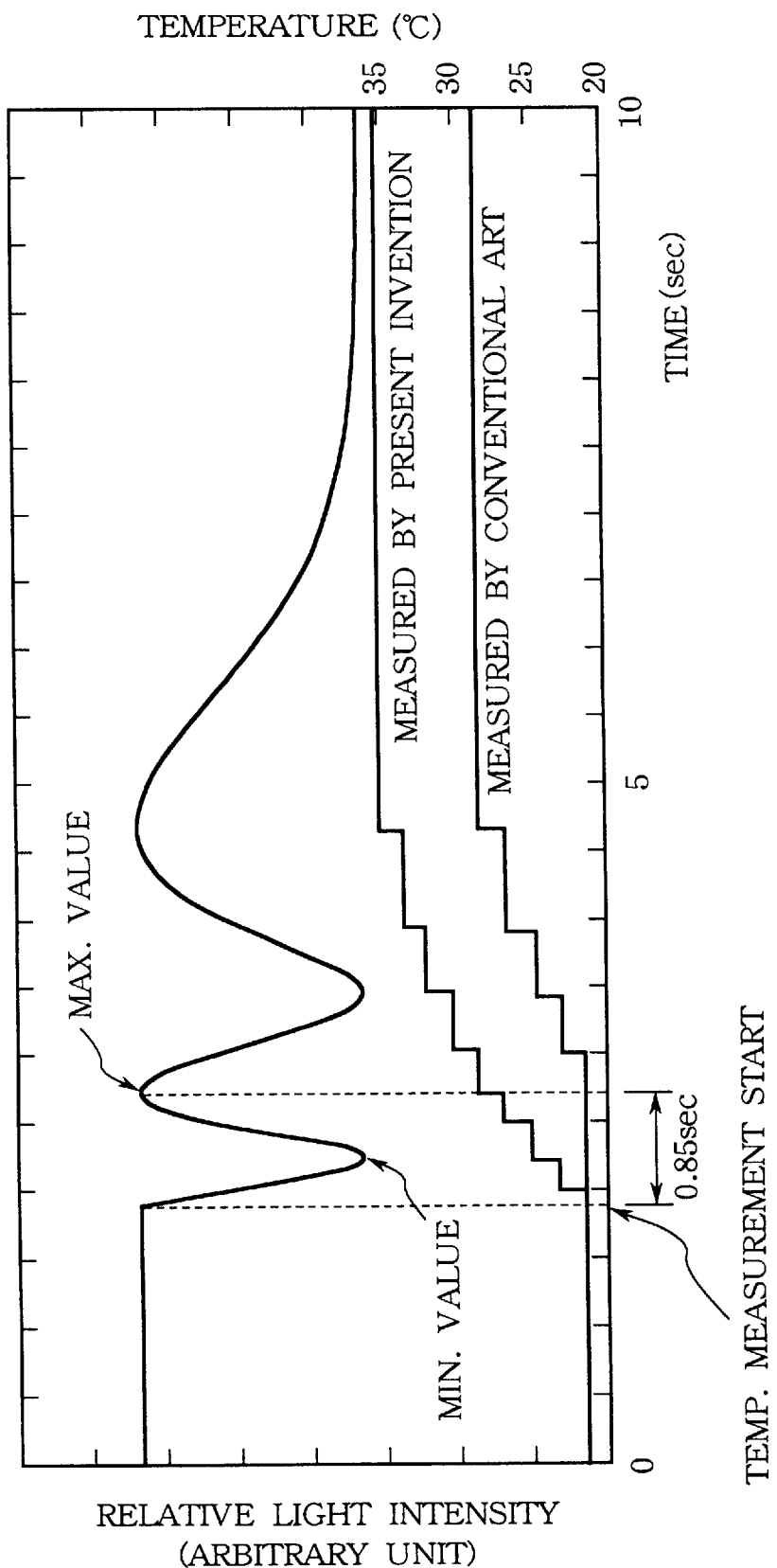
FIG. 23 is a graph of interfered light intensities and measured temperatures of the device for measuring temperatures according to the eighth embodiment of the present invention.

FIG. 23 shows a result of the temperature measurement according to the present invention with respect to interfered light intensity changes in comparison with results of that by the conventional method. In FIG. 23 a maximum and minimum values of interfered light intensities given by the temperature measurement according to the present embodiment. In the conventional measuring method, the temperature measurement cannot be made until a maximum and a minimum values of the interfered light intensities are given, and the temperature measurement is enabled 0.85 seconds after a start of the measurement. A temperature error accordingly occurs. In the method for measuring temperatures according to the present embodiment, because a maximum and a minimum values are measured in advance, temperature changes can be measured simultaneously with the start of a temperature measuring operation.

Thus according to the present embodiment, temperatures can be measured immediately at the start of a interfered light intensity measuring operation without waiting for temperature changes until a maximum and a minimum interfered light intensities are obtained.

Figure 24:
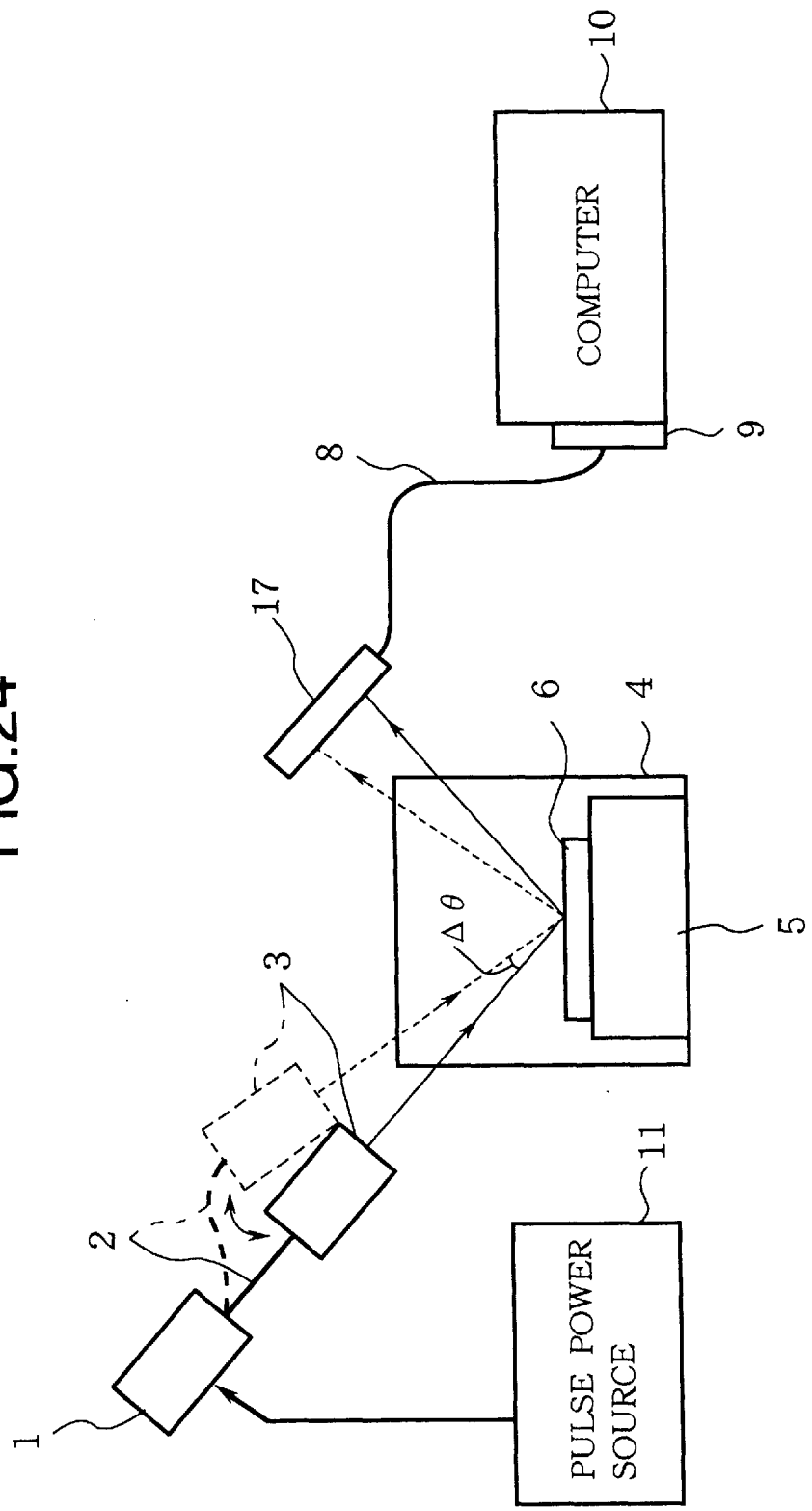
FIG. 24 is a block diagram of the device for measuring temperatures according to the eighth embodiment of the present invention.

In the device for measuring temperatures shown in FIG. 20, the photo receptor 7 is displaced corresponding to displacements of the collimating optical unit 3. As shown in FIG. 24, the photo receptor 7 whose photo receiving range is narrow may be substituted with a diode array 17 having a wide photo receiving range, which makes the displacement of the photo receptor unit unnecessary.

Variations of the device for measuring temperatures according to the present embodiment will be explained with reference to FIGS. 25 to 27. For simplifying explanation of the variations, FIGS. 25 to 27 show only irradiation systems for applying laser beams and light receiving systems.

Figure 25A:
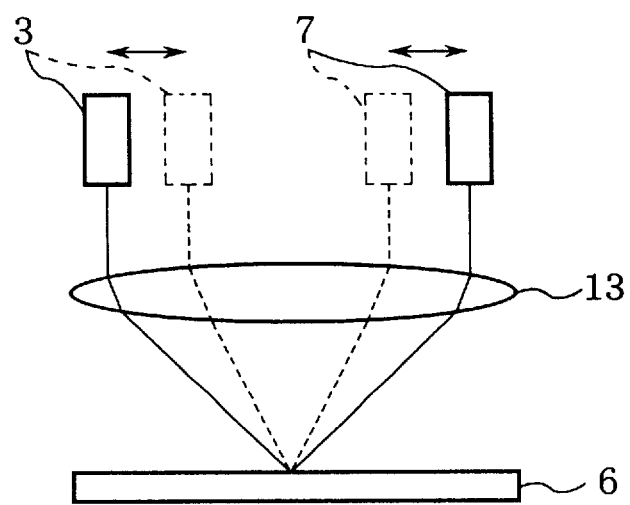
FIGS. 25A and B are diagrams of a first variation of the device for measuring temperatures according to the eighth embodiment of the present invention.

A first variation of the device for measuring temperatures according to the present embodiment is shown in FIGS. 25A and B.

In the present variation, a convex lens 13 whose optical axis is vertical is disposed above a semiconductor substrate 6, an object to be measured. The convex lens 13 is so arranged that the focus of the convex lens 13 is in alignment with a measured point of the semiconductor substrate 6, so that irradiation light and the reflected light are via the convex lens 13. An irradiation system is disposed on the left of the convex lens 13, and the light receiving system is disposed on the right of the convex lens 13.

In the device for measuring temperatures of FIG. 25A, a collimation optical unit 3 is disposed upper left of the convex lens 13, and the photo receptor 7 is disposed on the right of the convex lens 13. When a laser beam is emitted from the collimating optical unit 3 in the direction of the optical axis of the convex lens 13, the laser beam is refracted by the convex lens 13 to be incident on the measured point of the semiconductor substrate 6. The reflected light on the semiconductor substrate 6 is refracted in the optical axial direction by the convex lens 13 to be received by the photo receiver 7.

The collimating optical unit 3 is horizontally displaced left and right, whereby an incident angle with respect to a measured point of the semiconductor substrate 6 can be changed. At this time, the photo receptor 7 is also displaced horizontally in synchronization with the collimating optical unit 3.

Figure 25B:
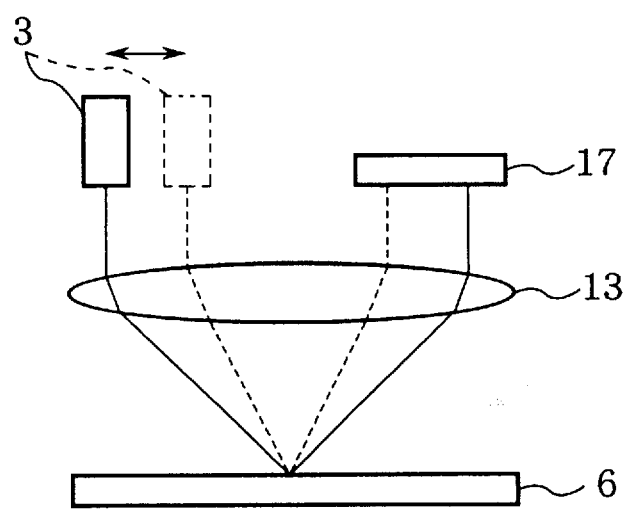

In the device for measuring temperatures shown in FIG. 25B, a diode array 17 with a wide photo receiving range is used in place of the photo receptor 7 with a narrow light receiving range, and in this case a position of the light receiving system should not be changed.

Figure 26A:
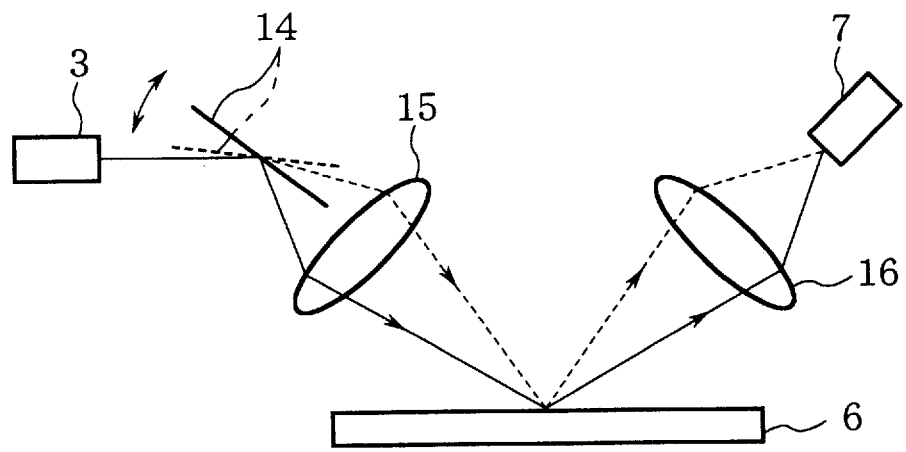
FIGS. 26A and B are diagrams of a second variation of the device for measuring temperatures according to the eighth embodiment of the present invention.
Figure 26B:
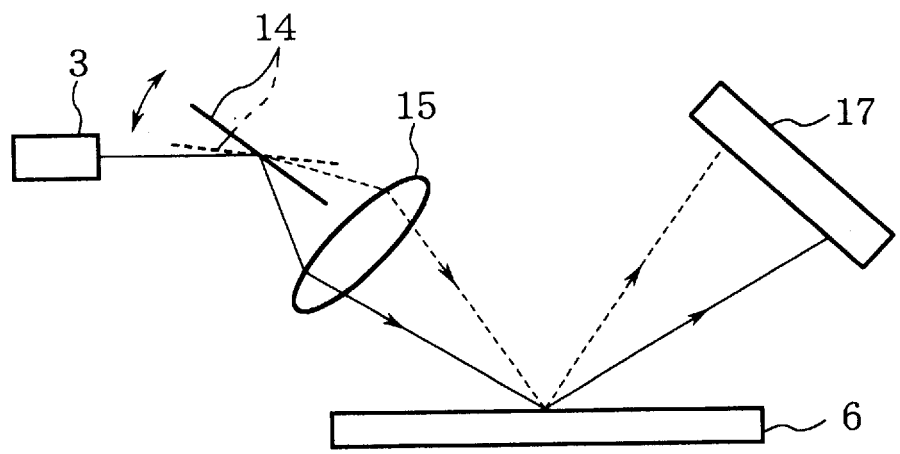

A second variation of the device for measuring temperatures according to the present embodiment is shown in FIGS. 26A and B.

The present variation additionally includes a mirror 14 and a convex lens 15 in the irradiation system, and a convex lens 16 in the photo receiving system. The mirror 14 is rotary and is arranged so that laser beams from the collimating optical unit 3 are applied to the rotary shaft thereof. The convex lens 15 selects a focal distance and a location so that reflected light on the mirror 14 is always incident on a measured point of a semiconductor substrate 6. The convex lens 16 selects a focal distance and a location so that even with different incident angles, reflected light on the semiconductor substrate is always received by the photo receptor 7.

In the device for measuring temperatures of FIG. 26A, laser beams from the collimating optical unit 3 are reflected from the mirror 14 and refracted by the convex lens 16 to be received by the photo receptor 7.

The mirror 14 is rotated to thereby change an incident angle with respect to a measured point of the semiconductor substrate 6. At this time a reflection angle also changes, but the reflected light is refracted by the convex mirror 16 so as to always enter the photo receptor 7.

The device for measuring temperatures of FIG. (26), the photo receptor 7 with a narrow light receiving range uses a diode array 17 with a wide light receiving range, whereby a position of the photo receiving system should be not be changed.

Figure 27A:
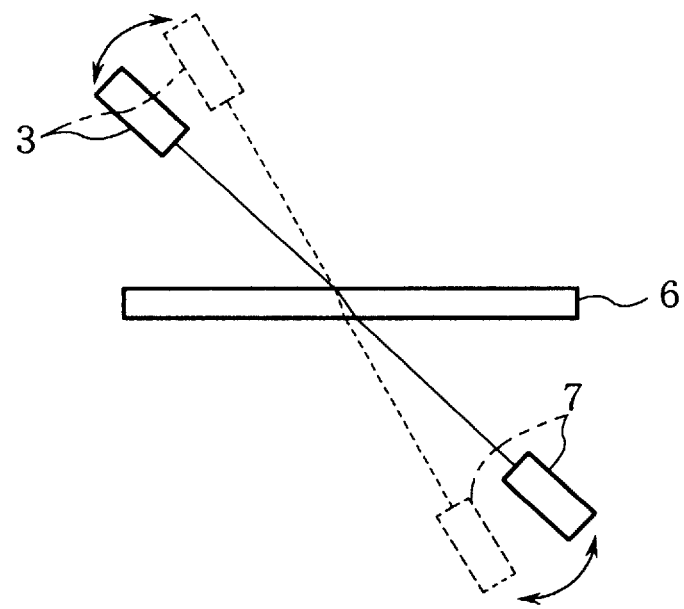
FIGS. 27A and B are diagrams of a third variation of the device for measuring temperatures according to the eighth embodiment of the present invention.

A third variation of the device for measuring temperatures according to the present embodiment is shown in FIG. 27A and B.

In the present variation, an irradiation system is disposed on one side of a semiconductor 6, and a photo receiving system is disposed on the other side. Laser beams emitted by the irradiation system are incident on the semiconductor substrate 6, and transmitted light by the semiconductor substrate 6 is received by a photo receiving system.

The device for measuring temperatures of FIG. 27A includes a collimating optical unit 3 of an irradiation system upper left of the semiconductor substrate 6, and a photo receptor 7 of a light receiving system is disposed lower right of the semiconductor substrate 6.

The collimating optical unit 3 rotates on a measured point of the semiconductor substrate 6, so that an incident angle of laser beams can be changed without an incident position of the laser beams on the semiconductor substrate 6. An ext angle of transmitted light changes in accordance with an incident angle, but the photo receptor 7 is rotary on the measured point of the semiconductor substrate, whereby transmitted light is always received by the photo receptor 7.

Figure 27B:
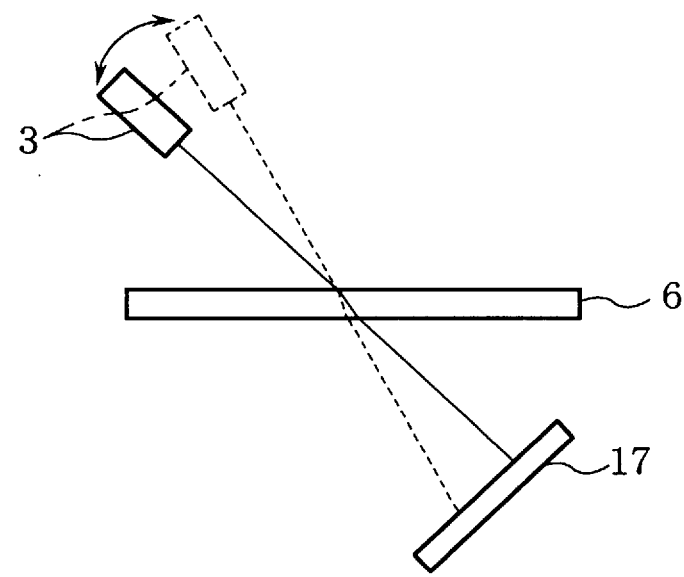

The device for measuring temperatures of FIG. 27B includes a diode array 17 with a wide photo receiving range in place of the photo receptor 7 with a narrow photo receiving range, whereby a position of the light receiving system should not be changed.

[Ninth Embodiment]

Figure 28:
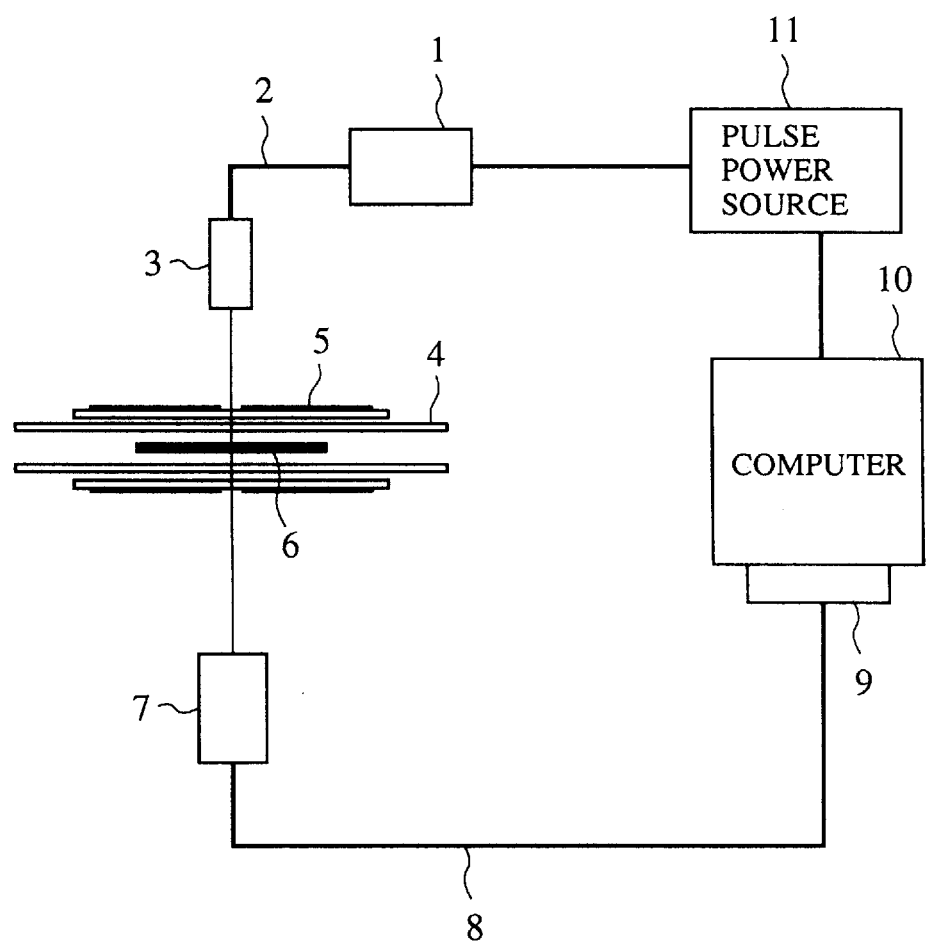
FIG. 28 is a block diagram of the device for measuring temperatures according to a ninth embodiment of the present invention.

A device for measuring temperatures according to a ninth embodiment of the present invention will be explained with reference to FIGS. 28 to 31. FIG. 28 shows a block diagram of the device for measuring temperatures according to the present embodiment. Common or similar members of the present embodiment with those of the device for measuring temperatures according to the first embodiment of FIG. 1 are presented by common reference numerals not to repeat or simplify their explanation.

In a case that an object to be measured is a semiconductor substrate 6 of silicon, Gabs or others, the semiconductor substrate 6 has the characteristic that as a temperature of the semiconductor substrate rises, an absorption end wavelength of light shifts to the side of long wavelengths. Due to this characteristic, as a temperature of the semiconductor substrate rises, and its absorption end wavelength becomes near to a wavelength of used laser beams, the laser beams are adversely absorbed by the semiconductor substrate 6, with results that the temperature measurement cannot be accurate.

To solve this disadvantage, the present embodiment changes intensities of laser beams to be applied to the semiconductor substrate, based on temperatures of the semiconductor substrate 6, so that even when the semiconductor substrate 6 has higher temperatures and high laser beam absorption, the temperature measurement can be accurate.

In the device for measuring temperatures according to the present embodiment, as shown in FIG. 28, the semiconductor substrate 6, an object to be measured is placed in a chamber 4 of quartz. A platinum circular heater 5 is disposed at the center of the chamber 4. The semiconductor substrate is heated by the platinum heater 5.

The semiconductor substrate 6 to be temperature-measured is an approximately 0.5 mm-thickness silicon substrate. The semiconductor substrate 6 may be, in addition to a silicon substrate, a Gabs substrate, InP substrate or other semiconductor substrate.

A pulse power source 11 is connected to a semiconductor laser 1. The pulse power source 11 supplies pulsed current of, e.g., 50 Hz to the semiconductor laser 1, and the semiconductor laser 1 emits pulsed laser beams. In the present embodiment, the semiconductor laser 1 is NDL5600 (wavelength: approximately 1310 nm; output: approximately 0.5 mW) by NEC.

A computer 10 is connected to the pulse power source 11. The computer 10 controls intensities of the pulsed current outputted by the pulse power source 11, so that intensities of the laser beams to be emitted by the semiconductor laser 1 are controlled.

Pulsed laser beams to be emitted by the semiconductor laser 1 are led to the collimating optical unit 3 through an optical fiber 2. The pulsed laser beams are made into parallel bundles of rays by the collimating optical unit 3 to be applied to the semiconductor substrate 6 in the chamber 4.

Transmitted light the semiconductor substrate 6 is received by the photo receptor 7. Received photo signals received by the photo receptor 7 are supplied to an A/D conversion unit 9 through a data signal line 8. The A/D conversion unit 9 converts the received photo signals into digital signals and supplies the digital signals to the computer 10.

The computer 10 computes intensity changes of interfered light of transmitted light, based on the received digital photo signals, and, based on computed results, decides measured temperatures and directions of temperature changes.

The computer 10 controls intensities of pulsed current supplied by the pulse power source 11, based on measured temperatures to control intensities of laser beams to be emitted by the semiconductor laser 1. In the present embodiment, as temperatures of the substrate, measured results given by the device for measuring temperatures are used.

Figure 29:
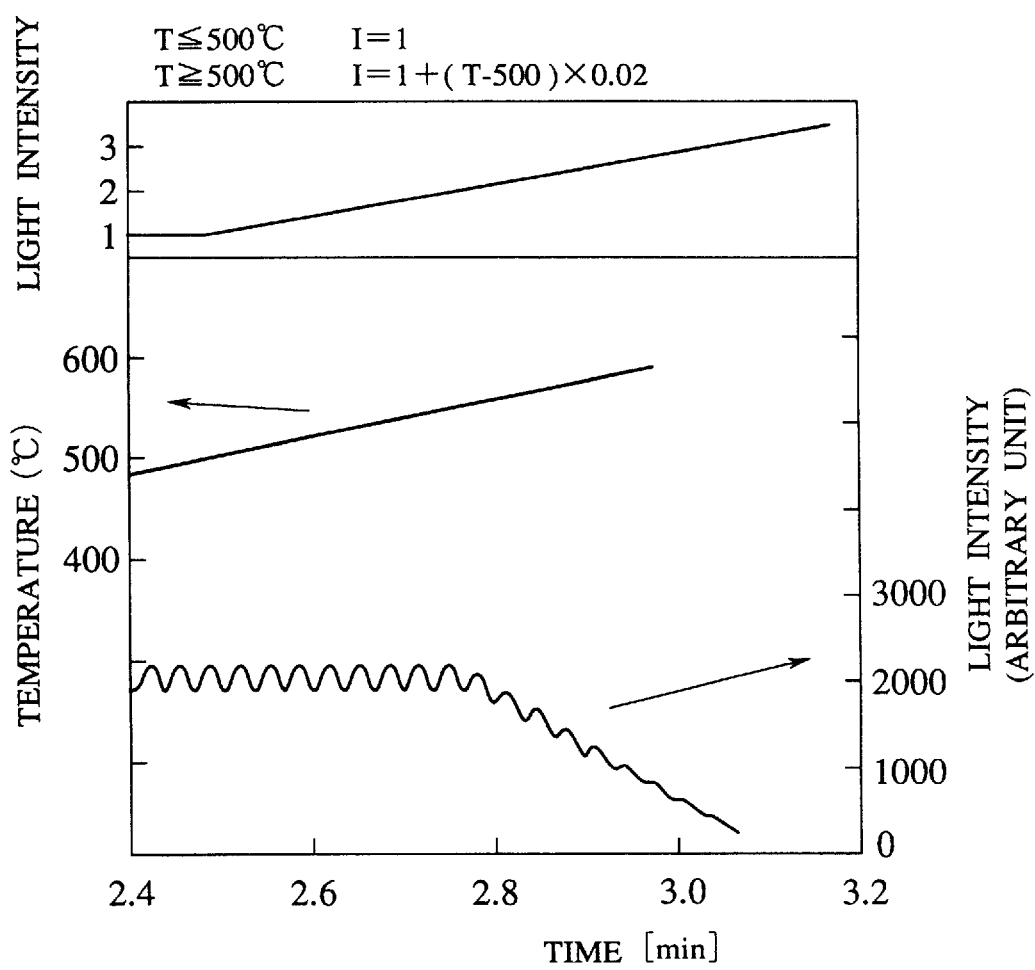
FIG. 29 is a graph of measured results of the device for measuring temperatures according to the ninth embodiment of the present invention.

The measured results given by the device for measuring temperatures according to the present embodiment are shown in FIG. 29.

In a case that the semiconductor substrate 6 is a silicon substrate, and laser beams of a 1310 nm-wavelength are used, when a temperature of the semiconductor substrate exceed approximately 500° C., the silicon substrate has higher absorption. So in the present embodiment, as shown in FIG. 29, intensities of laser beams to be emitted by the semiconductor laser 1 are changed. That is, as shown in FIG. 29, when a temperature T of the semiconductor substrate 6 is below 500° C., an intensity I of laser beams is constant, and when a temperature of the semiconductor substrate 6 exceeds 500° C., the pulse power source 11 is controlled so that intensities I of laser beams are increased in accordance with the following formula $$I=1+(T-500) \times 0.02.$$

As a result, even when the silicon substrate has a temperature exceeding 500° C. and higher absorption, because of increased intensities of laser beams, as shown in FIG. 29, intensities of interfered light transmitted by the silicon substrate do not decreased, and the temperature measurement can be accurate. Based on the measured results, temperatures of the silicon substrate up to approximately 600° C. can be measured.

Figure 30:
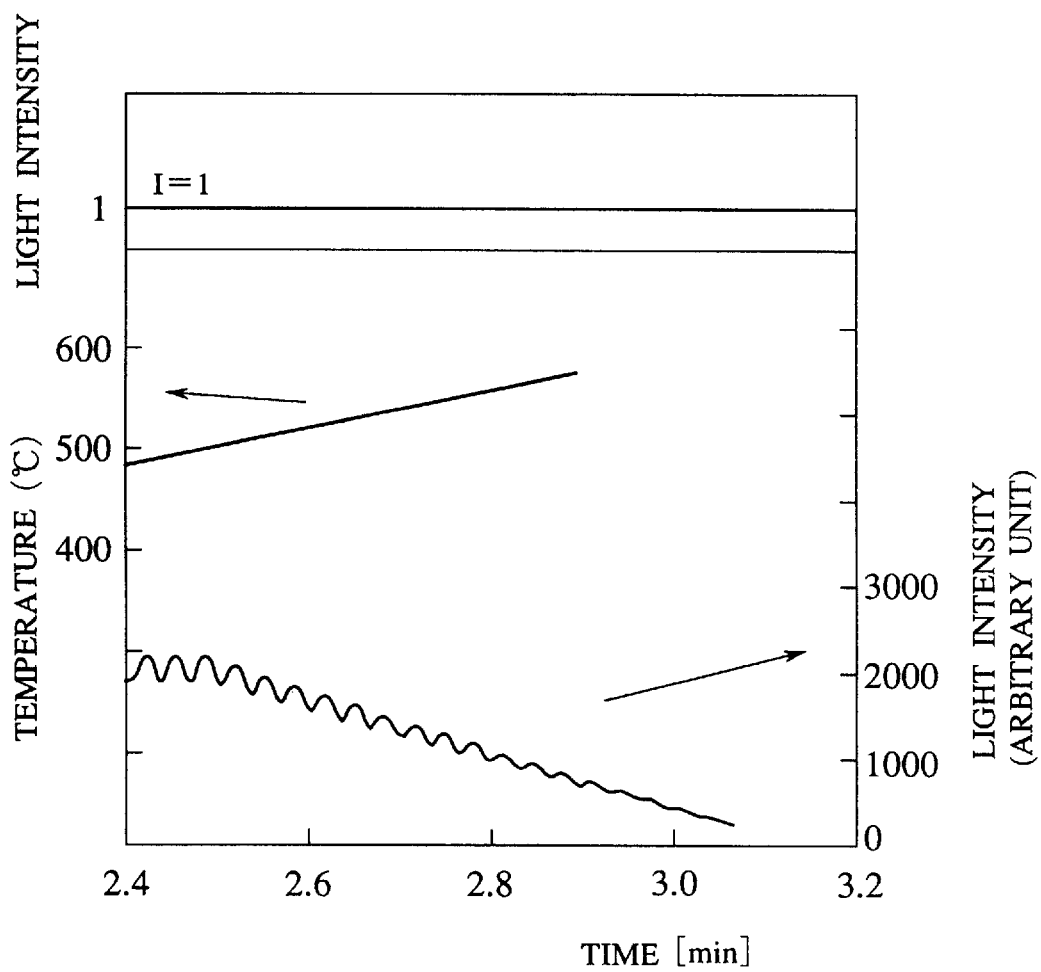
FIG. 30 is a graph of measured results of the conventional device for measuring temperatures.

FIG. 30 shows, as a control, measured results of a case that an intensity of laser beams are not changed. When a substrate temperature exceeds 500° C., an absorption of the silicon substrate increases, and intensities of interfered light transmitted by the silicon substrate decrease. As a result, a difference between a maximum and a minimum values of interfered light becomes small, and the temperature measurement is impossible around 570° C.

In the device for measuring temperatures of FIG. 28, substrate temperatures for controlling the pulse power source 11 are measured temperatures given by the device for measuring temperatures but may be measured results given by other means. Control temperatures used in heating control by the platinum heater may be used.

Figure 31:
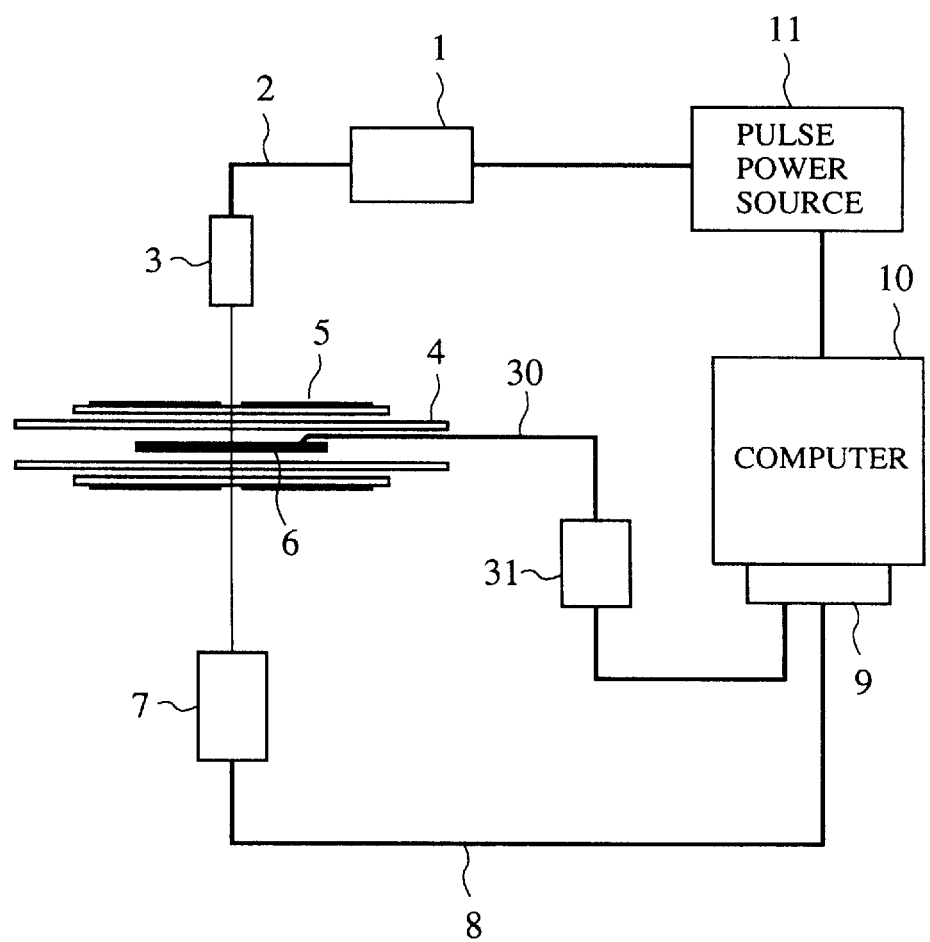
FIG. 31 is a block diagram of a variation of the device for measuring temperatures according to the ninth embodiment of the present invention.

FIG. 31 shows a device for measuring temperatures which uses substrate temperatures of the semiconductor substrate measured by a thermocouple for the control of the pulse power source 11. The same members of this device as the device for measuring temperatures of FIG. 28 are represented by the same reference numerals not to repeat their explanation.

The device for measuring temperatures of FIG. 31 includes a thermocouple 30 which measures substrate temperatures of a semiconductor substrate 6. Detected signals produced by the thermocouple 30 are converted into analog temperature measured signals by thermocouple measuring circuit 31. Temperature measured signals from the thermocouple measuring circuit 31 are converted to digital signals by an A/D conversion unit 9 and supplied to the computer 10.

The computer 10 controls intensities of pulsed current supplied by a pulse power source 11, based on substrate temperatures measured by thermocouple 30 and controls intensities of laser beams from a semiconductor laser 1.

Thus according to the present embodiment, because intensities of laser beams to be applied to a semiconductor substrate are increased as temperatures of the semiconductor substrate increases, the temperature measurement can be accurate even when the semiconductor substrate has high temperatures.

[Tenth Embodiment]

Figure 32:
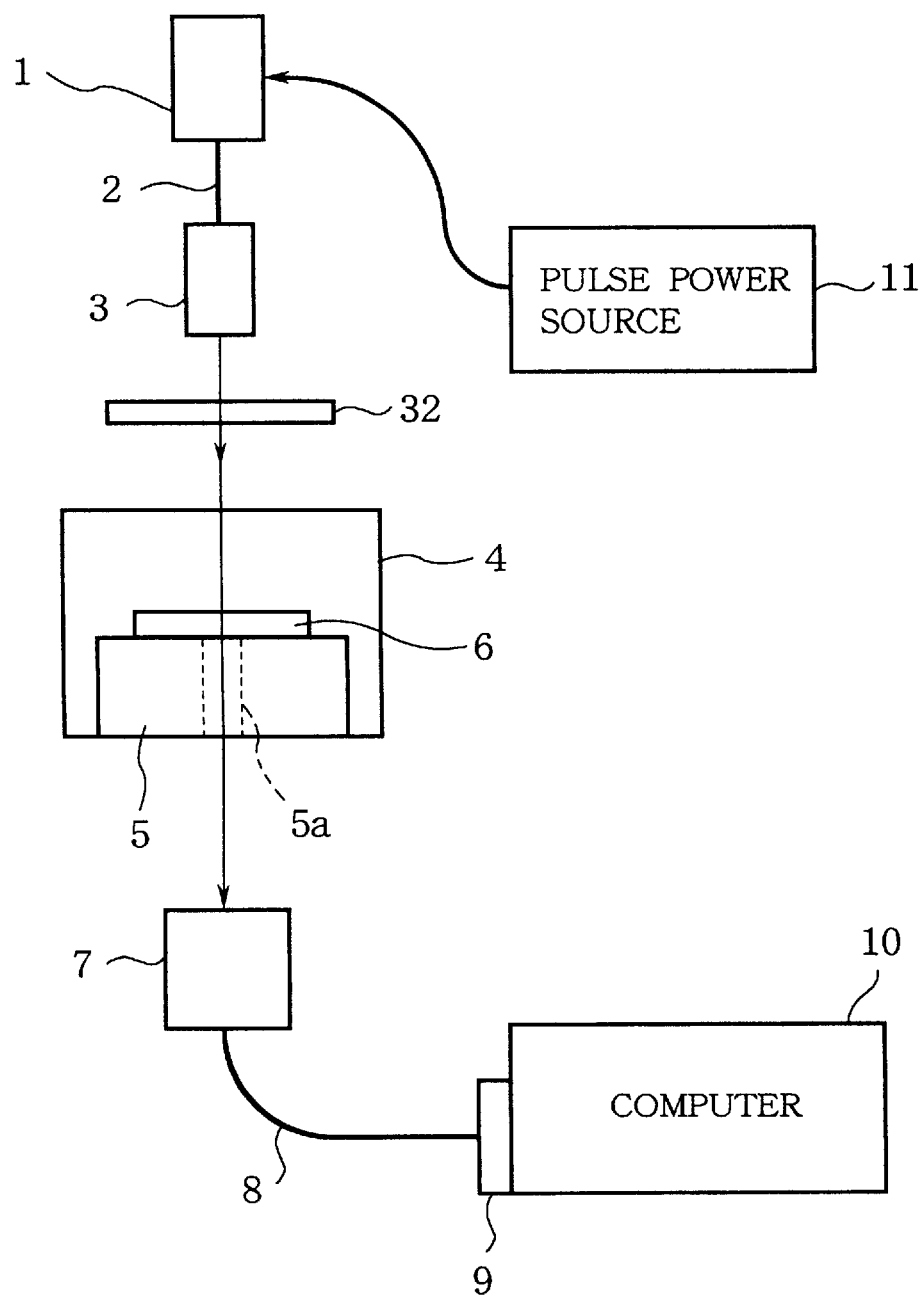
FIG. 32 is a block diagram of the device for measuring temperatures according to a tenth embodiment of the present invention.

The device for measuring temperatures according to a tenth embodiment of the present invention will be explained with reference to FIGS. 32 to 38. FIG. 32 shows a block diagram of the device for measuring temperatures according to the present embodiment. The same or similar members of the present embodiment are represented by the same reference numerals of the device for measuring temperatures according to the third embodiment not to repeat or simplify their explanation.

In the ninth embodiment, the computer 10 controls the pulse power source 11 to change intensities of laser beams to be emitted by the semiconductor laser 1. But it is not easy to control oscillation intensities of the semiconductor laser 1 stable, based on current values. In the present invention, oscillation intensities of the semiconductor laser 1 are kept constantly high, and only when a substrate temperature of the semiconductor substrate 6 is low, a constantly high intensity is attenuated.

An attenuation plate 32 is disposed between a collimating optical unit 3 and a chamber 4, so that pulsed laser beams made by the collimating optical unit 3 into parallel bundles of rays are attenuated to be applied to the semiconductor substrate 6 in the chamber 4. In the present embodiment, attenuation plates 32 with a plurality of different attenuation degrees are prepared, and the attenuation plates 32 can be automatically replaced by control of the computer 10. A mechanism for the displacement of the attenuation plates 32 is not shown.

Pulsed laser beams emitted by the semiconductor laser 1 are led to the collimating optical unit 3 through the optical fiber 2. The pulsed laser beams are made by the collimating optical unit 3 into parallel bundles of rays, and attenuated by the attenuation plate 32 to be applied to the semiconductor substrate 6 in the chamber 4.

Transmitted light by the semiconductor substrate 6 are received by a photo receptor 7. Photo signals received by the photo receptor 7 are supplied to an A/D conversion unit 9 through a data signal line 8. The A/D conversion unit 9 converts the received photo signals to digital signals, and outputs the digital signals to the computer 10. Based on the digital received photo signals, the computer calculates intensity changes of interfered light of the transmitted light, and, based on a computation result, decide measured temperatures and a direction of the temperature changes.

The computer 10 selects a kind of the attenuation plates 32. That is, while measured temperatures are low, an attenuation plate 32 with a higher attenuation degree is used, and as measured temperatures rise, the attenuation plate 32 is replaced sequentially by those 32 with lower attenuation degrees.

In the case that the semiconductor substrate 6 is a silicon substrate, and laser beams of a 1310 nm-wavelength are used, the silicon substrate has higher absorption as a temperature of the silicon substrate rises. In view of this, in the present embodiment, intensities of laser beams to be emitted by the semiconductor laser 1 are made so intense that temperatures of the silicon substrate above 600° C. can be measured, and when a substrate temperature is low, intensities of laser beams are attenuated by the attenuation plate 32. When a substrate temperature is below 500° C., an attenuation plate A with a 80% attenuation degree is used. When a substrate temperature is between 500° and 600° C., an attenuation plate B with a 60% attenuation degrees is used. When a substrate temperature is above 600° C., an attenuation plate C with a 40% attenuation degree is used. Thus, intensities of laser beams to be applied to the semiconductor substrate 6 are gradually changed.

Figure 33:
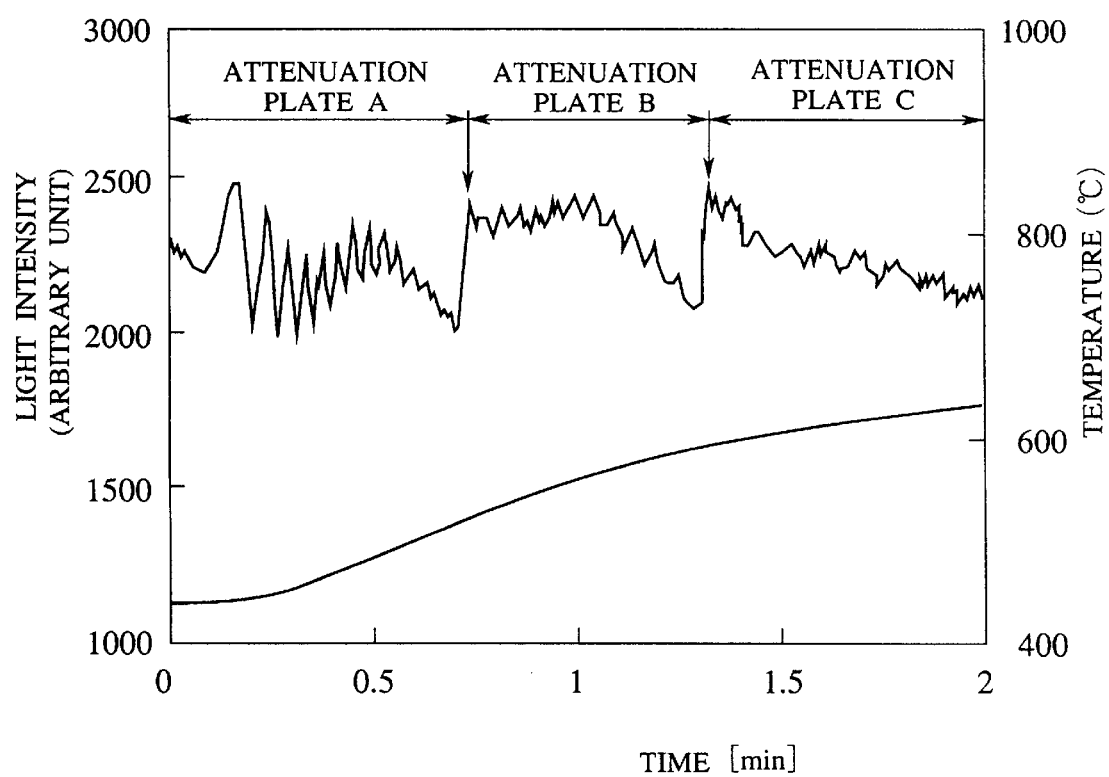
FIG. 33 is a graph of measured results of the device for measuring temperatures according to the tenth embodiment of the present invention.

Measured results given by the device for measuring temperatures according to the present embodiment are shown in FIG. 33.

When a measured temperature is below 500° C., laser beams attenuated by the attenuation plate A are applied to the semiconductor substrate 6. While measured temperature are low, interfered light of sufficient intensities can be obtained, but when measured temperatures are near 500° C., the silicon substrate has a higher absorption, and interfered light transmitted by the silicon substrate 6 lower the intensities. As a result, as shown in FIG. 33, a difference between a maximum and a minimum values of the interfered light is so small that the temperature measurement is impossible.

When measured temperatures are near 500° C., the attenuation plate 32 is replaced by the attenuation plate with a smaller attenuation degree, so that intensities of laser beams to be applied to the silicon substrate are risen. Even when the silicon substrate has higher absorption, interfered light of sufficient intensities can be obtained, and the temperature measurement can be set on. But when measured temperatures are near 600° C., the silicon substrate has higher absorption, and intensities of interfered light transmitted by the silicon substrate are lowered. As a result, as shown in FIG. 33, a difference between a maximum and a minimum values of interfered light is so small that the temperature measurement is impossible.

When measured temperatures are 600° C., the attenuation plate 32 is replaced by the attenuation plate C with a smaller attenuation degree, so that intensities of laser beams to be applied to the silicon substrate are increased, and even when the silicon substrate has higher absorption, interfered light of sufficient intensities can be obtained. The temperature measurement can be set on.

According to the measured results of FIG. 33, temperatures of the silicon substrate up to around 630° C. can be measured.

Figure 34:
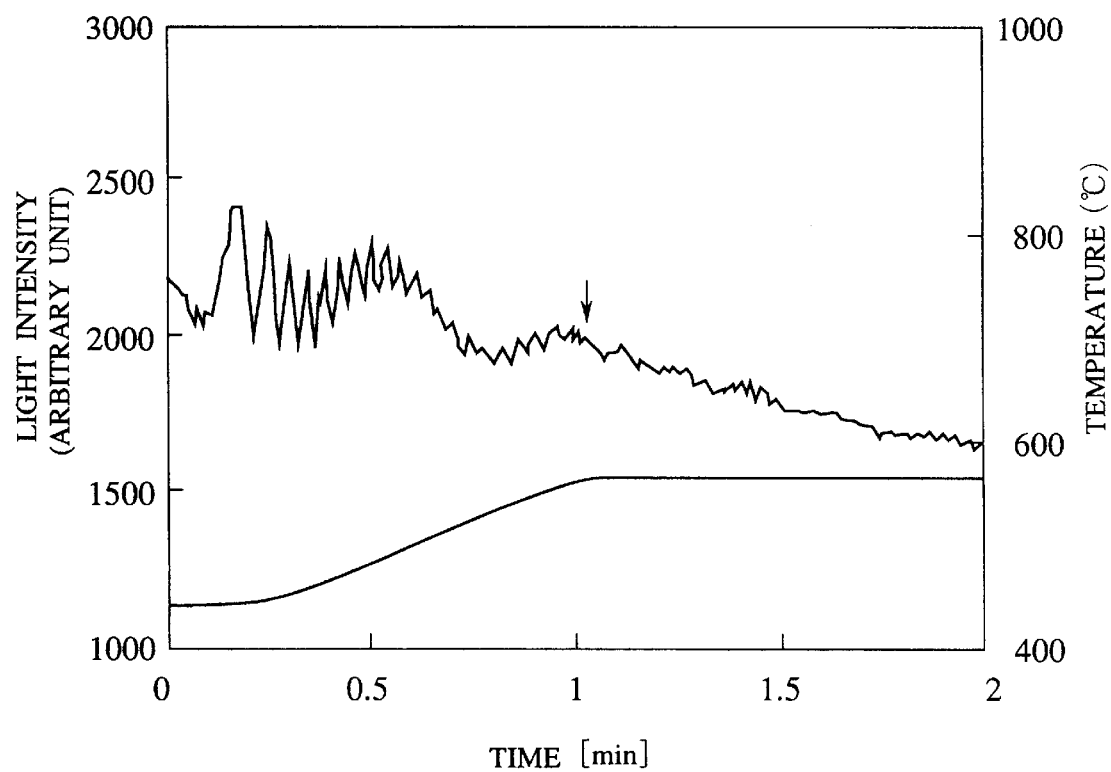
FIG. 34 is a graph of measured results of the conventional device for measuring temperatures.

FIG. 34 shows, as a control, measured results of a case that intensities of laser beams are not changed. When a substrate temperature exceeds 500° C., the silicon substrate has higher absorption, and intensities of interfered light transmitted by the silicon substrate are lowered. As a result, a difference between a maximum and minimum values of interfered light is so small that the temperature measurement is impossible around 570° C.

In the device for measuring temperatures of FIG. 32, as substrate temperatures for controlling the pulse power source 11, measured temperatures measured by the device for measuring temperatures are used. But measured results given by other means may be used, and control temperatures used in controlling heating by the heater 5 may be used.

Then variations of the device for measuring temperatures according to the present embodiment will be explained with reference to FIGS. 35 to 38.

Figure 35:
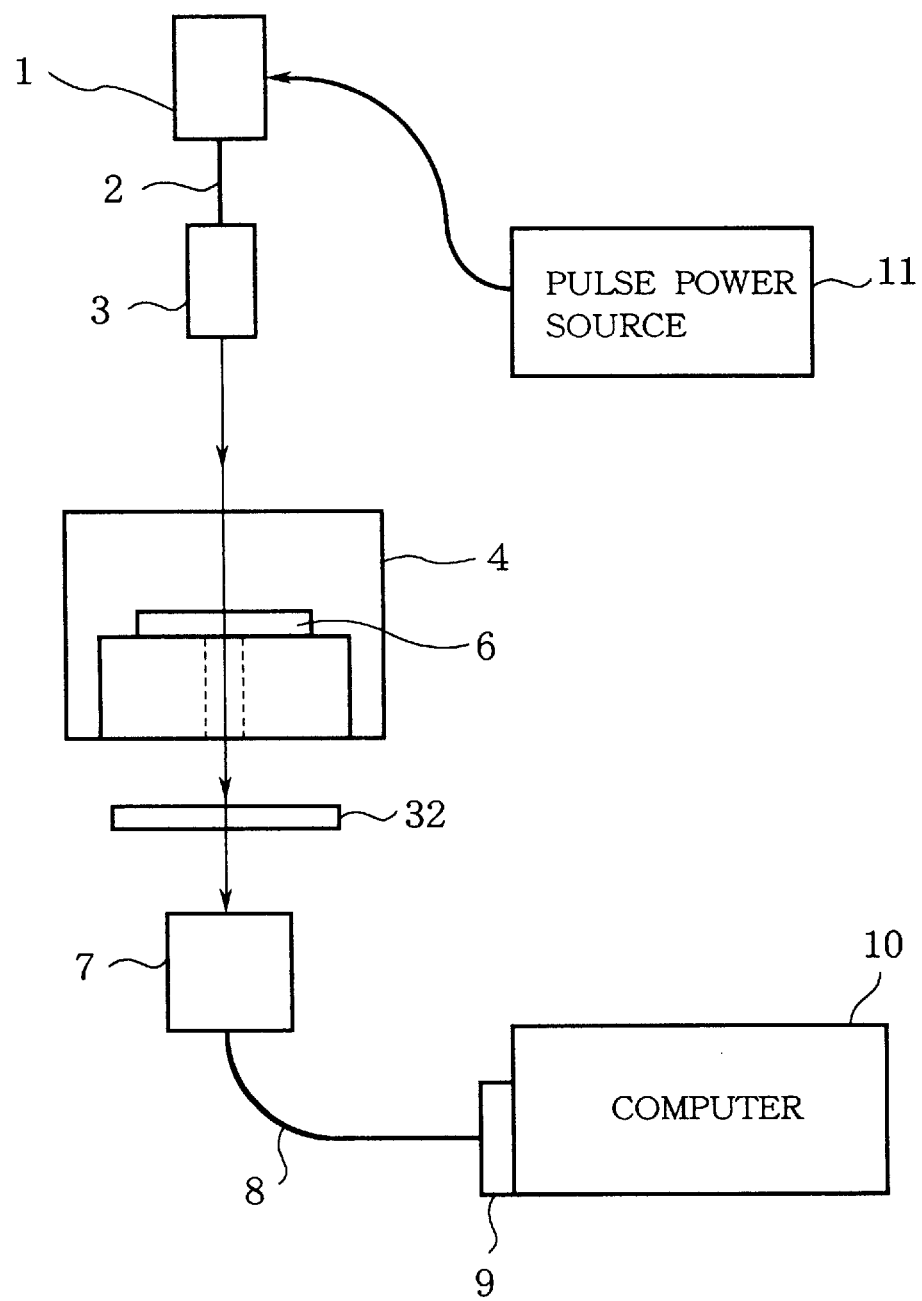
FIG. 35 is a block diagram of a first variation of the device for measuring temperatures according to the tenth embodiment of the present invention.

A first variation of the device for measuring temperatures according to the present embodiment is shown in FIG. 35.

An attenuation plate 3 is disposed between a chamber 4 and a photo receptor 7, so that interfered light transmitted by a semiconductor substrate 6 is attenuated to be received by the photo receptor 7. In the present variation as well, the attenuation plate 32 is provided by attenuation plates of a plurality of different attenuation degrees, and the attenuation plates 32 are automatically replaced by control of a computer 10.

Figure 36:
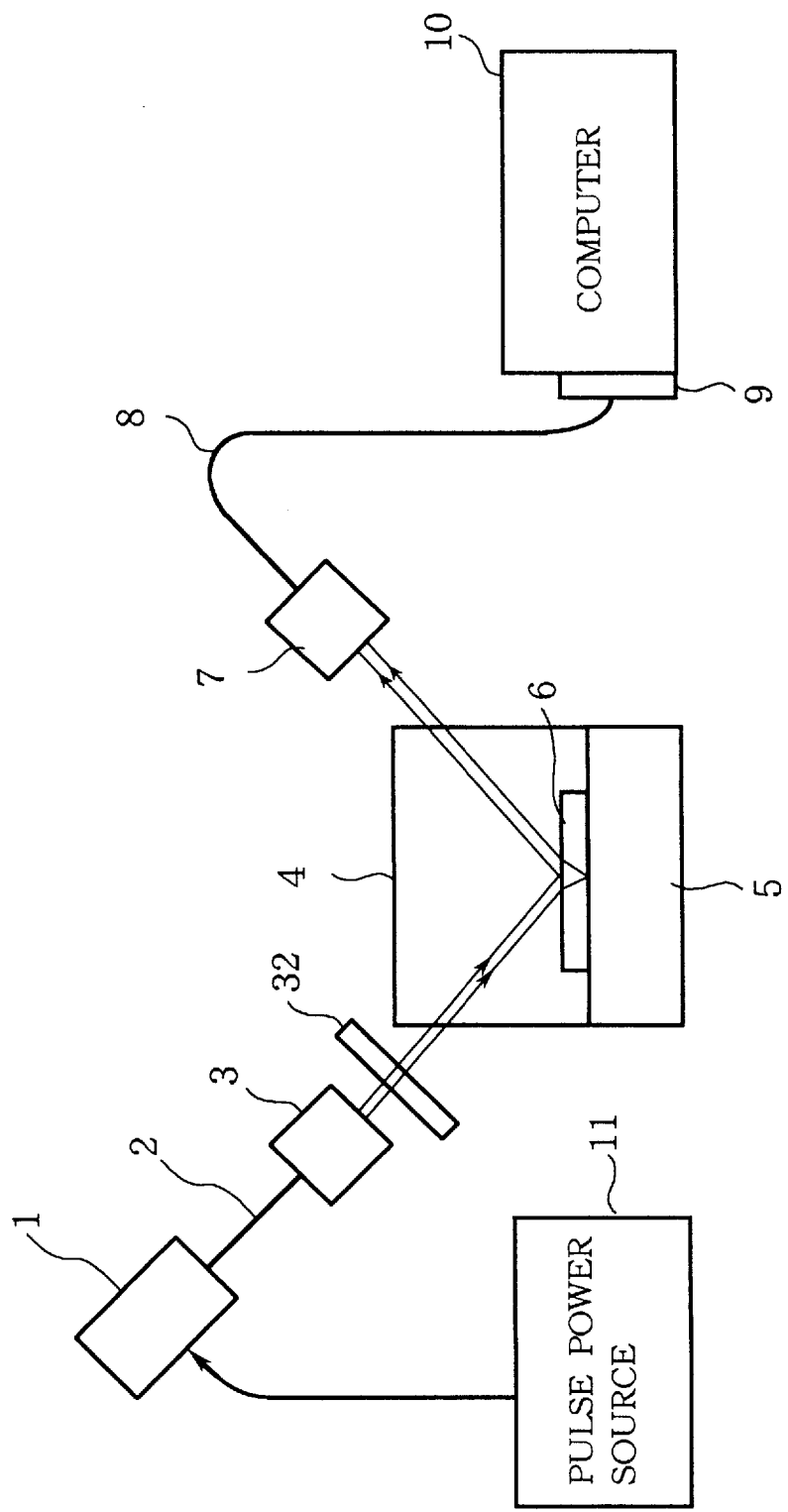
FIG. 36 is a block diagram of a second variation of the device for measuring temperatures according to the tenth embodiment of the present invention.

A second variation of the device for measuring temperatures according to the present embodiment is shown in FIG. 36.

The device for measuring temperatures according to the above-described embodiment measures temperatures by the use of transmitted light by the semiconductor substrate 6. In the device for measuring temperatures according to the present variation, the temperature measurement is conducted based on changes of intensities of interfered light of reflected light of a semiconductor substrate 6. In the case that the temperature measurement is conducted based on reflected light on the semiconductor substrate 6, reflected light on the bottom surface of the semiconductor substrate 6 is adversely absorbed by the semiconductor substrate 6 when a temperature of the semiconductor substrate 6 increases. The temperature measurement cannot be accurate.

In the present variation, an attenuation pate 32 is disposed between a collimating optical unit 3 and the semiconductor substrate 6, so that pulsed laser beams made by the collimating optical unit 3 into parallel bundles of rays are attenuated to be applied to the semiconductor substrate 6 in a chamber 4. In the present variation as well, the attenuation plate 32 is provided by attenuation plates with a plurality of different attenuation degrees, and the attenuation plates can be automatically replaced by control of a computer 10.

Figure 37:
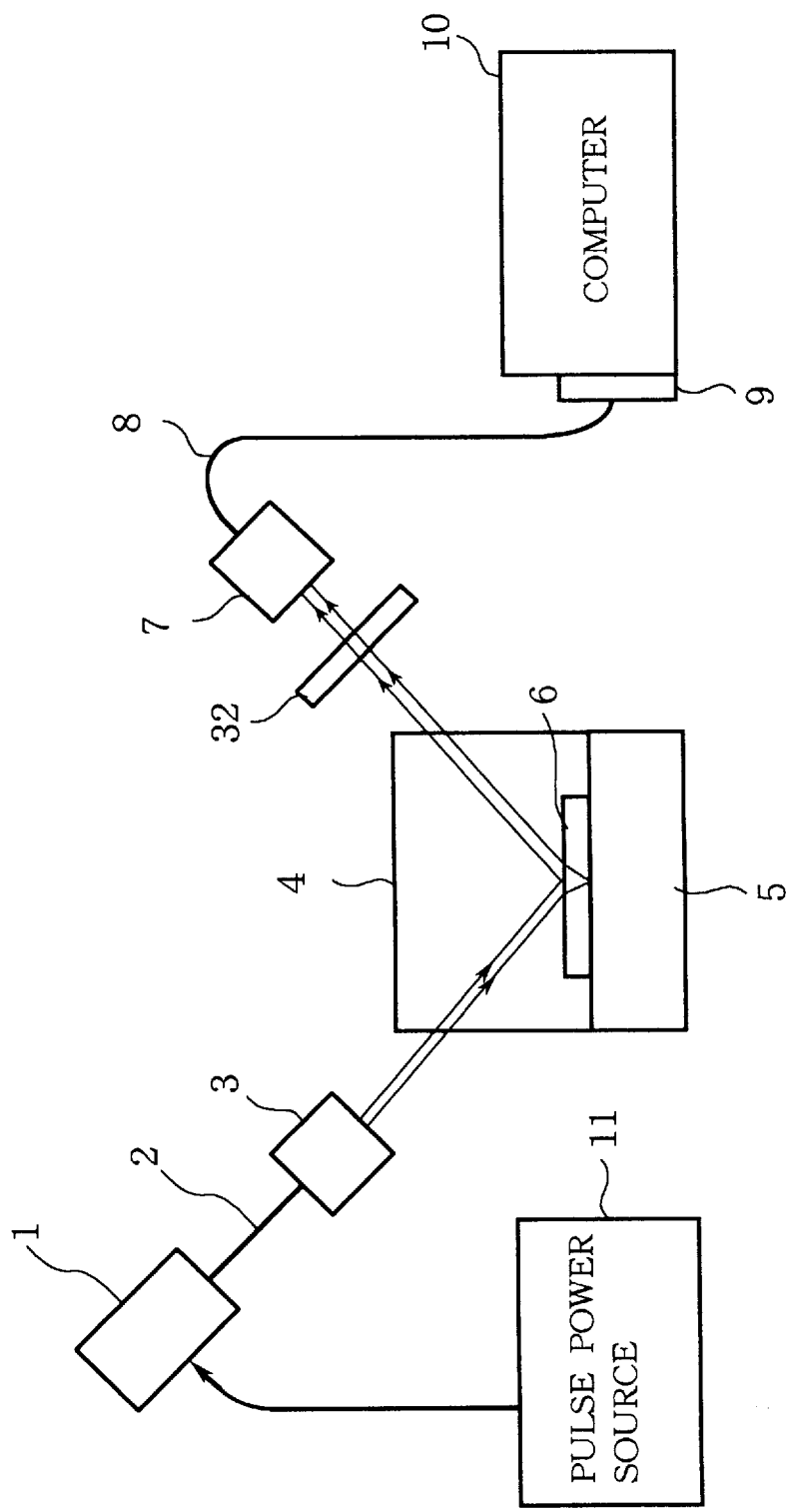
FIG. 37 is a block diagram of a third variation of the device for measuring temperatures according to the tenth embodiment of the present invention.

A third variation of the device for measuring temperatures according to the present embodiment is shown in FIG. 37.

In the present variation, an attenuation plate 32 is disposed between a semiconductor substrate 6 and a photo receptor 7, so that interfered light of reflected light on the semiconductor substrate 6 is attenuated to be received by the photo receptor 7. In the present variation as well, the attenuation plate 32 is provided by attenuation plates of a plurality of different attenuation degrees, and the attenuation plates can be automatically replaced by control of a computer 10.

Figure 38:
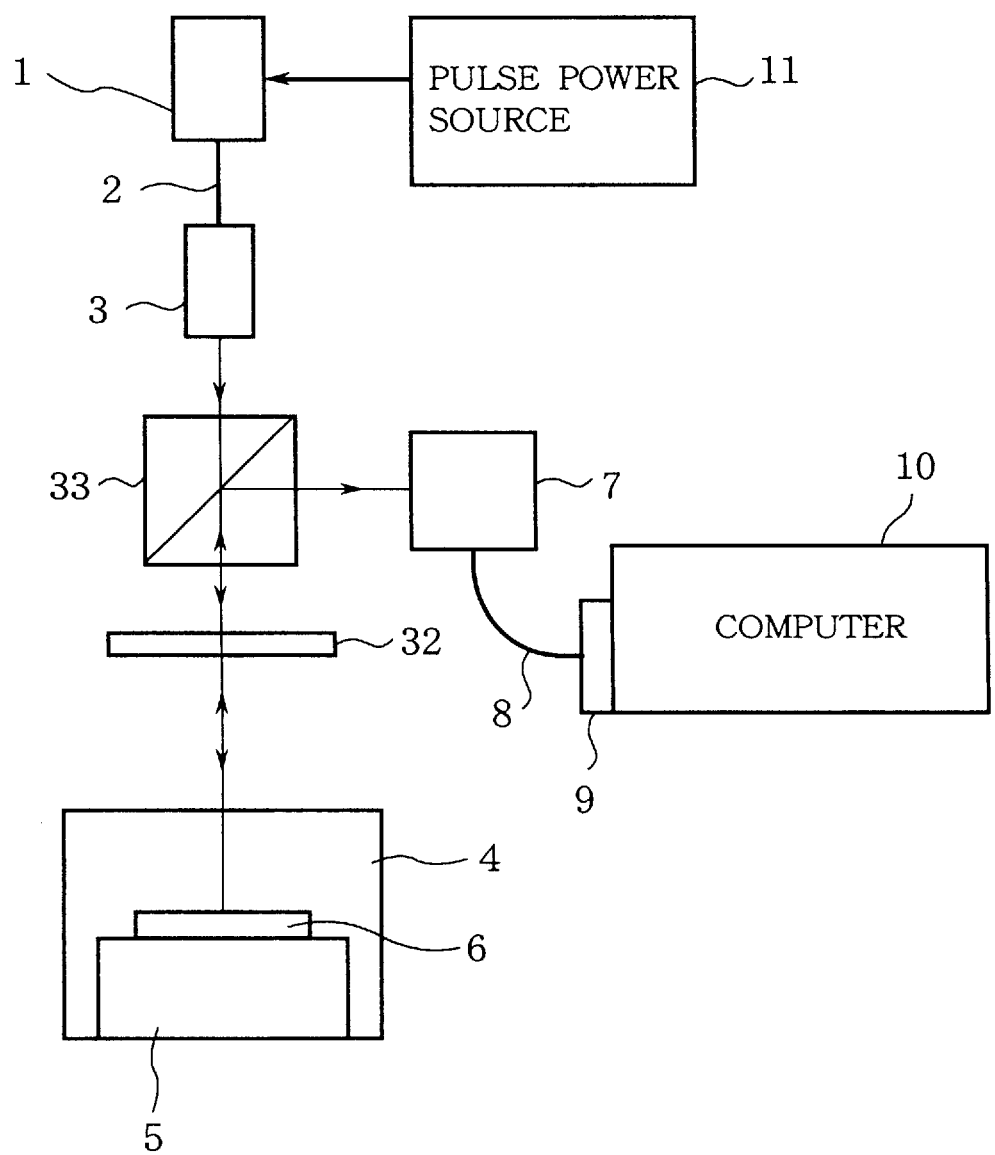
FIG. 38 is a block diagram of a fourth variation of the device for measuring temperatures according to the tenth embodiment of the present invention.

A fourth variation of the device for measuring temperatures according to the present embodiment is show in FIG. 38.

The device for measuring temperatures according to the present variation measures temperatures of semiconductor substrate 6, based on changes of intensities of interfered light of reflected light on the semiconductor substrate 6.

A semiconductor laser 1 and a collimating optical unit 6 are arranged right above a chamber 4 for a semiconductor substrate 6 to be placed in. Pulsed laser beams made by the collimating optical unit 3 into parallel bundles of rays are incident on an attenuation plate 32 via a beam splitter 33, and are attenuated there to be applied to the semiconductor substrate 6 in the chamber 4.

Reflected light on the semiconductor substrate 6 is again attenuated by the attenuation plate 32 to be incident on the beam splitter 33. The laser beams incident on the beam splitter 33 is split there to be received by a photo receptor 7.

Photo signals received by the photo receptor 7 are supplied to a computer 10 through a data signal line 8 via an A/D conversion unit 9.

The computer 10 calculates changes of intensities of interfered light reflected light, based on received digital photo signals supplied to the computer 10, and, based on computed results, decides measured temperatures and directions of the temperature changes.

The computer 10 replaces an attenuation plate of one kind of attenuation degree, based on measured temperatures. That is, while measured temperatures are low, an attenuation plate 32 with a high attenuation, and as the measured temperatures rise, the attenuation plate 30 is replaced gradually by attenuation plates 32 with higher attenuation degrees.

In the present variation, laser beams are passed through the attenuation plate 32 from the collimating optical unit 3 and the photo receptor 7. An attenuation degree of the attenuation plate 32 is half that of the above-described embodiment.

The attenuation plate 32 may have an attenuation degree as changing continuously.

Thus according to the present embodiment, oscillation intensities of the semiconductor laser are constantly high, and the intensities are attenuated when a substrate temperature of the semiconductor substrate is low, whereby intensities of interfered light of reflected light on the semiconductor substrate are lowered. As a result, even when the semiconductor substrate has high temperatures, the temperature measurement can be accurate.

[Eleventh Embodiment]

Figure 39A:
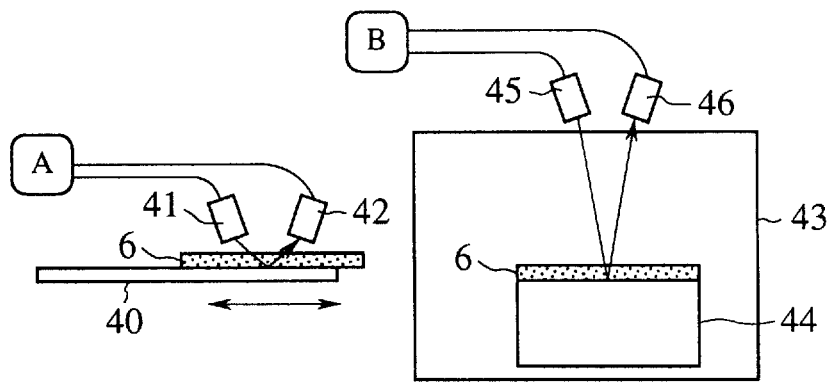
FIGS. 39A and B are diagrams of the device for measuring temperatures according to an eleventh embodiment of the present invention.

The device for measuring temperatures according to an eleventh embodiment of the present invention will be explained with reference to FIGS. 39 to 42. FIG. 39 shows a block diagram of the device for measuring temperatures according to the present embodiment. FIGS. 40 and 41 show a method for measuring temperatures by the device for measuring temperatures according to the present embodiment.

As shown in FIG. 39, the device for measuring temperatures according to the present embodiment includes two temperature measuring systems A, B.

One A of the temperature measuring systems measures temperatures of a semiconductor substrate 6 carried by a carrier arm 40. The temperature measuring system A follows movement of the carrier arm 40 to measure a temperature of a required measured point of the semiconductor substrate 6. Pulsed laser beams is made by a collimating optical unit 41 into parallel bundles of rays to be applied to the semiconductor substrate 6. Reflected light on the semiconductor substrate 6 is received by a photo receptor 42.

The other temperature measuring system B measures temperatures of the semiconductor substrate 6 mounted on a stage 44 in a chamber 43. The temperature measuring system B measures temperatures of the required point of the semiconductor substrate 6 which has been carried and mounted on the stage 44. Pulsed laser beams are made by the collimating optical unit 45 into parallel bundles of rays to be applied to the semiconductor substrate 6. Reflected light on the semiconductor substrate 6 is received by a photo receptor 46.

Thus, in the temperature measuring system A, temperatures of the required point of the semiconductor substrate 6 being carried, and in the temperature measuring system B, temperatures of the required point of the semiconductor substrate 6 being treated.

Figure 39B:
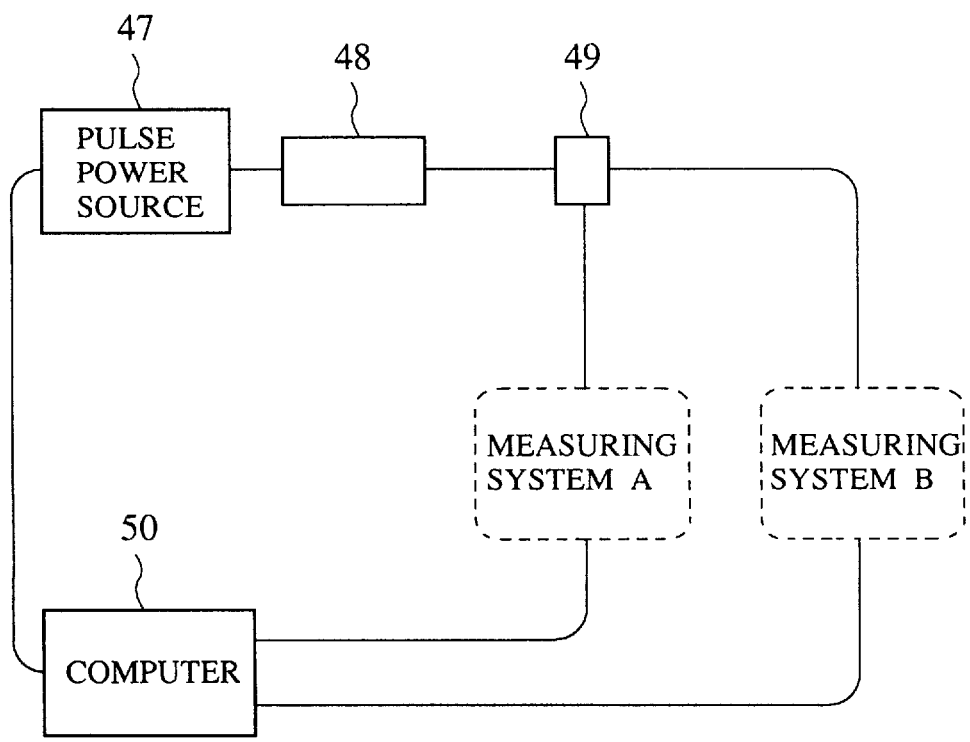

In the present embodiment, as shown in FIG. 39B, one laser beam source is used commonly by both the temperature measuring system A and the temperature measuring system B. A semiconductor laser 48 is connected to a pulse power source 47. The pulse power source 47 is connected to a computer 50. The computer 50 controls pulsed current to be outputted by the pulse power source 47.

A pulsed laser beam emitted by the semiconductor laser 48 is split into two laser beams by an optical split coupler 49. The split laser beams are supplied respectively to the temperature measuring system A and the temperature measuring system B.

The split laser beams are made respectively into parallel bundles of rays by their associated collimating optical units 41, 45 of the temperature measuring systems A, B. Respective photo receptors 42, 46 of the temperature measuring systems 42, 46 receive respective interfered light reflected light on the semiconductor substrate 6.

Photo signals received by the photo receptors 42, 46 of the temperature measuring systems A, B are supplied to the computer 50. Based on the supplied photo signals, the computer 50 calculates changes of intensities of the interfered light of the reflected light, and, based on results of the computation, decides measured temperatures, and a direction of the temperature changes.

Next, a method for measuring temperatures by the device for measuring temperatures according to the present embodiment will be explained with reference to FIGS. 40 and 41.

First, the operation of the carrier arm 40 loading the semiconductor substrate 6 into the chamber 43 will be explained.

Figure 40A:
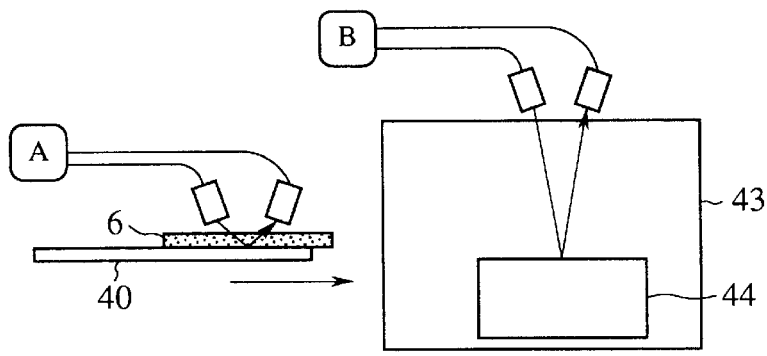
FIGS. 40A to D are views explaining a method for measuring temperatures by the device for measuring temperatures according to the eleventh embodiment of the present invention.

The semiconductor substrate 6 to be carried is mounted on the carrier arm 40. Temperatures of a required point of the semiconductor substrate 6 are measured by the temperature measuring system A (FIG. 40A).

Figure 40B:
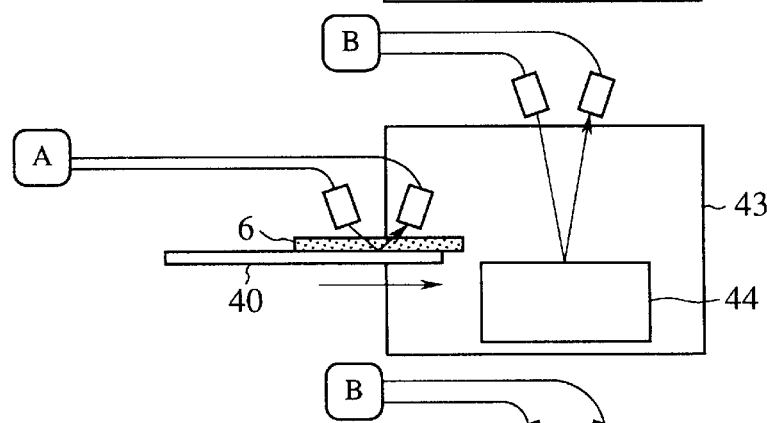

Next, the semiconductor substrate 6 is loaded into the chamber 43 by the carrier arm 40. Temperatures of the semiconductor substrate 6 being carrier are measured by the temperature measuring system A (FIG. 40B).

Figure 40C:
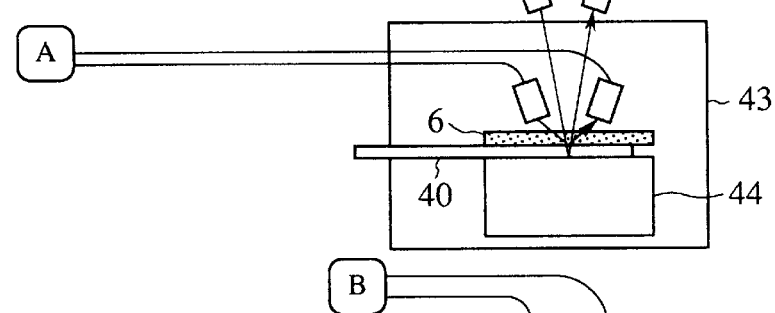

Next, the semiconductor substrate 6 loaded into the chamber 43 by the carrier arm 40 is transferred onto the stage 44 in the chamber 43. When the semiconductor substrate 6 is mounted on the stage 44 with temperatures of the semiconductor substrate 6 being continuously measured by the temperature measuring system A, temperatures of the semiconductor substrate 6 start to be measured by the temperature measuring system B (FIG. 40C). An initial value of the measured temperatures by the temperature measuring system b is corrected by the measured temperatures by the temperature measuring system A. Then the temperature measurement of the semiconductor substrate 6 is continued by the temperature measuring system B.

Figure 40D:
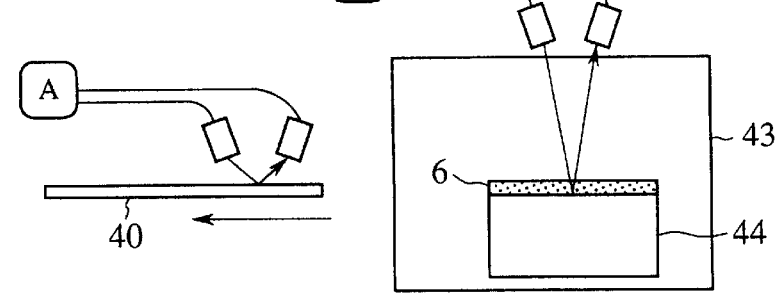

Then, the carrier arm 40 is unloaded out of the chamber 4 (FIG. 40D). Subsequently a required treatment is conducted on the semiconductor substrate 6 mounted on the stage 44. During the treatment, temperatures of the semiconductor substrate 6 are continuously measured by the temperature measuring system B.

Thus, when the semiconductor substrate 6 is loaded into the chamber 43 by the carrier arm 40, temperatures of the required measured point of the semiconductor substrate 6 can be measured without interruption.

Next, the operation of unloading the semiconductor substrate 6 out of the chamber 43 by the carrier arm 40 will be explained.

Figure 41A:
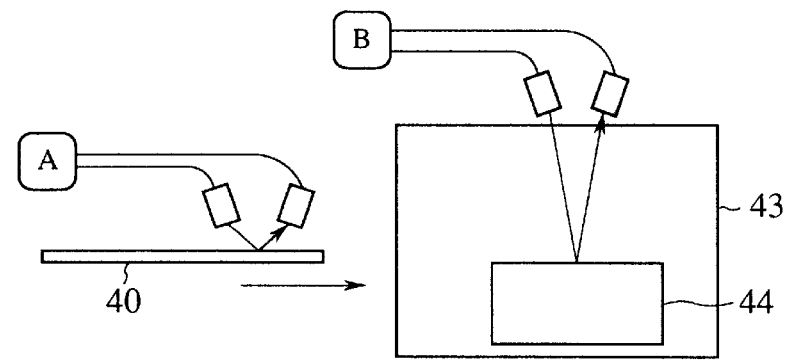
FIGS. 41A to D are views explaining the device for measuring temperatures by the device for measuring temperatures according to the eleventh embodiment of the present invention.

First, while the semiconductor substrate 6 is being treated in the chamber 443, temperatures of the required measured point of the semiconductor substrate 6 on the stage 44 are measured (FIG. 41A).

Figure 41B:
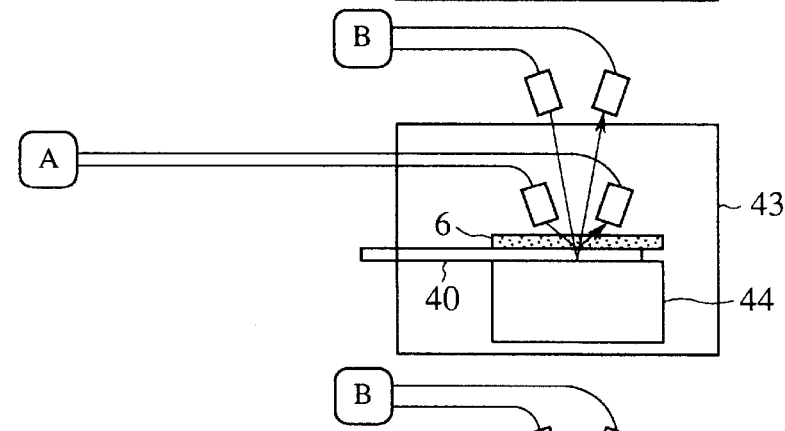
Figure 41C:
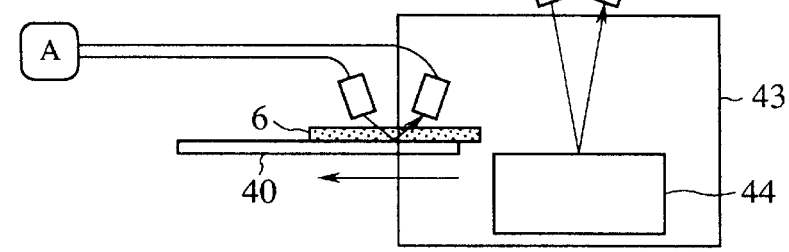

Then, the semiconductor substrate 6 on the stage 44 is held by the carrier arm 40. While temperatures of the semiconductor substrate 6 are being continuously measured by the temperature measuring system B, upon the carrier arm 40 holding the semiconductor substrate 6, temperatures of the semiconductor substrate start to be measured by the temperature measuring system A (FIG. 41B). An initial value of the measured temperatures by the temperature measuring system A s corrected by the measured temperatures by the temperature measuring system B, and then the temperatures of the semiconductor substrate 6 is continuously measured by the temperature measuring system A.

Figure 41D:
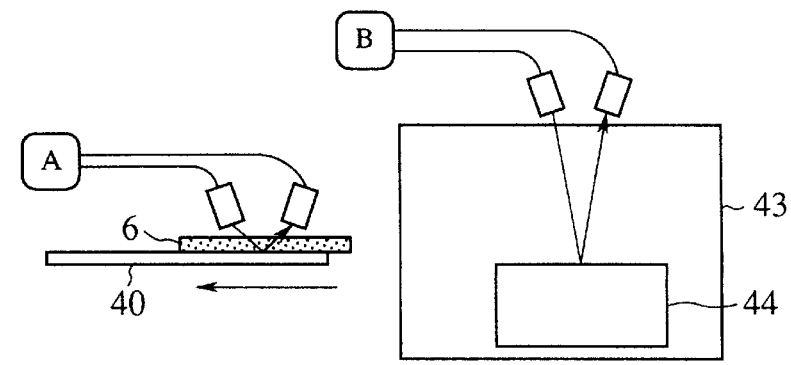

Then, the semiconductor substrate 6 starts to be unloaded by the carrier arm 40 (FIG. 41C), and the semiconductor substrate 6 is unloaded out of the chamber 43 (FIG. 41D). Temperatures of the semiconductor substrate 6 are continuously measured by the temperature measuring system A.

Thus, when the semiconductor substrate 6 is unloaded out of the chamber 43 by the carrier arm 40, temperatures of the required point of the semiconductor substrate 6 can be continuously measured.

In the temperature measuring device shown in FIGS. 40 and 41, the temperature measuring system A and the temperature measuring system B are arranged not so as to interrupt optical paths of the systems A and B by each other.

Figure 42:
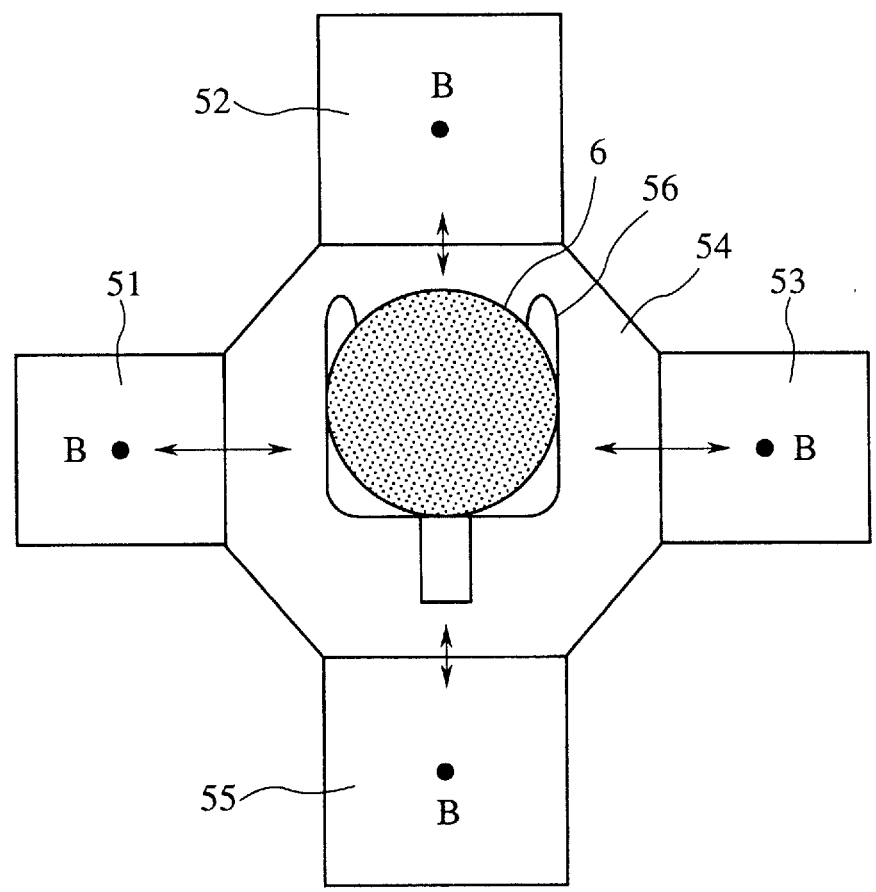

With reference to FIG. 42, a case that the device for measuring temperatures according to the present embodiment is applied to a cluster device with a plurality of treatment chambers will be explained.

The cluster device includes three treatment chambers 51, 52, 53. These treatment chambers 51, 52, 53 are adjacent commonly to a vacuum chamber 54. A load lock chamber 55 is also adjacent to the vacuum chamber 54. In the vacuum chamber 54 there is provided a carrier arm 56 which carries a semiconductor substrate. The semiconductor substrate 6 is carried from the outside into the load lock chamber 55 by the carrier arm 56 through the load lock chamber 55 to be loaded into and unloaded out of the respective chambers 51, 52, 53.

In the carrier arm 56 there is provided a temperature measuring system A which can measure temperatures of a measured point of the semiconductor substrate 6 being carried. The temperature measuring system A follows movement of the carrier arm 56 to always measure temperatures of the measured point of the semiconductor substrate 6.

A temperature measuring system B is provided in each chamber 51, 52, 53 and the load lock chamber 55. These temperature measuring systems B measure temperatures of the measured point of the semiconductor substrate 6.

Thus the temperature measuring system A is provided in the carrier arm 56, and the temperature measuring systems B are provided in the treatment chambers 51, 52, 53 and the load lock chamber 55, whereby temperatures of the semiconductor substrate 6 on move can be continuously measured.

When the semiconductor substrate 6 is carried from the outside into the load look chamber 55, temperatures of the semiconductor substrate 6 are measured first by the temperature measuring system B in the load lock chamber 55. Subsequently the semiconductor substrate 6 is unloaded out of the load lock chamber 5, and temperatures of the semiconductor substrate 6 are measured by the temperature measuring system A until loaded into the treatment chambers 51, 52, 53. While the semiconductor substrate 6 is being treated in the treatment chambers 51, 52, 53, the temperature measuring systems B measure temperatures of the semiconductor substrate 6. While the semiconductor substrate 6 is on move to and from the treatment chambers 51, 52, 53, the temperature measuring system A in the carrier arm 56 measures temperatures of the semiconductor substrate 6. The temperature measuring systems B in the load lock chamber 55 measures temperatures of the semiconductor substrate 6 until required treatments on the semiconductor substrate 6 are over in the treatment chambers 51, 52, 53, and the semiconductor substrate 6 is unloaded out of the load lock chamber 55.

Thus, while the semiconductor substrate is being treated in the cluster device, temperatures of the semiconductor substrate are continuously measured.

In the above embodiment, each of the treatment chambers, the carrier arm, and the load lock chamber 56 may have plural temperature measuring systems.

[Twelfth Embodiment]

The wavelength measuring device according to a twelfth embodiment of the present invention will be explained with reference to FIGS. 43 to 46.

Figure 43:
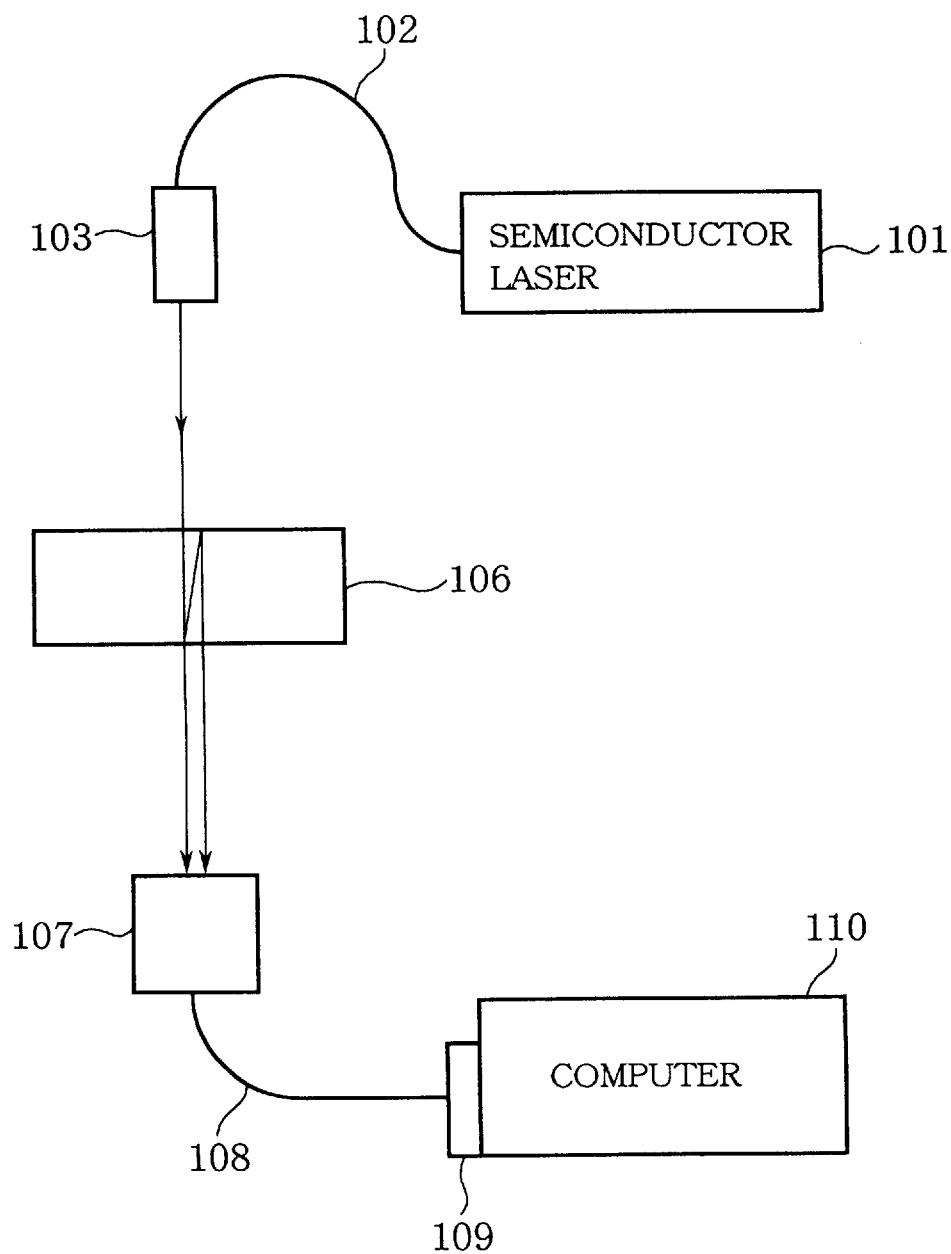
FIG. 43 is a block diagram of the wavelength measuring device according to a twelfth embodiment of the present invention.

FIG. 43 shows a block diagram of the wavelength measuring device according to the twelfth embodiment. The wavelength measuring device according to the twelfth embodiment measures wavelength shifts of laser beams emitted from a semiconductor laser.

A semiconductor laser 101 whose beams to be measured was, e.g., an NEC NDL5600 (InGaAsP phase shift type DFB-DC-PBH laser diode for use in 1310 nm-optical fiber communication; approximately 0.5 mW output). The semiconductor 1 may be a semiconductor laser with an APC which can oscillate pulsed beams of above 10 Hz.

Laser beams emitted from the semiconductor laser 101 are led to a collimating optical unit 103 through an optical fiber 102. The respective laser beams are made into parallel rays by the collimating optical unit 103 and are applied to a reference substance 106. A wavelength of the laser beams is measured in advance or upon measurement by a spectrometer. Light quantity changes of the laser beams are measured by, e.g., a photodiode upon measurement.

The reference substance 106 is a reference for the wavelength measurement. Its refractive index n and thickness L are measured with precision in advance by an independent method. The reference substance 106 may be any substance as long as its accurate refractive index n and thickness L are known and can provide transmitted light of sufficient intensity, but it is preferable that the upper side and the underside thereof are finished in speculums. For example, the reference substance may be a semiconductor substrate, as of silicon, GaAs, InP or others.

Figure 44A:
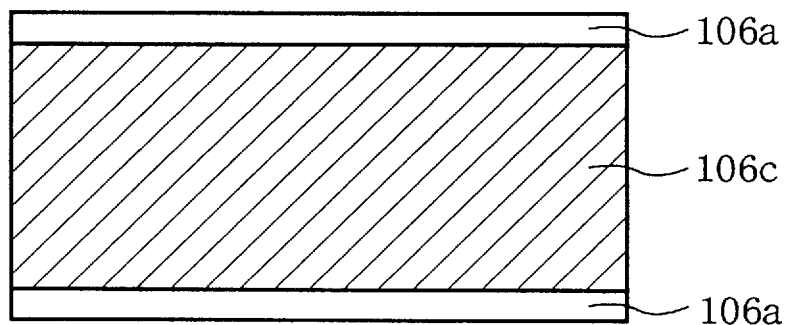
FIGS. 44A and B are views of examples of the reference substance used in the wavelength measuring device according to the twelfth embodiment of the present invention.

The reference substance 106 is not essentially a unisubstance but may comprise, as shown in FIG. 44A, two flat plates 106a, 106b spaced from each other by a set distance L, and a substance 106c of a known refractive index n loaded between the flat plates 106a, 106b. The substance c may be a solid, liquid or gas. The gas may be air.

Figure 44B:
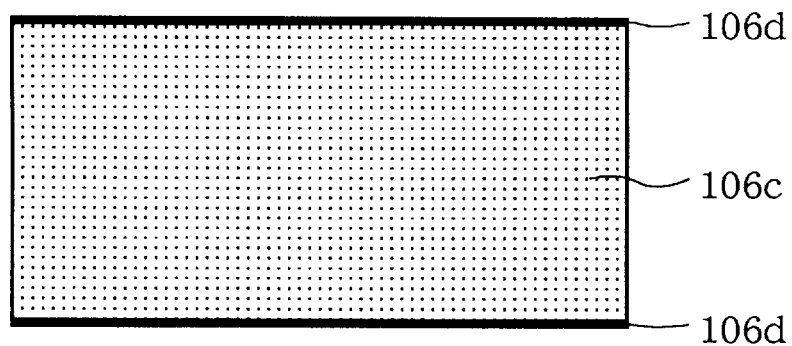

In addition, the reference substance 106 may comprise, as shown in FIG. 44B, thin films 106d, 106d in place of the flat plates 106a, 106a, and the substance 106c loaded between the thin films 106d, 106d.

The transmitted light which has passed through the reference substance 106 are received by a photoreceiver 7. The photoreceiver 7 was a Hamamatsu Photonics B246 (Ge photovoltaic device). It is preferred that the photoreceiver 7 has a rise time of below 50 $\mu$s.

Received photo signals received by the photoreceiver 7 are supplied to an A/D converting unit 109 through a data communication unit 108. The A/D converting unit 109 converted the received photo signals, which are analog signals, to a digital signals, and outputs the digital signals to a computer 110.

The computer 110 computes intensity changes of interfered light of the transmitted light, based on the inputted digital received photo signals, and determines wavelength shifts, based on computed results.

Figure 45:
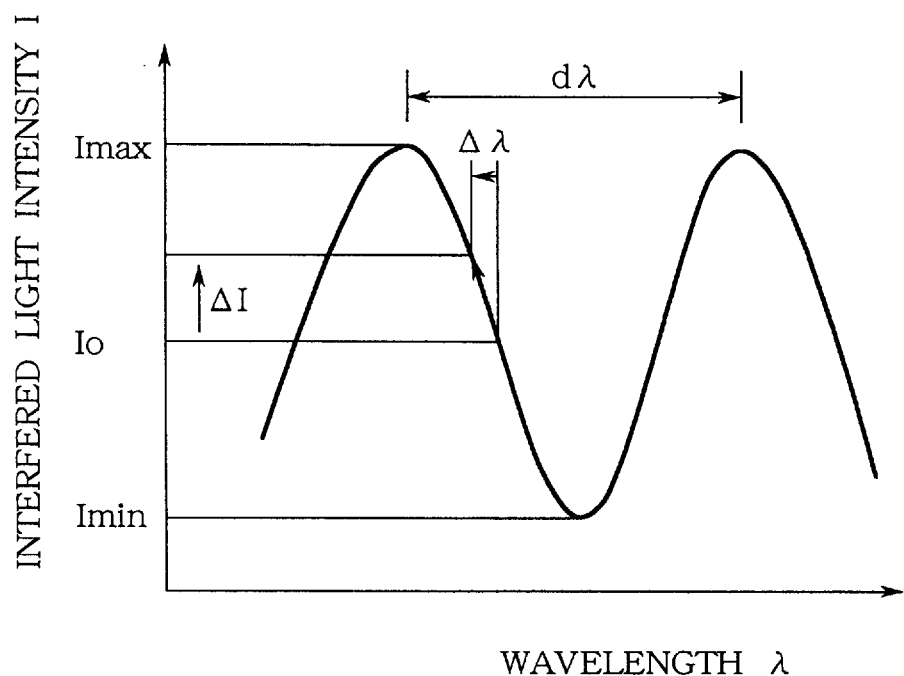
FIG. 45 is a view explaining the measuring principle of the wavelength measuring device according to the twelfth embodiment of the present invention.

Then the measuring principle of the wavelength measuring device according to the present embodiment will be explained with reference to FIG. 45. FIG. 45 shows a graph of relationship between wavelengths of the laser beams and interfered light intensities.

Interference of a laser beam depends on wavelengths $\lambda$ thereof, and a refractive index n and a thickness of the reference substance 106. With a refractive index n and a thickness L of the reference substance made constant, as shown in FIG. 45, an intensity I of the interfered light repeats increases and decreases between a maximum value Imax and a minimum value Imin in accordance with wavelength shifts $\lambda$.

When a wavelength shift amount $d\lambda$ generated when an interference state changes by one period is represented by $d\lambda$, a refractive index of the reference substance is indicated by n, a thickness of the reference substance is denoted by L, and a wavelength of the laser beams before wavelength shifts is represented by $\lambda$, the following formula $$d\lambda = \lambda^2/(2nL+\lambda)$$

holds.

By detecting a change $\Delta I$ of an intensity I of the interfered light, a wavelength shift $\Delta\lambda$ of the laser beam can be measured in FIG. 45. When it is assumed, for example, that an intensity of the interfered light which has been Io before it undergoes a wavelength shift increases by $\Delta I$, as shown in FIG. 45, a wavelength decrease of $\Delta\lambda$ is measured.

As apparent in FIG. 45, there are present two interference states in one of which a interfered light intensity I increases with wavelength $\lambda$ increases, and in the other of which the interfered light intensity I decreases with wavelength $\lambda$ increases. Increases and decreases of a wavelength cannot be uniquely determined in accordance with increases and decreases of a interfered light intensity I. An intensity I of interfered light undergoes no substantial changes even with wavelength shifts near a maximum value Imax of the interfered light and a minimum value Imin thereof.

In view of this, it is preferred to check in advance, with a interfered light intensity Io without shifts of a wavelength $\lambda$ set substantially at the medium between a maximum value Imax and a minimum value Imin, whether increases of the wavelength $\lambda$ produce the interference state in which the interfered light intensity increases, or the interference state in which the interfered light intensity decreases.

To this end, a maximum value Imax and a minimum value Imin, and a present interference state are made known before measuring wavelength shifts, by changing other factors for determining conditions of the interference, preferably changing an interference state by One period.

To change an interference state, it is considered, for example, to change a refractive index n and a thickness L of the reference substance 106, or to change an incident angle of the laser beams to change a substantial optical path length.

As specific means for changing a refractive index n and a thickness L of the reference substance 106, when the reference substance is a silicon substrate, changing a temperature of the reference substance 106 is effective.

It is also possible that the reference substance 106 is formed in wedge-shaped section and is displaced horizontally to change its thickness L.

Light intensity changes caused by increases of a refractive index n and a thickness L of the reference substance 106 are substantially the same as shifts of a wavelength of the laser beams to the side of short wavelengths. Oppositely light intensity changes caused by decreases of a refractive index n and a thickness L of the reference substance 106 are substantially the same as shifts of a wavelength of the laser beams to the side of long wavelengths.

Light intensity changes caused by increases of a substantial optical path length caused by changes of an incident angle of the laser beams are substantially the same as shifts of a wavelength of the laser beams to the side of the short wavelengths. Oppositely light intensity changes caused by decreases of a substantial optical path length are substantially the same as shifts of a wavelength of the laser beams to the side of long wavelengths.

It is preferable to thus vary interference conditions to obtain an optimum interference conditions before measuring wavelength shifts, but when wavelengths shifts are measured, the interference conditions are kept constant without changes.

Figure 46:
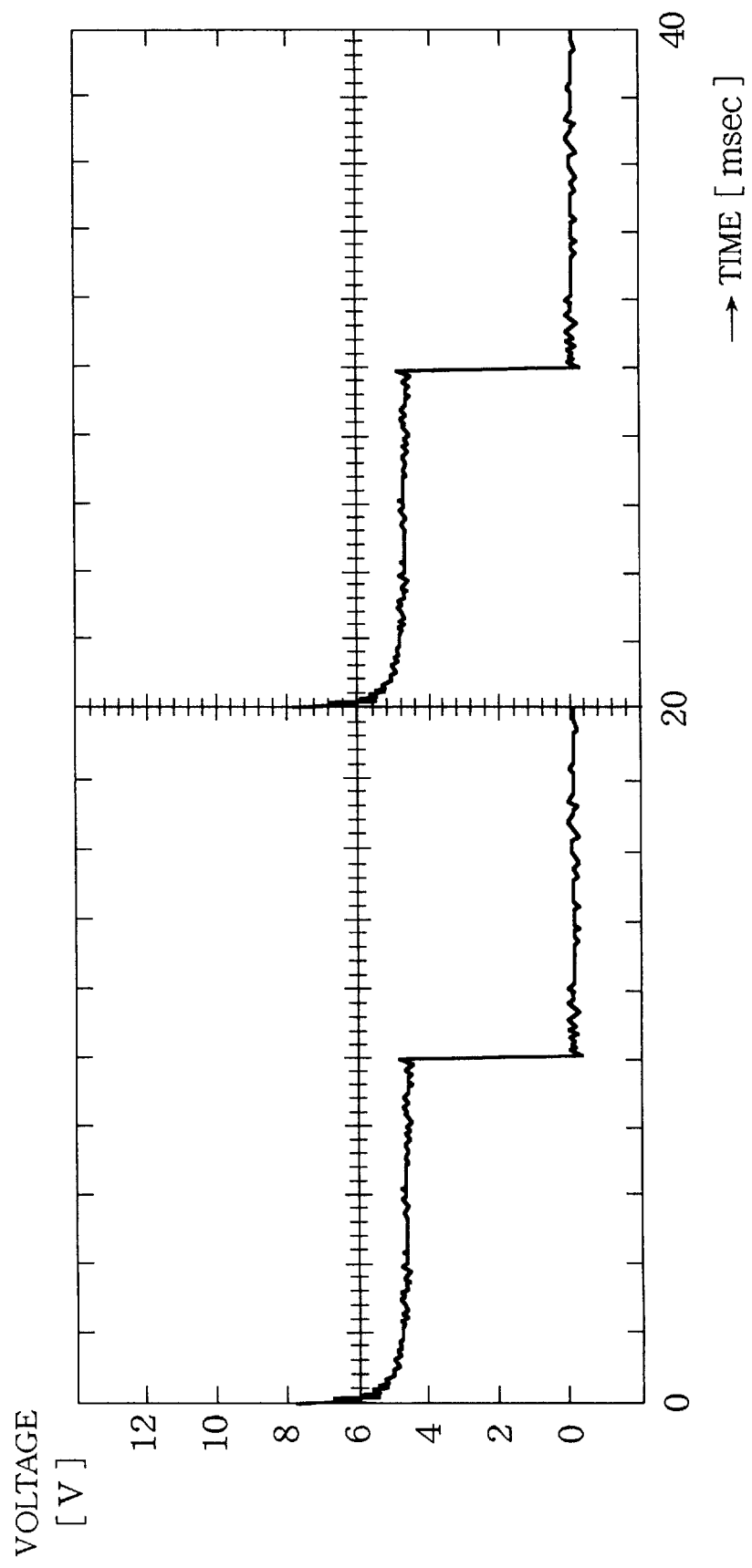
FIG. 46 is a graph of measurement results of the wavelength measuring device according to the twelfth embodiment of the present invention.

FIG. 46 shows a graph of transient interfered light intensity changes in the case that the reference substance 106 comprises a 0.5 mm-thickness silicon substrate, and pulsed laser beams of a 50 msec pulse width are emitted from the semiconductor laser 101 of a 1.3 µm wavelength. Voltages are taken on the vertical axis, and one division is equal to 2 V. Time is taken on the horizontal axis, and one division is equal to 1 ms.

As shown in FIG. 46, the interfered light intensity is highest immediately after a pulsed laser beam has risen, then gradually decreases, and is stable after approximately 10 msec. Accordingly it is found that a pulsed laser beam emitted from the semiconductor laser 101 has a shorter wavelength by approximately 1 angstrom upon rising and then increases the wavelength. Thus, according to the present embodiment, wavelength shifts of a laser beam in a period of time as short as approximately 10 msec can be accurately measured.

As described above, according to the present embodiment, quickly shifting wavelengths can be measured without allocating a scanning time for the spectral diffraction.

[Thirteenth Embodiment]

Figure 47:
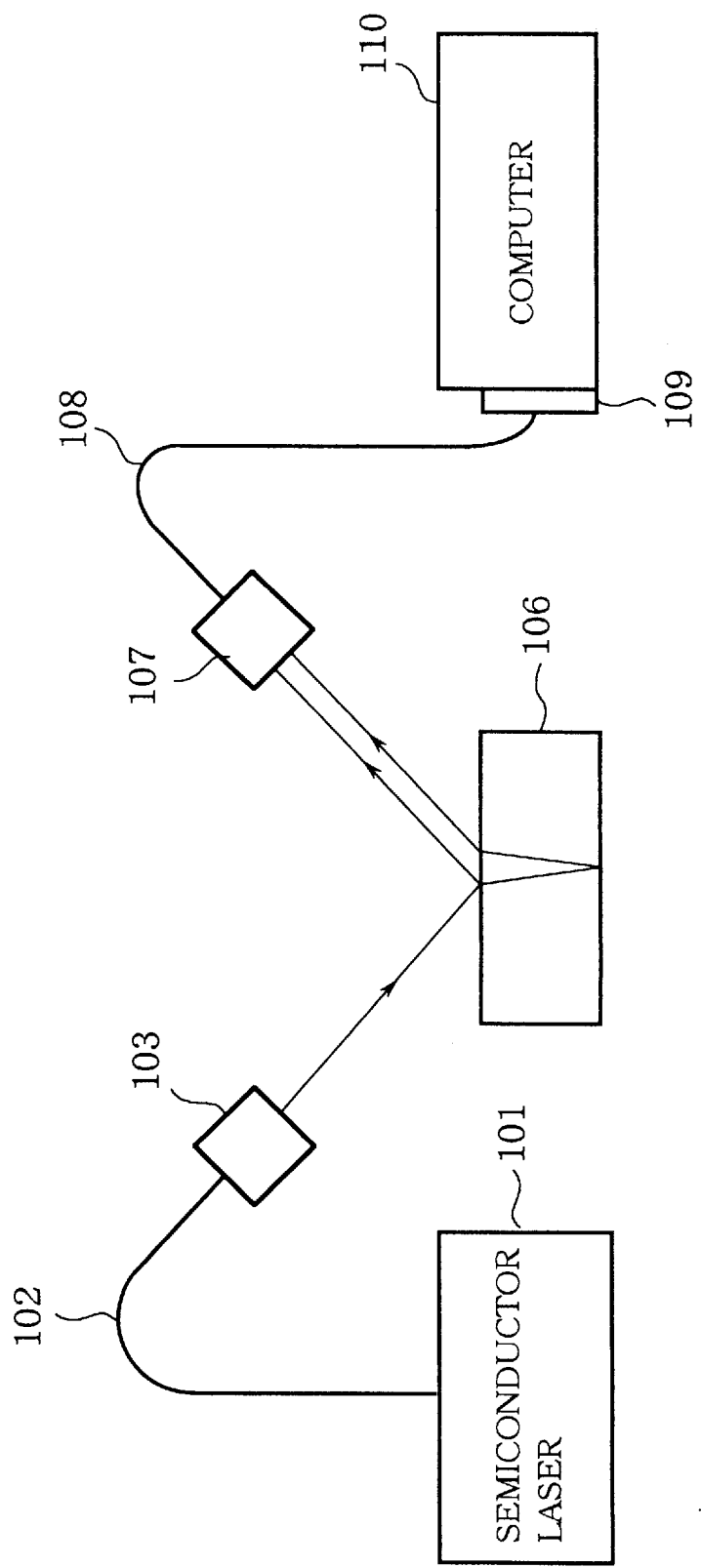
FIG. 47 is a block diagram of the wavelength measuring device according to a thirteenth embodiment of the present invention.

Next, the wavelength measuring device according to a thirteenth embodiment of the present invention will be explained with reference to FIG. 47. FIG. 47 shows a block diagram of the wavelength measuring device according to the thirteenth embodiment. Common members of the thirteenth embodiment with the twelfth embodiment are represented by common reference numerals not to repeat their explanation or to brief their explanation.

In the wavelength measuring device according to the twelfth embodiment, transmitted beams by the reference substance 106 are used in measuring wavelengths, but in the wavelength measuring device according to the present embodiment, laser beams are applied to one side of a reference substance 106, and intensity changes of interfered light of reflected light on the side are observed to measure wavelength shifts of the reference substance 106 and wavelength shifts of the reflected light.

In the present embodiment, an irradiation unit including a semiconductor laser 101, an optical fiber 102, collimating optical unit 103, and a photo receiving unit including a photo detector 107, a data communication unit, a computer 110 are arranged on both sides of the reference substance 106.

Laser beams emitted from the collimating optical unit 103 are incident on the reference substance 106, and interfered light of reflected light on the reference substance 106 is received by the photoreceiver 7. Photo received signals are inputted to the computer 110 via the data communication unit 108. Intensity changes of the interfered light by the photo receiver 7 are measured for the measurement of wavelength shifts of the laser beams.

Thus according to the thirteenth embodiment as well as the twelfth embodiment, quickly shifting wavelength can be measured without allocating a scanning time for the spectral diffraction.

The principle and the operation of the thirteenth embodiment are the same as those of the twelfth embodiment, and are not repeated here.

As described above, according to the thirteenth embodiment, quickly shifting wavelengths can be measured without allocating a scanning time for the spectral diffraction in the same way as in the twelfth embodiment.

[Fourteenth Embodiment]

Figure 48:
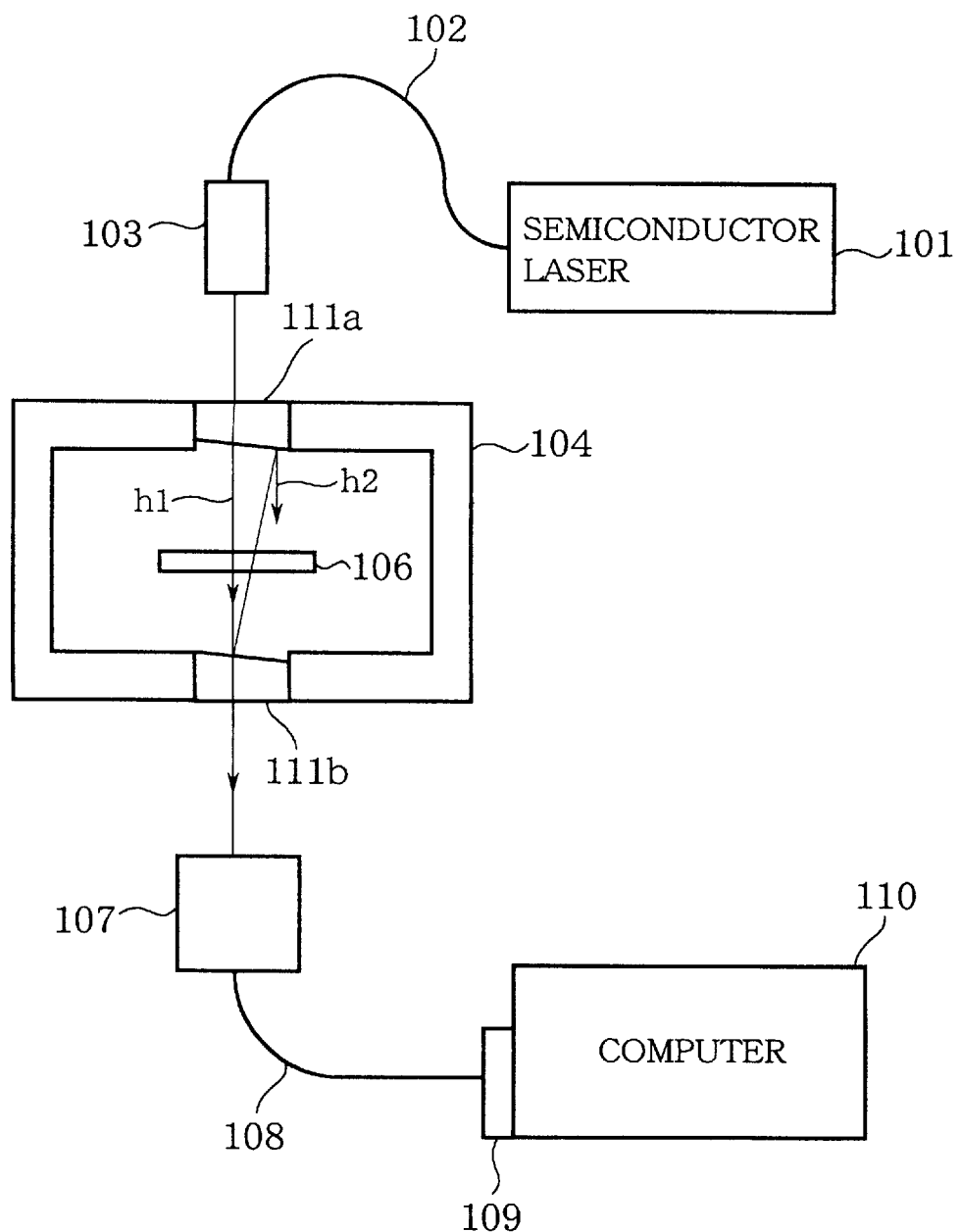
FIG. 48 is a block diagram of the wavelength measuring device according to a fourteenth embodiment of the present invention.

Then, the wavelength measuring device according to a fourteenth embodiment of the present invention will be explained with reference to FIG. 48. Common members of the fourteenth embodiment with the twelfth embodiment are represented by common reference numeral not to repeat their explanation or brief their explanation.

In the present embodiment, a reference substance 106 is housed in a chamber 104, and laser beams enter and exit respectively at an optical windows 111a, 111b of the chamber 104. The optical windows 111a, 111b have one surfaces slanted and provided in openings in the chamber 104 so that the slanted surfaces are faced inside, tilted with respect to the optical axis of the laser beams, and the outer surfaces are flush with the outside surface of the chamber 104.

Owing to this arrangement, those of the laser beams reflected from the inside surface of the optical window 1b stray from the optical axis and follow an optical path h2 even when reflected between the optical windows 111a, 111b, so that the reflected light causes no light interference. In addition, the outside surfaces of the optical windows 111a, 111b are flush with the outside surface of the chamber 104, which facilitates mounting of the optical windows 111a, 111b with high precision.

Thus according to the fourteenth embodiment, no light interference of the reflected light between the optical windows occurs, so that the wavelength measurement can be made with precision without intensity level changes of the interfered light. Thus the wavelength measuring device according to the fourteenth embodiment can be of higher precision.

[Fifteenth Embodiment]

Figure 49:
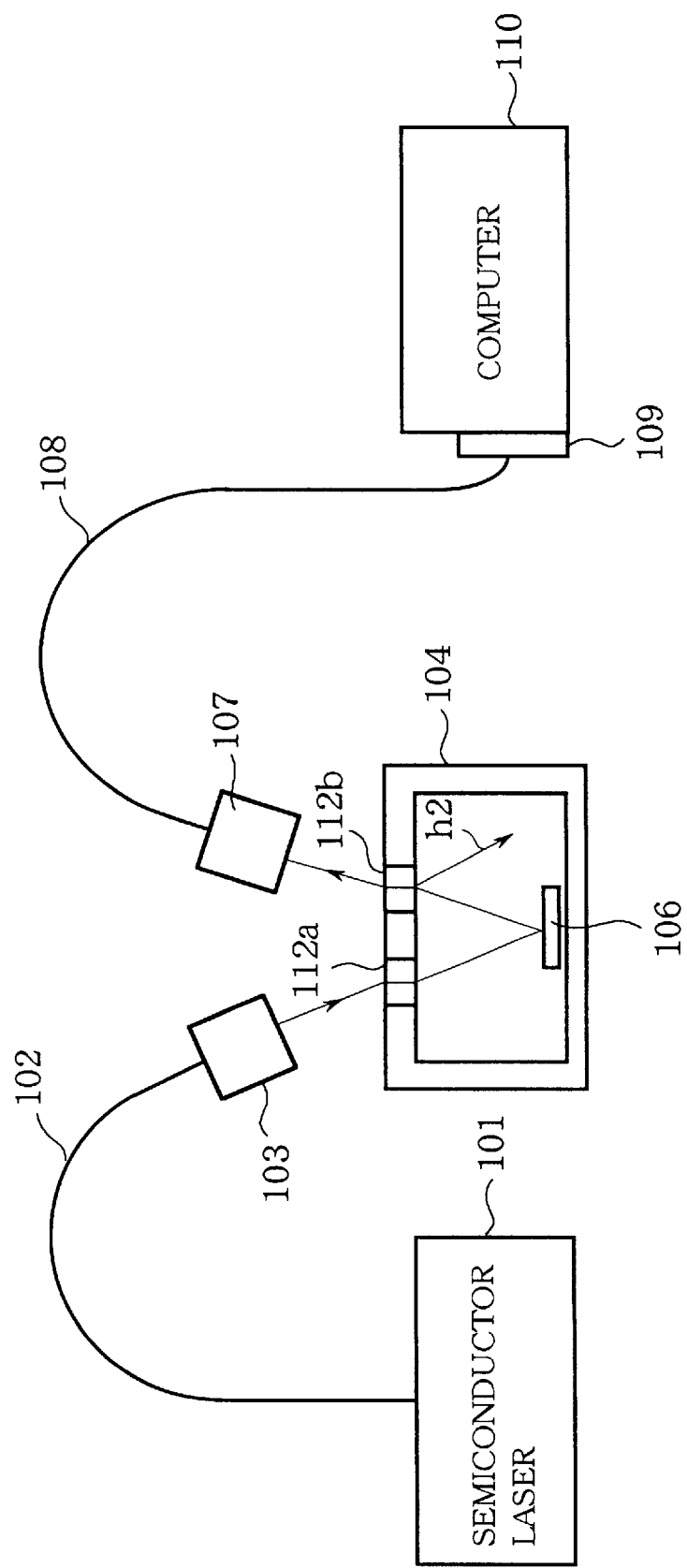
FIG. 49 is a block diagram of the wavelength measuring device according to a fifteenth embodiment of the present invention.

The wavelength measuring device according to a fifteenth embodiment of the present invention will be explained with reference to FIG. 49. Common members of the fifteenth embodiment with the thirteenth embodiment of FIG. 47 are represented by common members not to repeat their explanation or to brief their explanation.

In the present embodiment, a reference substance 106 is housed in a chamber 104, and laser beams enter and exit at optical windows 112a, 112b provided in openings formed in the upper side of the chamber 104. The optical windows 112a, 112b are mounted with one surfaces thereof flush with the outer side of the chamber 104, so that the inner surfaces of the optical windows 112a, 112b are slanted with respect to the optical axis of the laser beams.

Owing to this arrangement, those of laser beams reflected from the inner surface of the optical window 112b stray from the optical axis, so that no optical interference of the reflected light between the optical windows occurs.

Thus according to the fifteenth embodiment, no light interference of the reflected light between the optical windows occurs, so that the wavelength measurement can be made with precision without intensity level changes of the interfered light. Thus the wavelength measuring device according to the fourteenth embodiment can be of higher precision.

[Variations]

The present invention is not limited to the above-described embodiment and can cove variations and modifications.

In the above-described embodiment, temperatures of an object to be measured are measured, but physical quantities other than temperatures may be measured as long as their measurement is conducted by the use of pulsed laser beams each having a first wavelength which is oscillated immediately after the rise thereof, and a second wavelength which is oscillated thereafter.

In the above-described embodiments changes of wavelengths of the laser beams are measured, but wavelength changes can be measured not only on the laser beams, but also on any light as long as it is coherent.

What is claimed is:

1. A measuring method utilizing a laser beam irradiated upon an object to be measured to measure a physical quantity of the object, said method comprising the steps of:

irradiating a pulsed laser beam upon the object to be measured, an intensity of the pulsed laser beam being substantially constant within each pulse; and measuring a physical quantity of the object by using a first portion of the pulsed laser beam, the first portion occurring immediately after a rise of each pulse of the pulsed laser beam and having a first wavelength, and a second portion of the pulsed laser beam, the second portion occurring within each pulse after the first portion and having a second wavelength.

2. A measuring method according to claim 1, wherein temperatures of the object are measured, based on changes of intensities of first interfered light of reflected light or transmitted light of the first portion of the pulsed laser beam on or by the object, and changes of intensities of second interfered light of reflected light or transmitted light of the second portion of the pulsed laser beam on or by the object.

3. A measuring method according to claim 2, wherein the temperatures of the object are judged to be on increase or decrease, based on a direction of the changes of intensities of the first interfered light or the second interfered light and on a difference between the intensity of the first interfered light and that of the second interfered light.

4. A measuring method according to claim 1, wherein the measuring method measures the physical quantity, temperatures, or a direction of changes of temperatures of the object to be measured, by using a semiconductor laser having a characteristic that the first wavelength of the first portion of the pulsed laser beam is shorter than the second wavelength of the second portion of the pulsed laser beam.

5. A measuring method according to claim 4, wherein the temperatures of the object are judged to be on increase when the intensities of the first interfered light are higher than those of the second interfered light at the time that the intensities of the first interfered light or those of the second interfered light are on increase, the temperatures of the objects are judged to be on decrease when the intensities of the first interfered light are lower than those of the second interfered light at the time that the intensities of the first interfered light or those of the second interfered light are on increase, the temperatures of the object are judged to be on decrease when the intensities of the first interfered light are higher than those of the second interfered light at the time that the intensities of the first interfered light or those of the second interfered light are on decrease, the temperatures of the objects are judged to be on increase when the intensities of the first interfered light are lower than those of the second interfered light at the time that the intensities of the first interfered light or those of the second interfered light are on decrease.

6. A measuring method according to claim 1, wherein the measuring method measures the physical quantity, temperatures, or a direction of changes of temperatures of the object to be measured by using a semiconductor laser having a characteristic that the first wavelength of the first portion of the pulsed laser beam is longer than the second wavelength of the second portion of the pulsed laser beam.

7. A measuring method according to claim 6, wherein the temperatures of the object are judged to be on decrease when the intensities of the first interfered light are higher than those of the second interfered light at the time that the intensities of the first interfered light or those of the second interfered light are on increase, the temperatures of the objects are judged to be on increase when the intensities of the first interfered light are lower than those of the second interfered light at the time that the intensities of the first interfered light or those of the second interfered light are on increase, the temperatures of the object are judged to be on increase when the intensities of the first interfered light are higher than those of the second interfered light at the time that the intensities of the first interfered light or those of the second interfered light are on decrease, the temperatures of the objects are judged to be on decrease when the intensities of the first interfered light are lower than those of the second interfered light at the time that the intensities of the first interfered light or those of the second interfered light are on decrease.

8. A measuring method according to claim 1, wherein when the second wavelength of the second interfered light is represented by $\lambda$, a thickness of the object to be measured is represented by d, and a refractive index of the object to be measured is represented by n, a difference $\Delta\lambda$ between the first wavelength of the first interfered light and the second wavelength of the second interfered light satisfies $$|\Delta\lambda| < \lambda^2/(2nd+\lambda).$$

9. A measuring method according to claim 1, wherein the first portion of the pulsed laser beam occurs within approximately 0.5 msec after a rise of each pulse of the pulsed laser beam.

10. A measuring method according to claim 1, further comprising a step of changing intensities of the pulsed laser beam irradiated upon the object to be measured.

11. A measuring method according to claim 1, wherein intensities of the pulsed laser beam irradiated upon the object to be measured are constant or increased when the temperature of the object is rising, and intensities of the pulsed laser beam are constant or decreased when the temperature of the object is falling.

12. A measuring method according to claim 10, wherein intensities of the pulsed laser beam are attenuated by attenuation means based on the temperature of the object to be irradiated to be measured.

13. A measuring method according to claim 1, wherein
at least one optical window is provided in a measuring light path,
at least one surface of the optical window is slanted with respect to the optical axis of the laser beam so that no interference of reflected light inside the optical window takes place.

14. A method for fabricating a semiconductor device, said method comprising the steps of:
conducting required treatments on a semiconductor substrate with a pulsed laser beam, wherein an intensity of the pulsed laser beam is substantially constant within each pulse; and
measuring a physical quantity of the semiconductor substrate by a measuring method during at least one of the required treatments, said measuring method comprising the steps of
irradiating a pulsed laser beam upon the object to be measured, and measuring the physical quantity of the object by using a first portion of the pulsed laser beam, the first portion occurring immediately after a rise of each pulse of the pulsed laser beam and having a first wavelength, and a second portion of the laser beam, the second portion occurring within each pulse after the first portion and having a second wavelength.

15. A method for fabricating a semiconductor device according to claim 14, wherein said step of conducting the required treatments on the semiconductor substrate includes at least one of heat treatments, ion implantation, etching, diffusion, pretreatment and deposition.

16. A measuring method according to claim 1, wherein
a plurality of optical windows are provided in a measuring light path, at least one surface of each optical window is slanted with respect to the optical axis of the laser beam, such that no interference of reflected light between optical windows of the plurality of optical windows takes place.

* * * * *